US009263406B2

(12) United States Patent
Okumura

(10) Patent No.: US 9,263,406 B2
(45) Date of Patent: Feb. 16, 2016

(54) SEMICONDUCTOR DEVICE AND METHOD FOR MANUFACTURING SEMICONDUCTOR DEVICE

(75) Inventor: Hiroshi Okumura, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 521 days.

(21) Appl. No.: 13/509,264

(22) PCT Filed: Nov. 9, 2010

(86) PCT No.: PCT/JP2010/069953
§ 371 (c)(1), (2), (4) Date: May 10, 2012

(87) PCT Pub. No.: WO2011/058977
PCT Pub. Date: May 19, 2011

(65) Prior Publication Data
US 2012/0228750 A1 Sep. 13, 2012

(30) Foreign Application Priority Data

Nov. 10, 2009 (JP) ................................ 2009-256876
Nov. 26, 2009 (JP) ................................ 2009-268533

(51) Int. Cl.
*H01L 21/00* (2006.01)
*H01L 23/00* (2006.01)
(Continued)

(52) U.S. Cl.
CPC ............ *H01L 24/13* (2013.01); *H01L 21/6836* (2013.01); *H01L 23/3114* (2013.01); *H01L 23/3171* (2013.01); *H01L 23/552* (2013.01); *H01L 24/03* (2013.01); *H01L 24/05* (2013.01); *H01L 29/0657* (2013.01); *H01L 23/525* (2013.01); *H01L 24/11* (2013.01); *H01L 24/94* (2013.01); *H01L 2221/6834* (2013.01); *H01L 2224/0231* (2013.01); *H01L 2224/0401* (2013.01); *H01L 2224/0502* (2013.01); *H01L 2224/0556* (2013.01); *H01L 2224/05099* (2013.01); *H01L 2224/05541* (2013.01); *H01L 2224/05555* (2013.01); *H01L 2224/05599* (2013.01); *H01L 2224/13016* (2013.01); *H01L 2224/13027* (2013.01); *H01L 2224/13099* (2013.01); *H01L 2224/94* (2013.01);
(Continued)

(58) Field of Classification Search
USPC ........... 438/113, 115, 114, 464, 46, 458, 106, 438/108, 123
See application file for complete search history.

(56) References Cited

U.S. PATENT DOCUMENTS

2002/0060367 A1 5/2002 Ohuchi et al.
2005/0194682 A1 9/2005 Ohuchi et al.
(Continued)

FOREIGN PATENT DOCUMENTS

JP 7-183415 A 7/1995
JP 9-064049 A 3/1997
(Continued)

*Primary Examiner* — Marc Armand
*Assistant Examiner* — Wilner Jean Baptiste
(74) *Attorney, Agent, or Firm* — Rabin & Berdo, P.C.

(57) ABSTRACT

A semiconductor device according to the present invention includes a semiconductor chip having a front surface and a rear surface, a sealing resin layer stacked on the front surface of the semiconductor chip, a post passing through the sealing resin layer in the thickness direction and having a side surface flush with a side surface of the sealing resin layer and a forward end surface flush with a front surface of the sealing resin layer, and an external connecting terminal provided on the forward end surface of the post.

16 Claims, 98 Drawing Sheets

(51) Int. Cl.

| | |
|---|---|
| ***H01L 21/683*** | (2006.01) |
| ***H01L 23/31*** | (2006.01) |
| ***H01L 23/552*** | (2006.01) |
| ***H01L 29/06*** | (2006.01) |
| *H01L 23/525* | (2006.01) |

(52) U.S. Cl.

CPC .................. *H01L2924/0001* (2013.01); *H01L 2924/01004* (2013.01); *H01L 2924/014* (2013.01); *H01L 2924/01005* (2013.01); *H01L 2924/01006* (2013.01); *H01L 2924/01013* (2013.01); *H01L 2924/01014* (2013.01); *H01L 2924/01019* (2013.01); *H01L 2924/01022* (2013.01); *H01L 2924/01024* (2013.01); *H01L 2924/01029* (2013.01); *H01L 2924/01033* (2013.01); *H01L 2924/01046* (2013.01); *H01L 2924/01058* (2013.01); *H01L 2924/01074* (2013.01); *H01L 2924/01078* (2013.01); *H01L 2924/01079* (2013.01); *H01L 2924/10156* (2013.01); *H01L 2924/10253* (2013.01); *H01L 2924/12044* (2013.01); *H01L 2924/3025* (2013.01)

(56) References Cited

U.S. PATENT DOCUMENTS

| | | | | |
|---|---|---|---|---|
| 2007/0145420 | A1 * | 6/2007 | Okada et al. | 257/228 |
| 2008/0019112 | A1 * | 1/2008 | Hatanaka et al. | 361/814 |
| 2008/0070348 | A1 | 3/2008 | Ohuchi et al. | |
| 2008/0114101 | A1 | 5/2008 | Ito et al. | |
| 2009/0194880 | A1 * | 8/2009 | Feng et al. | 257/771 |
| 2009/0224409 | A1 * | 9/2009 | Miyata et al. | 257/774 |
| 2010/0244244 | A1 * | 9/2010 | Yang | H01L 23/481 257/737 |

FOREIGN PATENT DOCUMENTS

| | | | |
|---|---|---|---|
| JP | 2001-313349 | A | 11/2001 |
| JP | 2005-175327 | A | 6/2005 |
| JP | 2008-101188 | A | 5/2008 |

* cited by examiner

SEMICONDUCTOR DEVICE AND METHOD FOR MANUFACTURING SEMICONDUCTOR DEVICE

TECHNICAL FIELD

The present invention relates to a semiconductor device to which a WLCSP (Wafer Level Chip Size Package) is applied and a method for manufacturing the same.

BACKGROUND ART

In general, the WLCSP is known as a packaging technique effective for downsizing a semiconductor device. In a semiconductor device to which the WLCSP is applied, packaging is completed in such a wafer state that a plurality of semiconductor chips aggregate, and the size of each semiconductor chip cut by dicing corresponds to a package size.

For example, FIG. 7 of Patent Document 1 discloses for a chip size package including an LSI (semiconductor chip) of a chip size, a passivation film formed on the LSI, epoxy resin formed on the passivation film, bumps formed in the epoxy resin to pass through the same in the thickness direction thereof, and solder balls arranged on forward ends of the bumps. On peripheral edge portions of the LSI, electrodes of the same number as the bumps are provided on the front surfaces thereof. Further, a wiring metal for moving the positions of the solder balls inward beyond the positions of the electrodes along the front surface of the LSI is formed on the passivation film. This wiring metal is connected with the bumps on positions inward beyond the electrodes.

PRIOR ART

Patent Document

Patent Document: Japanese Unexamined Patent Publication No. 9-64049

SUMMARY OF THE INVENTION

Problems to be Solved by the Invention

In consideration of deformation of the solder balls at a time of mounting the chip size package on a mounting substrate, a clearance for preventing the solder balls from coming into contact with each other must be provided between adjacent solder balls. Therefore, the interval between the bumps playing the roles of posts supporting the solder balls cannot be reduced below a constant level.

In order to avoid increase of the size of the chip size package, the bumps are arranged inward beyond the electrodes arranged on the outermost sides (peripheral edge sides of the LSI). Therefore, portions, referred to as overhangs, where neither bumps nor solder balls are arranged are present between the bumps and the peripheral edges of the LSI.

Therefore, the package size is decided by the number of the bumps (the solder balls) and the width of the overhangs, and downsizing thereof is limited.

A primary object of the present invention is to provide a semiconductor device and a method for manufacturing the same, capable of reducing a package size beyond a conventional limit.

Means for Solving the Problem

In order to attain the object, a semiconductor device according to the present invention includes a semiconductor chip having a front surface and a rear surface, a sealing resin layer stacked on the front surface of the semiconductor chip, a post passing through the sealing resin layer in the thickness direction and having a side surface flush with a side surface of the sealing resin layer and a forward end surface flush with a front surface of the sealing resin layer, and an external connecting terminal provided on the forward end surface of the post.

In this semiconductor device, the side surface of the post is flush with the side surface of the sealing resin layer. In other words, the side surface of the post is exposed from the side surface of the sealing resin layer. Therefore, no overhang is present between the post and a peripheral edge of the semiconductor chip, whereby the package size of the semiconductor device can be reduced as compared with a conventional semiconductor device, by the width of the overhang. Consequently, the package size can be reduced beyond the conventional limit.

Such a semiconductor device can be manufactured by a manufacturing method including the following steps A to E, for example:

A. a post forming step of, in a state where a plurality of semiconductor chips having front surfaces and rear surfaces constitute a semiconductor wafer which is an aggregate thereof, forming a pillarlike post on the front surface of each of the semiconductor chips;

B. a sealing step of forming a sealing resin layer having a front surface flush with a forward end surface of the post on the front surface of the semiconductor wafer;

C. a trench forming step of forming a trench dug down from the front surface of the sealing resin layer on a dicing line set along a peripheral edge of the semiconductor chip and exposing a side surface of the post as part of an inner surface of the trench after the sealing step;

D. a terminal forming step of forming a terminal bulging with respect to the front surface of the sealing resin layer on the forward end surface of the post after the trench forming step; and E. a step of dividing the semiconductor wafer into each of the semiconductor chips along the dicing line after the terminal forming step.

The sealing step may include a resin covering step of forming the sealing resin layer on the front surface of the semiconductor wafer to completely cover the post and a polishing step of polishing the sealing resin layer until the forward end surface of the post is exposed from the sealing resin layer.

The step of dividing the semiconductor wafer into each semiconductor chip may be a dicing step of making the inner side of the trench and the side of the rear surface of the semiconductor wafer communicate with each other by digging down the semiconductor wafer from the rear surface of the semiconductor wafer, or may be a dicing step of making the inner side of the trench and the side of the rear surface of the semiconductor wafer communicate with each other by digging down the semiconductor wafer from the inner side of the trench.

The external connecting terminal is preferably formed over the forward end surface of the post and the side surface of the post. Thus, a corner portion formed by the forward end surface of the post and the side surface of the post is covered with the external connecting terminal, and the boundary between the forward end surface of the post and the external connecting terminal is not exposed to the exterior. When stress is applied to the post and the external connecting terminal, therefore, the stress can be prevented from concentrating on the boundary between the forward end surface of the post and the external connecting terminal, and occurrence of separation of the external connecting terminal from the post can be prevented.

Preferably, a plurality of posts are provided along a peripheral edge of the semiconductor chip, and the side surfaces of all posts are flush with the side surface of the sealing resin layer. In this case, an application state of the external connecting terminal with respect to the side surfaces of all posts can be visually recognized after mounting the semiconductor chip on a mounting substrate. Therefore, visual inspection of the state of the semiconductor chip mounted on the mounting substrate can be easily performed.

The semiconductor device may further include a passivation film interposed between the semiconductor chip and the sealing resin layer and having a plurality of pad openings and an electrode pad exposed from each of the pad openings. In this case, the post may enter the pad opening, and may be connected to the electrode pad.

The side surface of the post may include an arcuate surface, C-shaped in plan view, in contact with the sealing resin layer. The post may be made of Cu.

The external connecting terminal may include a generally spherically formed solder ball extending from the forward end surface of the post up to a portion of the side surface of the post exposed from the sealing resin layer and covering the portion.

In this case, the solder ball may have a covering portion covering the portion of the side surface of the post exposed from the sealing resin layer. Further, the covering portion of the solder ball may be provided in the form of a thin film parallelly extending along the side surface of the post.

While a semiconductor device to which a WLCSP is applied has a small package size and hence the same is suitable to a miniature apparatus such as a digital camera or a portable telephone, a side surface of an LSI (semiconductor chip) is uncovered. Therefore, the semiconductor device is unsuitable to an apparatus loaded with a stroboscope (flash gun). When the stroboscope emits light, the light from the stroboscope diffuses also into the apparatus. If the semiconductor device is provided in the apparatus, there is a possibility that infrared rays included in the light penetrate from the side surface of the LSI into the inner portion thereof and an IC built into the LSI causes a malfunction such as occurrence of noise.

Therefore, a secondary object of the present invention is to provide a semiconductor device and a method for manufacturing the same, capable of preventing penetration of infrared rays into a semiconductor chip.

In order to attain this secondary object, the semiconductor device according to the present invention preferably further includes a rear surface covering film covering the rear surface of the semiconductor chip and a shielding film made of a material having shielding properties against infrared rays and covering the side surface of the semiconductor chip.

Thus, penetration of infrared rays from the side surface of the semiconductor chip into the inner portion thereof can be prevented. Further, the front surface and the rear surface of the semiconductor chip are covered with the sealing resin layer and the rear surface covering film respectively, whereby no infrared rays penetrate from the front surface and the rear surface of the semiconductor chip into the inner portion. Therefore, no infrared rays penetrate into the semiconductor chip, whereby occurrence of an inconvenience such as a malfunction of the IC resulting from penetration of infrared rays can be prevented.

As the material having shielding properties against infrared rays, a metallic material can be illustrated. In a case where the rear surface covering film and/or the shielding film is made of a metallic material, for example, excellent shielding properties can be exhibited against infrared rays.

The shielding film and the rear surface covering film may be integrally formed. In this case, the number of manufacturing steps for the semiconductor device can be reduced as compared with a technique of forming the shielding film and the rear surface covering film independently of each other.

The shielding film may be made of a resin material, or may have a multilayer structure of a layer made of a resin material and a layer made of a metallic material.

The metallic material having shielding properties against infrared rays is preferably one type selected from a group consisting of Pd, Ni, Ti, Cr and TiW.

The resin material having shielding properties against infrared rays is preferably one type selected from a group consisting of epoxy resin, polyamide imide, polyamide, polyimide and phenol.

The thickness of the rear surface covering film is preferably 3 μm to 100 μm. The thickness of the shielding film is preferably 0.1 μm to 10 μm.

The semiconductor device having the rear surface covering film and the shielding film can be manufactured by a manufacturing method including steps including the aforementioned A to E and further including steps including the following F to H, for example:

F. a step of forming a shielding film on a side surface of the semiconductor chip exposed as part of the inner surface of the trench by applying a shielding material having shielding properties against infrared rays to the inner surface of the trench in advance of the terminal forming step;

G. a rear surface polishing step making the trench provided with the shielding film penetrate toward the side of the rear surface of the semiconductor wafer by polishing the semiconductor wafer from the side of the rear surface after the terminal forming step; and H. a step of forming a rear surface covering film covering the rear surface of the semiconductor wafer on the rear surface exposed by the rear surface polishing step.

The step of forming the shielding film of the step F may include a step of forming the shielding film on the whole areas of the side surface of the post and the side surface of the semiconductor chip exposed as parts of the inner surface of the trench respectively, a step of covering a first portion of the shielding film on the side surface of the semiconductor chip with a protective layer made of a material having an etching selection ratio with respect to the shielding film, a step of selectively removing a second portion of the shielding film on the side surface of the post in a state of protecting the first portion of the shielding film with the protective layer, and a step of completely removing the protective layer after removing the second portion of the shielding film.

When the step of forming the rear surface covering film includes a step of forming a film collectively covering the rear surfaces of the plurality of semiconductor chips in this case, the step of dividing the semiconductor wafer into the semiconductor chip of the step E may include a step of cutting the rear surface covering film collectively covering the rear surfaces of the semiconductor chips on the dicing line. When the step of forming the rear surface covering film of the step H includes a step of forming films individually covering the rear surfaces of the plurality of semiconductor chips, the rear surface polishing step of the step G may serve also as the step of dividing the semiconductor wafer into the semiconductor chip of the step E.

The step of forming the shielding film of the step F may include a step of forming a first shielding film on the whole areas of the side surface of the post and the side surface of the semiconductor chip exposed as parts of the inner surface of the trench respectively, a step of covering a first portion of the first shielding film on the side surface of the semiconductor chip with a second shielding film made of a material having an etching selection ratio with respect to the first shielding film and shielding properties against infrared rays, a step of selectively removing a second portion of the first shielding film on the side surface of the post in a state of protecting the first portion of the first shielding film with the second shielding film, and a step of forming the shielding film having a multilayer structure of the first shielding film and the second shielding film by selectively removing the second shielding film after removing the second portion of the first shielding film.

In this case, one of the first shielding film and the second shielding film may be made of a metallic material, and the other one may be made of a resin material.

In a case of further including a step of forming a temporary trench having the same shape as the trench to be along a line for forming the trench in advance of the sealing step of the step B, the sealing step of the step B may include a step of charging a resin material into the temporary trench simultaneously with the formation of the sealing resin layer. In this case, the trench forming step of the step C may include a step of exposing the side surface of the post by selectively removing the charged resin material with a first blade having the same width as the width of the temporary trench, and a step of forming a shielding film made of the resin material on the side surface of the semiconductor chip by selectively removing the resin material with a second blade having a width smaller than the width of the first blade, so that the resin material remains on the side surface of the semiconductor chip in a filmlike manner.

EMBODIMENT(S) OF THE INVENTION

Embodiments of the present invention are now described in detail with reference to the attached drawings.

First Embodiment

Figure 1:
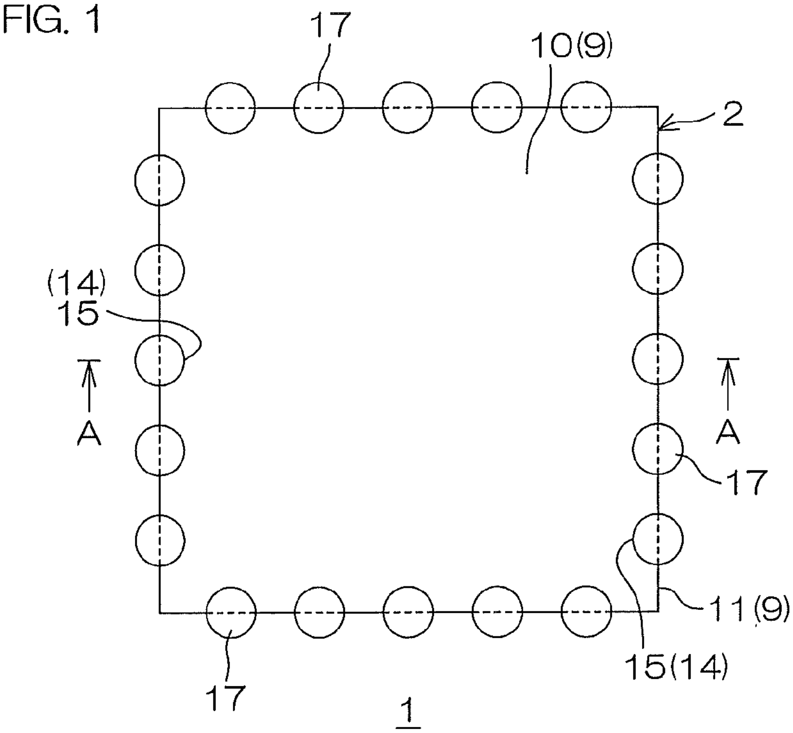
FIG. 1 A schematic plan view of a semiconductor device according to a first embodiment of the present invention.
Figure 2:
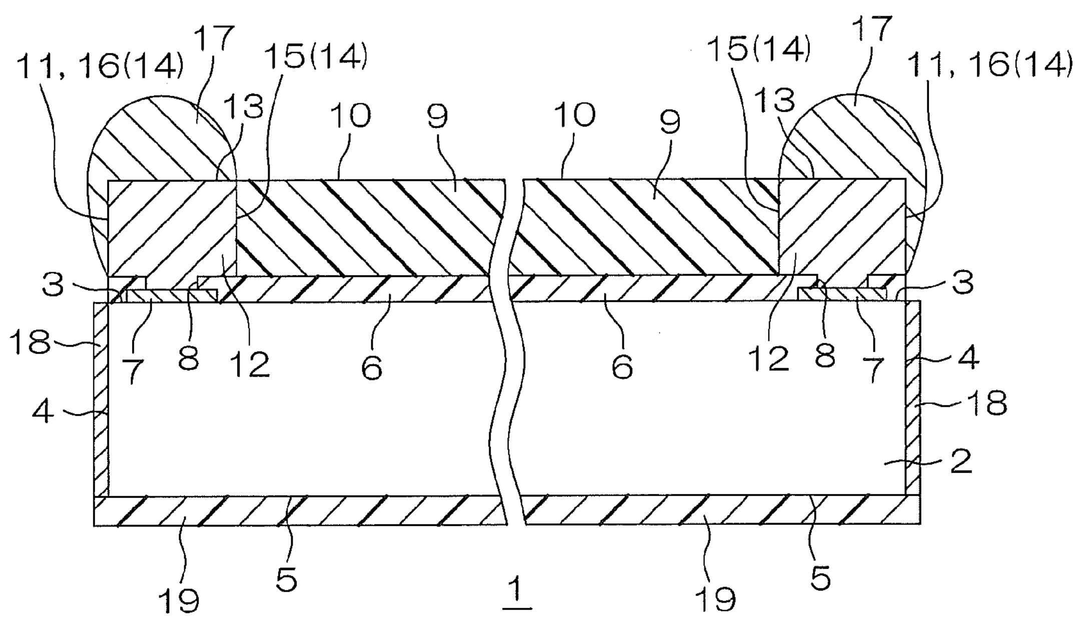
FIG. 2 A schematic sectional view of the semiconductor device according to the first embodiment of the present invention, showing a section taken along a cutting plane line A-A in FIG. 1.

FIG. 1 is a schematic plan view of a semiconductor device according to a first embodiment of the present invention. FIG. 2 is a schematic sectional view of the semiconductor device according to the first embodiment of the present invention, showing a section taken along a cutting plane line A-A in FIG. 1.

A semiconductor device 1 is a semiconductor device to which a WLCSP is applied. The semiconductor device 1 includes a semiconductor chip 2. The semiconductor chip 2 is a silicon chip, for example, and provided in a quadrangular shape in plan view having a front surface 3, side surfaces 4 and a rear surface 5.

A passivation film (surface protective film) 6 is formed on the front surface 3 of the semiconductor chip 2. The passivation film 6 is made of silicon oxide or silicon nitride, for example. A plurality of pad openings 8 for exposing parts of internal wires electrically connected with elements (not shown) built into the semiconductor chip 2 as electrode pads 7 are formed in the passivation film 6. In other words, the passivation film 6 is removed from central portions of the respective electrode pads 7.

A sealing resin layer 9 is stacked on the passivation film 6. The sealing resin layer 9 is made of epoxy resin, for example. The sealing resin layer 9 covers the front surface of the passivation film 6, and seals the side of the front surface 3 of the semiconductor device 1 (the semiconductor chip 2). In the sealing resin layer 9, a front surface 10 is formed as a planar surface, while side surfaces 11 thereof are formed to be flush with the side surfaces 4 of the semiconductor chip 2. Thus, the semiconductor device 1 has an outer size (package size) equal to the size of the semiconductor chip 2 in plan view.

Generally columnar posts 12 are provided on the respective electrode pads 7, to pass through the sealing resin layer 9 in the thickness direction thereof. The posts 12 are made of copper (Cu), for example. Lower end portions of the posts 12 enter the pad openings 8, and are connected to the electrode pads 7. Forward end surfaces (upper end portions) 13 of the posts 12 are flush with the front surface 10 of the sealing resin layer 9. Side surfaces 14 of the posts 12 have arcuate surfaces 15, C-shaped in plan view, in contact with the sealing resin layer 9 and planar surfaces 16 exposed from the side surfaces 11 of the sealing resin layer 9 and flush with the side surfaces 11. In the following, the planar surfaces 16 may simply be described as "side surfaces 16".

The plurality of electrode pads 7 (pad openings 8) are arranged in a line in the form of a quadrangular annulus along peripheral edges of the semiconductor chip 2. Therefore, the posts 12 are arranged in a line in the form of a quadrangular annulus along the peripheral edges of the semiconductor chip 2. Thus, the side surfaces 16 of all posts 12 are flush with the side surfaces 11 of the sealing resin layer 9. The interval between adjacent posts 12 is set to such a distance that adjacent solder balls 17 do not come into contact with each other even if the solder balls 17 described below are deformed when the semiconductor device 1 is mounted on a mounting substrate (not shown).

The solder balls 17 as external connecting terminals are bonded onto the forward end surfaces 13 of the respective posts 12. The solder balls 17 are generally spherically formed. Lower portions of the solder balls 17 extend from the forward end surfaces 13 of the posts 12 up to portions of the side surfaces 16 exposed from the sealing resin layer 9, and cover the portions. In other words, the solder balls 17 are provided over the forward end surfaces 13 and the side surfaces 16 of the posts 12. The solder balls 17 are electrically connected with the elements built into the semiconductor chip 2 through the electrode pads 7 and the posts 12.

The solder balls 17 are connected to pads (not shown) on the mounting substrate, whereby mounting of the semiconductor device 1 on the mounting substrate is achieved. In other words, the solder balls 17 are connected to the pads on the mounting substrate, whereby the semiconductor device 1 is supported on the mounting substrate, and electrical connection between the mounting substrate and the semiconductor chip 2 is achieved.

The whole areas of the side surfaces 4 of the semiconductor chip 2 are covered with shielding films 18. The shielding films 18 are made of a metallic material having shielding properties against infrared rays. As metallic materials having shielding properties against infrared rays, Pd (palladium), Ni (nickel), Ti (titanium), Cr (chromium) and TiW (titanium-tungsten alloy) etc. can be illustrated, for example. The thickness of the shielding films 18 is not less than 0.1 μm and not more than 10 μm, for example.

The whole area of the rear surface 5 of the semiconductor chip 2 is covered with a rear surface covering film 19. The rear surface covering film 19 is made of a resin material such as epoxy resin, polyamide imide, polyamide, polyimide or phenol, for example. The thickness of the rear surface covering film 19 is not less than 3 μm and not more than 100 μm, for example.

FIGS. 3A to 3L are schematic sectional views showing a method for manufacturing the semiconductor device shown in FIG. 2 in step order.

Manufacturing of the semiconductor device 1 is progressed in a state of a wafer 20 before the semiconductor chip 2 is cut into an individual piece. The passivation film 6 is formed on the front surface of the semiconductor chip 2 (the wafer 20).

Figure 3A:
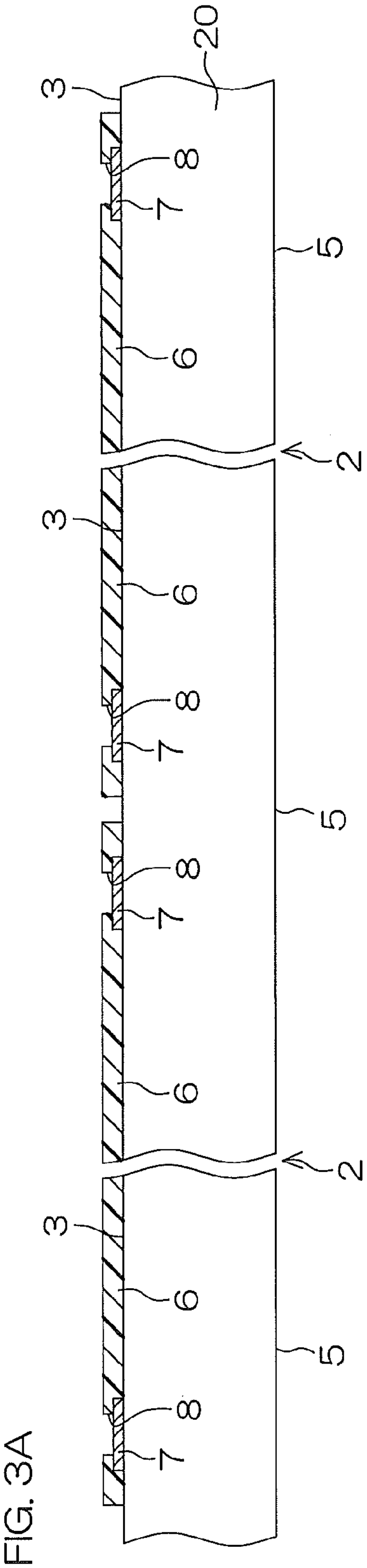
FIG. 3A A schematic sectional view showing a state in the process of manufacturing the semiconductor device shown in FIG. 2.

First, the plurality of pad openings 8 are formed in the passivation film 6 by photolithography and etching, as shown in FIG. 3A.

Figure 3B:
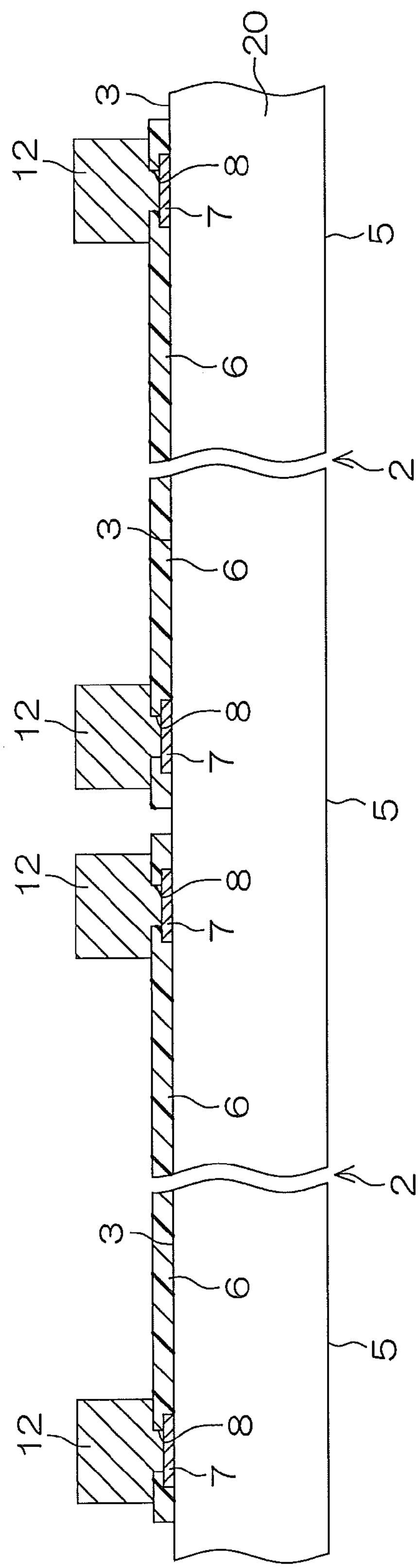
FIG. 3B A schematic sectional view showing a step subsequent to FIG. 3A.

Then, the pillarlike posts 12 are formed on the respective electrode pads 7, as shown in FIG. 3B. The posts 12 can be formed by forming a mask having openings corresponding to portions where the posts 12 are formed on the passivation film 6, thereafter growing copper which is the material for the posts 12 in the openings of the mask by plating, and thereafter removing the mask, for example. The posts 12 can also be formed by forming a copper film (not shown) on the passivation film 6 and the electrode pads 7 by plating and thereafter selectively removing the copper film by photolithography and etching.

Figure 3C:
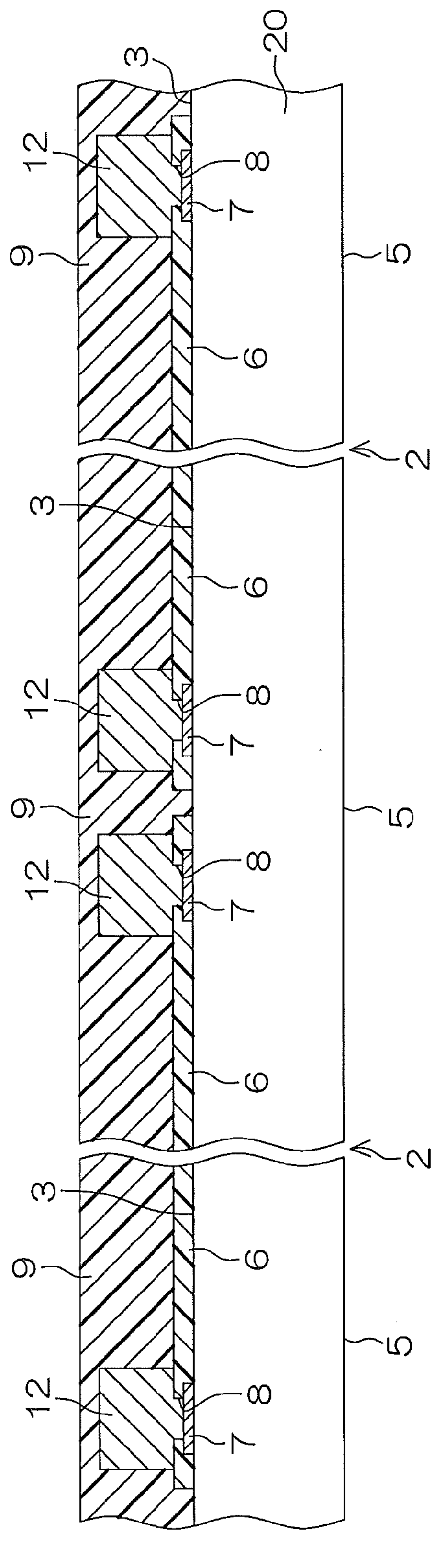
FIG. 3C A schematic sectional view showing a step subsequent to FIG. 3B.

Then, liquid resin (epoxy resin, for example) which is the material for the sealing resin layer 9 is supplied onto the passivation film 6, as shown in FIG. 3C. The liquid resin is supplied up to such a height that the same buries the posts 12 therein (such a height that the same completely covers the posts 12). Then, a treatment for hardening the resin is performed, whereby the sealing resin layer 9 is formed on the passivation film 6.

Figure 3D:
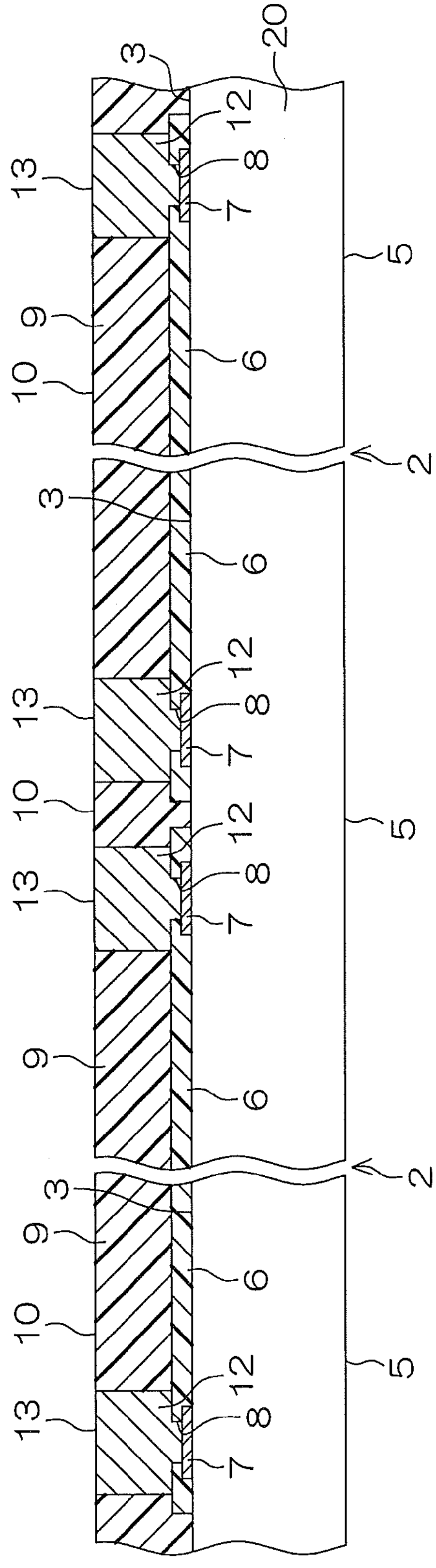
FIG. 3D A schematic sectional view showing a step subsequent to FIG. 3C.

Thereafter the sealing resin layer 9 is polished from the side of the front surface thereof. This polishing of the sealing resin layer 9 is continued until the forward end surfaces 13 of the posts 12 are exposed from the front surface 10 of the sealing resin layer 9. As a result of this polishing, the forward end surfaces 13 of the posts 12 flush with the front surface 10 of the sealing resin layer 9 are obtained, as shown in FIG. 3D.

Figure 3E:
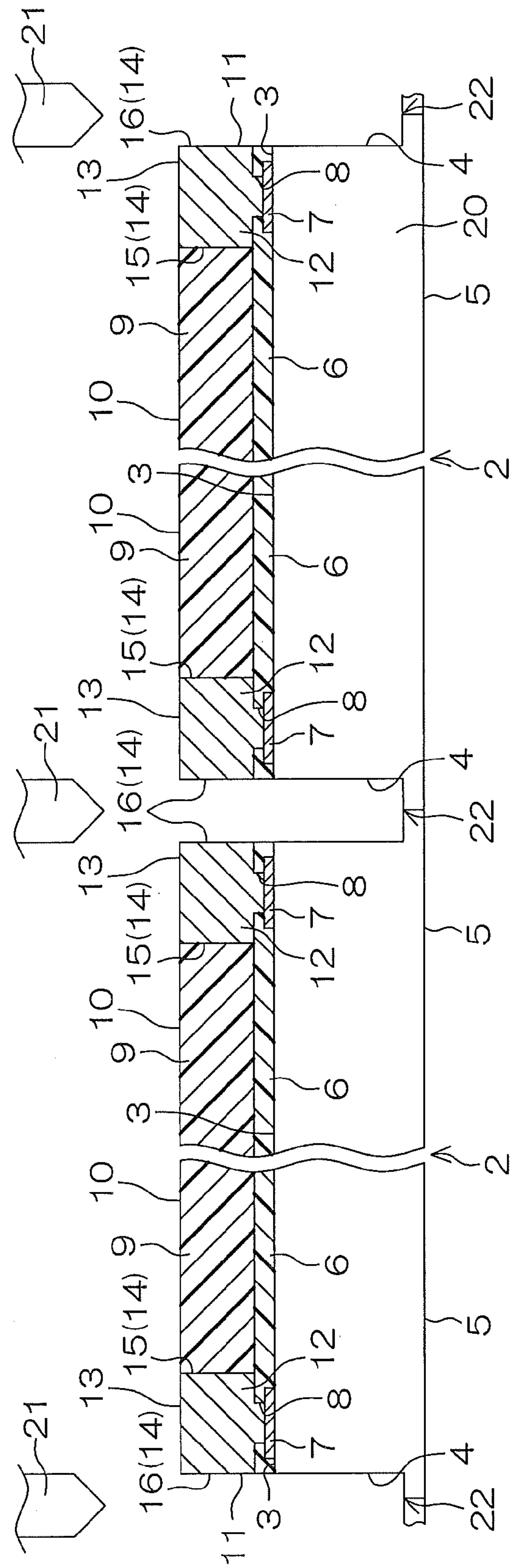
FIG. 3E A schematic sectional view showing a step subsequent to FIG. 3D.

Then, dicing blades 21 are advanced from the side of the front surface of the semiconductor chip 2, whereby trenches 22 dug down from the front surface of the sealing resin layer 9 are formed on dicing lines set along the peripheral edges of each semiconductor chip 2, as shown in FIG. 3E. The trenches 22 pass through the sealing resin layer 9 and the passivation film 6, and are dug down to such a depth that bottom surfaces thereof reach positions in the vicinity of the rear surface 5 of the semiconductor chip 2. Further, the trenches 22 are so formed that the width between side surfaces thereof is constant in the depth direction thereof. Thus, the side surfaces 16 of the respective posts 12 and the side surfaces 4 of the semiconductor chip 2 are exposed as parts of inner surfaces (side surfaces) of the trenches 22.

Figure 3F:
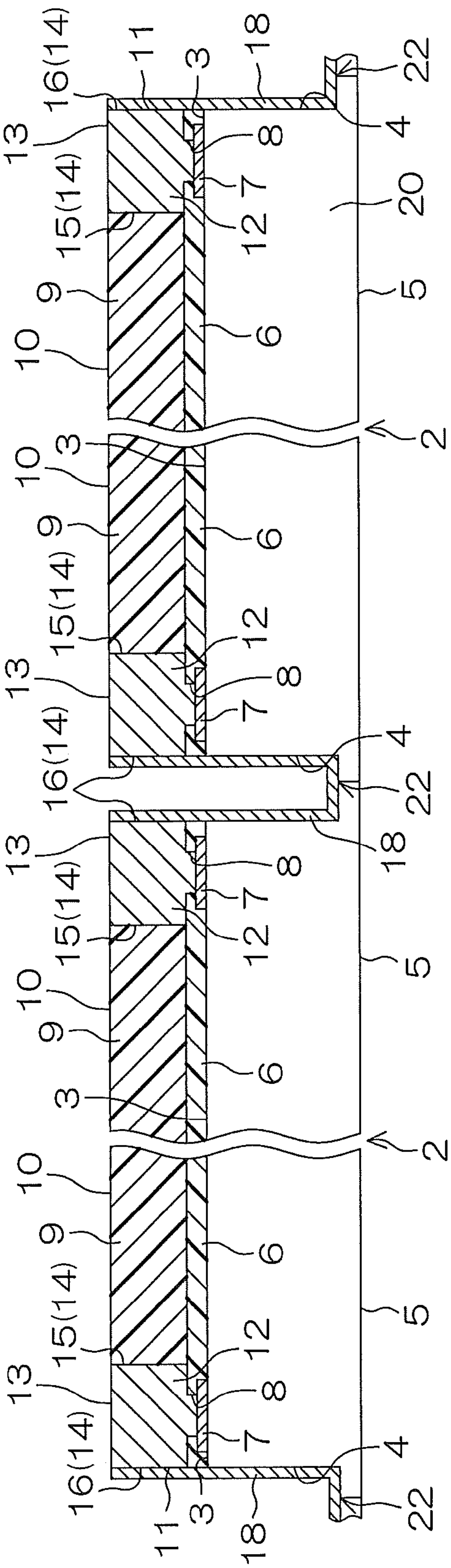
FIG. 3F A schematic sectional view showing a step subsequent to FIG. 3E.

Thereafter the shielding films 18 are applied to the whole areas of the inner surfaces of the trenches 22, as shown in FIG. 3F. The shielding films 18 may be formed by evaporating a metal consisting of the material for the shielding films 18 onto the inner surfaces of the trenches 22, or may be formed by electroless plating, for example.

Figure 3G:
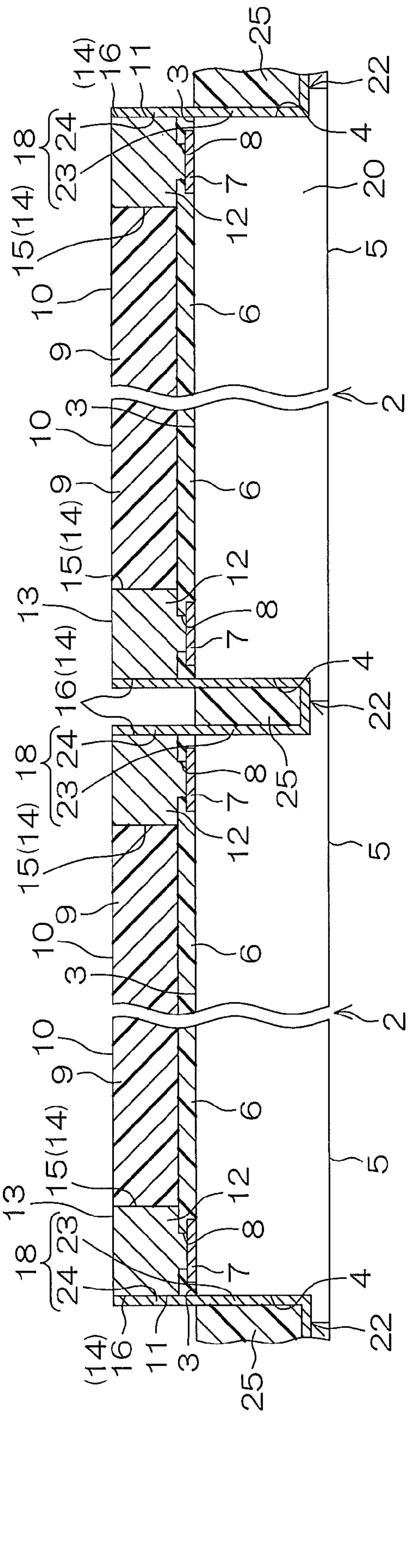
FIG. 3G A schematic sectional view showing a step subsequent to FIG. 3F.

After the formation of the shielding films 18, liquid resin (epoxy resin, for example) identical to the material for the sealing resin layer 9 is supplied into the trenches 22, as shown in FIG. 3G. This liquid resin has an etching selection ratio with respect to the shielding films 18, and is supplied up to such a height that a front surface thereof is flush with the front surface 3 of the semiconductor chip 2. Thus, protective layers 25 made of the liquid resin and embedded in the trenches 22 are formed. The protective layers 25 cover first portions 24 of the shielding films 18 on the side surfaces 14 of the semiconductor chip 2, and expose second portions 24 of the shielding films 18 on the side surfaces 16 of the posts 12 (do not cover the second portions 24). Then, an etchant (etching solution or etching gas) capable of etching the shielding films 18 at a higher etching rate as compared with the protective layers 25 is supplied, in the state covering the first portions 23 of the shielding films 18 with the protective layers 25.

Figure 3H:
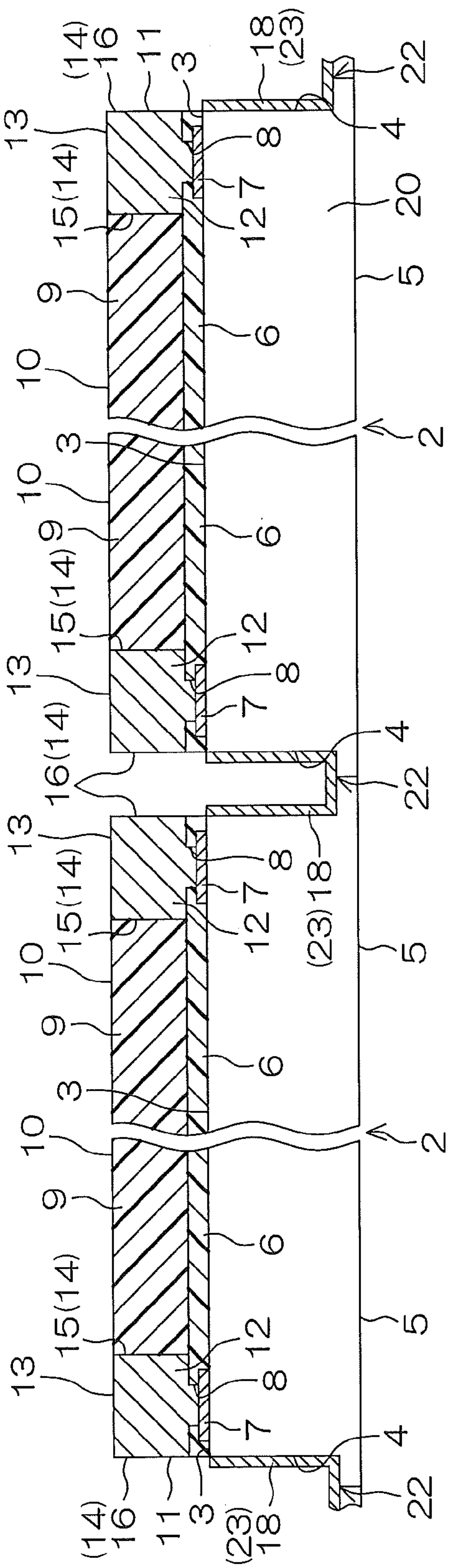
FIG. 3H A schematic sectional view showing a step subsequent to FIG. 3G.

Thus, the second portions 24 of the shielding films 18 not covered with the protective layers 25 are selectively removed, while the first portions 23 of the shielding films 18 covered with the protective layers 25 remain in the trenches 22, as shown in FIG. 3H. Thereafter the protective layers 25 are removed.

Figure 3I:
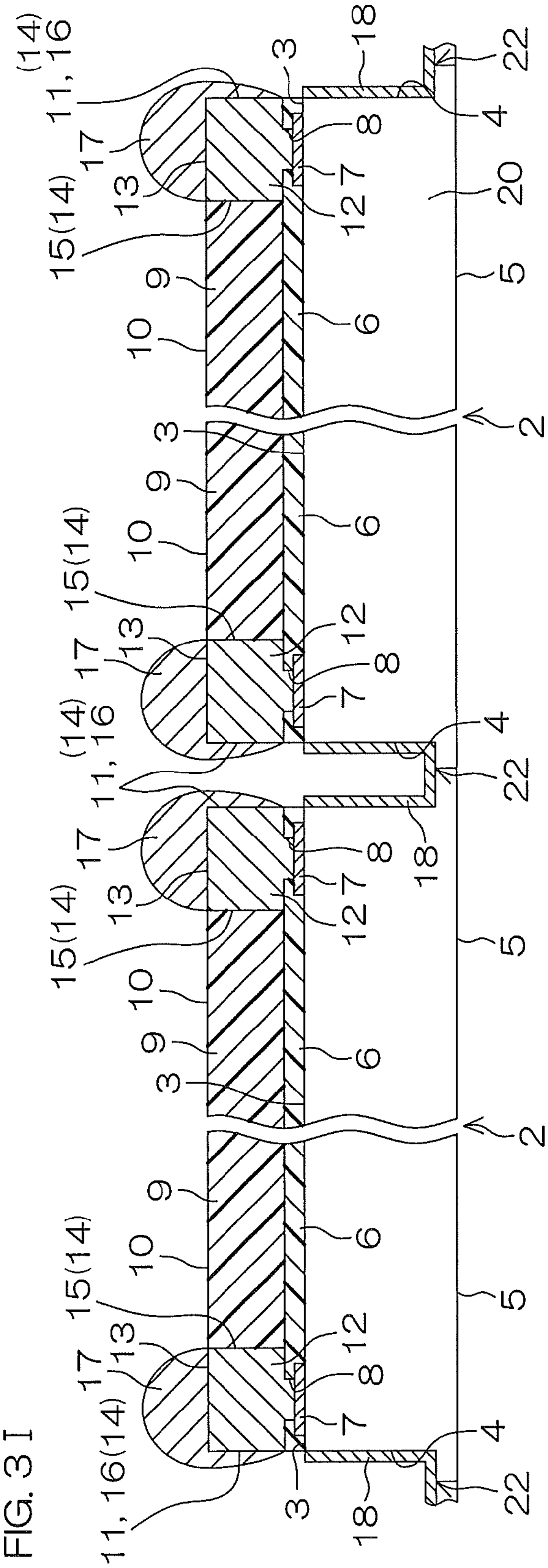
FIG. 3I A schematic sectional view showing a step subsequent to FIG. 3H.

Then, the solder balls 17 are arranged on the forward end surfaces 13 of the posts 12, as shown in FIG. 3I. The solder balls 17 spread up to the side surfaces 16 of the posts 12, due to wettability thereof. Thus, the forward end surfaces 13 and the side surfaces 16 of the posts 12 are covered with the solder balls 17.

Figure 3J:
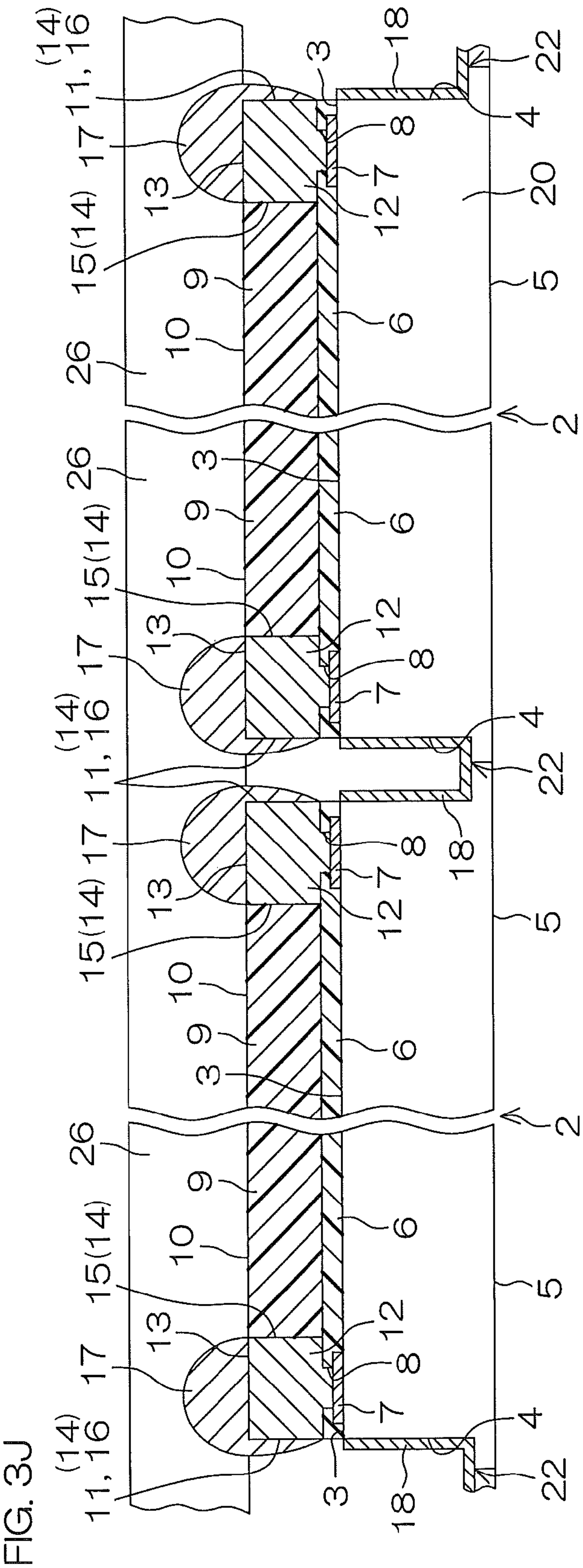
FIG. 3J A schematic sectional view showing a step subsequent to FIG. 3I.

Then, the solder balls 17 are arranged on an adhesive surface of a dicing tape 26, and the wafer 20 is supported on the dicing tape 26, as shown in FIG. 3J.

Figure 3K:
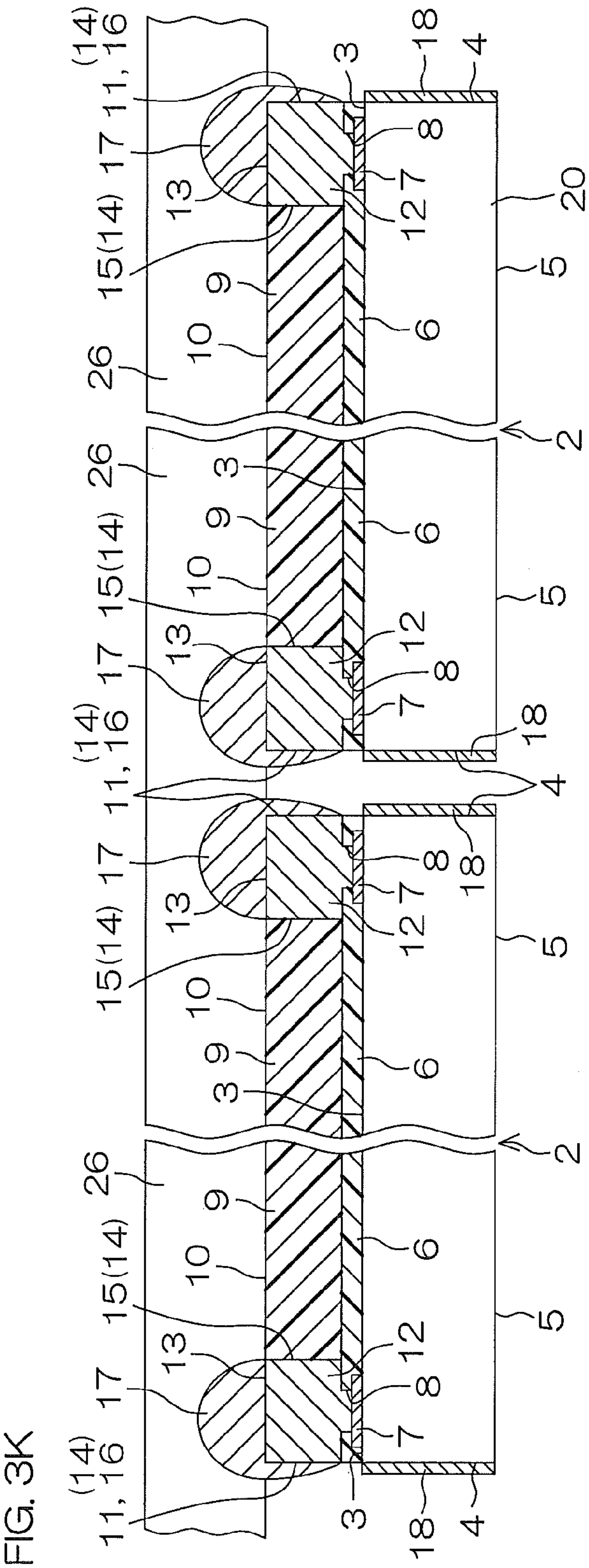
FIG. 3K A schematic sectional view showing a step subsequent to FIG. 3J.

Then, the semiconductor chip 2 (the wafer 20) is polished from the side of the rear surface 5 thereof. This polishing of the semiconductor chip 2 is performed until portions of the semiconductor chip 2 formed under the trenches 22 are completely removed and the inner sides of the trenches 22 and the side of the rear surface 5 of the semiconductor chip 2 communicate with one another, as shown in FIG. 3K. At this time, portions of the shielding films 18 applied to the bottom surfaces of the trenches 22 are removed.

Figure 3L:
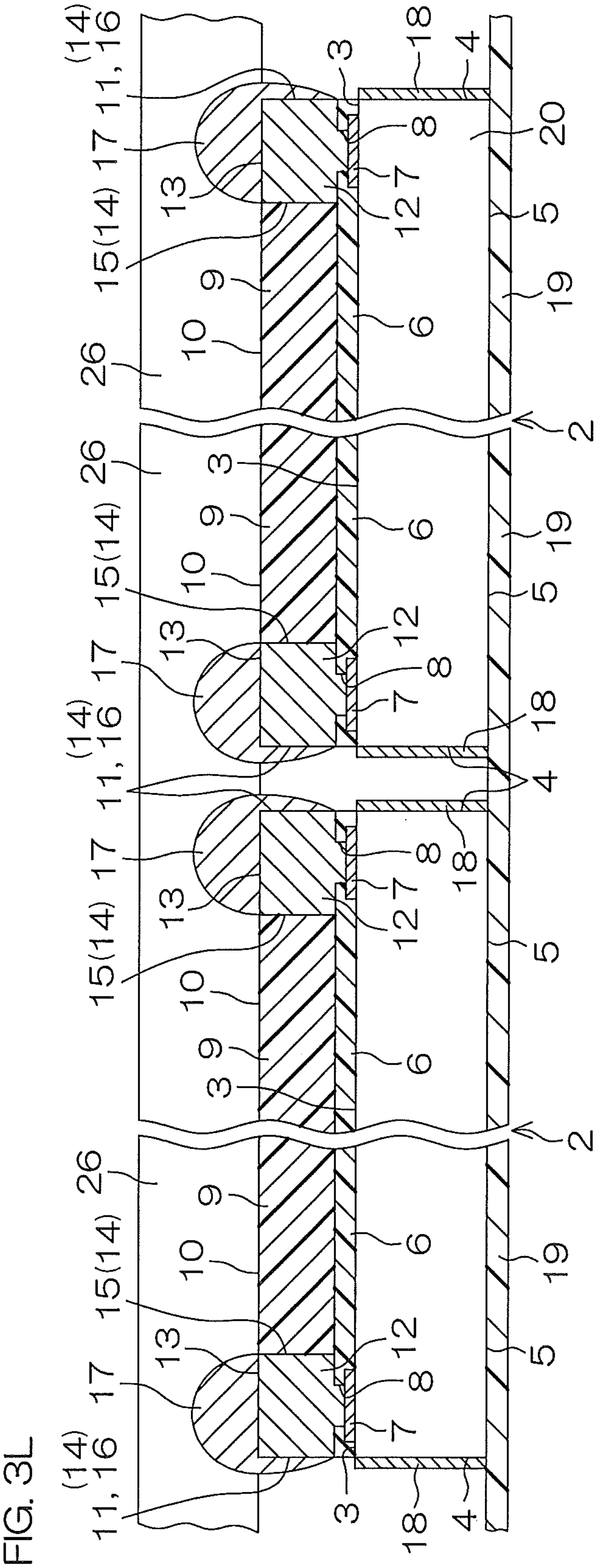
FIG. 3L A schematic sectional view showing a step subsequent to FIG. 3K.

Thereafter the rear surface covering film 19 is formed on the whole area of the rear surface 5 of the semiconductor chip 2 (the wafer 20), as shown in FIG. 3L. The rear surface covering film 19 can be formed by coating (spin-coating) the whole area of the rear surface 5 of the wafer 20 with a resin material and hardening the resin material, for example. The rear surface covering film 19 can also be formed by sticking a resin film formed in a filmlike manner to the whole area of the rear surface 5 of the wafer 20.

Then, the rear surface covering film 19 is cut on the dicing lines with a dicing blade (not shown), and the wafer 20 is cingulated into each semiconductor chip 2. When the dicing tape 26 is thereafter removed, the semiconductor device 1 shown in FIG. 2 is obtained.

In the semiconductor device 1, as hereinabove described, the side surfaces 16 of the posts 12 are flush with the side surfaces 11 of the sealing resin layer 9. In other words, the side surfaces 16 of the posts 12 are exposed from the side surfaces 11 of the sealing resin layer 9. Therefore, no overhangs are present between the posts 12 and the peripheral edges of the semiconductor chip 2, whereby the package size of the semiconductor device 1 can be reduced as compared with a conventional semiconductor device, by the width of the overhangs. Consequently, the package size can be reduced beyond a conventional limit.

Further, the solder balls 17 are provided over the forward end surfaces 13 and the side surfaces 16 of the posts 12. Thus, corner portions formed by the forward end surfaces 13 and the side surfaces 16 of the posts 12 are covered with the solder balls 17, and the boundaries between the forward end surfaces 13 of the posts 12 and the solder balls 17 are not exposed to the exterior. When stress is applied to the posts 12 and the solder balls 17, therefore, the stress can be prevented from concentrating on the boundaries between the forward end surfaces of the posts 12 and the solder balls 17 and the solder balls 17 and the posts 12 further come into contact with one another so that the contact areas can be enlarged by the areas of the side surfaces 16, whereby occurrence of separation of the solder balls 17 from the posts 12 can be prevented.

In addition, the plurality of posts 12 are provided along the peripheral edges of the semiconductor chip 2, and the side surfaces 16 of all posts 12 are flush with the side surfaces 11 of the sealing resin layer 9. After the semiconductor chip 2 is mounted on the mounting substrate, therefore, application states of the solder balls 17 with respect to the side surfaces 16 of all posts 12 can be visually recognized. Therefore, visual inspection of the state of the semiconductor chip 2 mounted on the mounting substrate can be easily performed.

In the semiconductor device 1, the side surfaces 4 of the semiconductor chip 2 are covered with the shielding films 18 made of the material having shielding properties against infrared rays. Thus, penetration of infrared rays from the side surfaces 4 of the semiconductor chip 2 into the inner portion thereof can be prevented. Further, the sealing resin layer 9 is stacked on the front surface 3 of the semiconductor chip 2 and the rear surface 5 of the semiconductor chip 2 is covered with the rear surface covering film 19, whereby no infrared rays penetrate from the front surface 3 and the rear surface 5 of the semiconductor chip 2 into the inner portion of the semiconductor chip 2, whereby occurrence of an inconvenience such as a malfunction of the IC resulting from penetration of infrared rays can be prevented.

Second Embodiment

Figure 4:
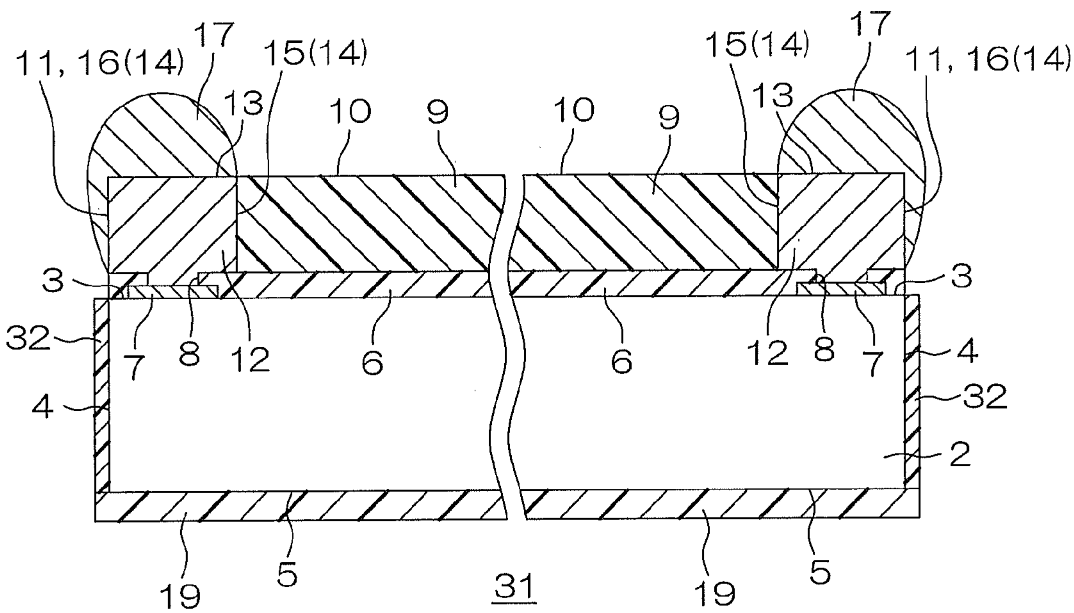
FIG. 4 A schematic sectional view of a semiconductor device according to a second embodiment of the present invention, showing a section taken along the same cutting plane line as the section of the semiconductor device of FIG. 2.

FIG. 4 is a schematic sectional view of a semiconductor device according to a second embodiment of the present invention, showing a section taken along the same cutting plane line as the section of the semiconductor device of FIG. 2. Referring to FIG. 4, portions corresponding to the respective parts of the portions shown in FIG. 2 are denoted by the same reference numerals as the reference numerals assigned to the respective parts. In the following, description as to the portions denoted by the same reference numerals is omitted.

In the semiconductor device 1 shown in FIG. 2, it has been assumed that the whole areas of the side surfaces 4 of the semiconductor chip 2 are covered with the shielding films 18 made of the metallic material. In a semiconductor device 31 shown in FIG. 4, on the other hand, the whole areas of side surfaces 4 of a semiconductor chip 2 are covered with shielding films 32 made of a resin material. The shielding films 32 are made of the same resin material as a rear surface covering film 19, e.g., a resin material such as epoxy resin, polyamide imide, polyamide, polyimide or phenol.

FIGS. 5A to 5J are schematic sectional views showing a method for manufacturing the semiconductor device shown in FIG. 4 in step order. Referring to FIGS. 5A to 5J, portions corresponding to the respective parts of the portions shown in FIGS. 3A to 3L are denoted by the same reference numerals as the reference numerals assigned to the respective parts.

Manufacturing of the semiconductor device 31 is progressed in a state of a wafer 20 before the semiconductor chip 2 is cut into an individual piece. A passivation film 6 is formed on a front surface of the semiconductor chip 2 (the wafer 20).

Figure 5A:
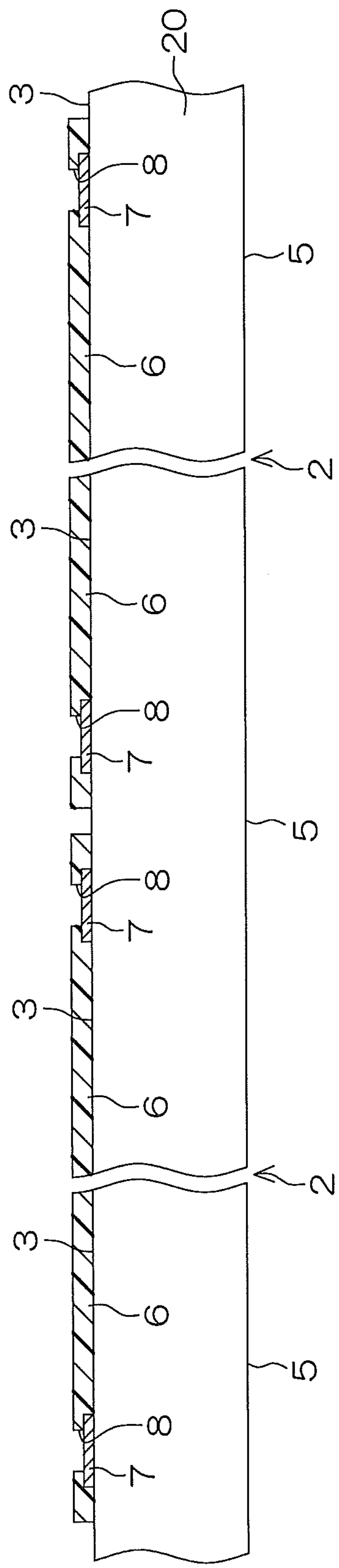
FIG. 5A A schematic sectional view showing a state in the process of manufacturing the semiconductor device shown in FIG. 4.

First, a plurality of pad openings 8 are formed in the passivation film 6 by photolithography and etching, as shown in FIG. 5A.

Figure 5B:
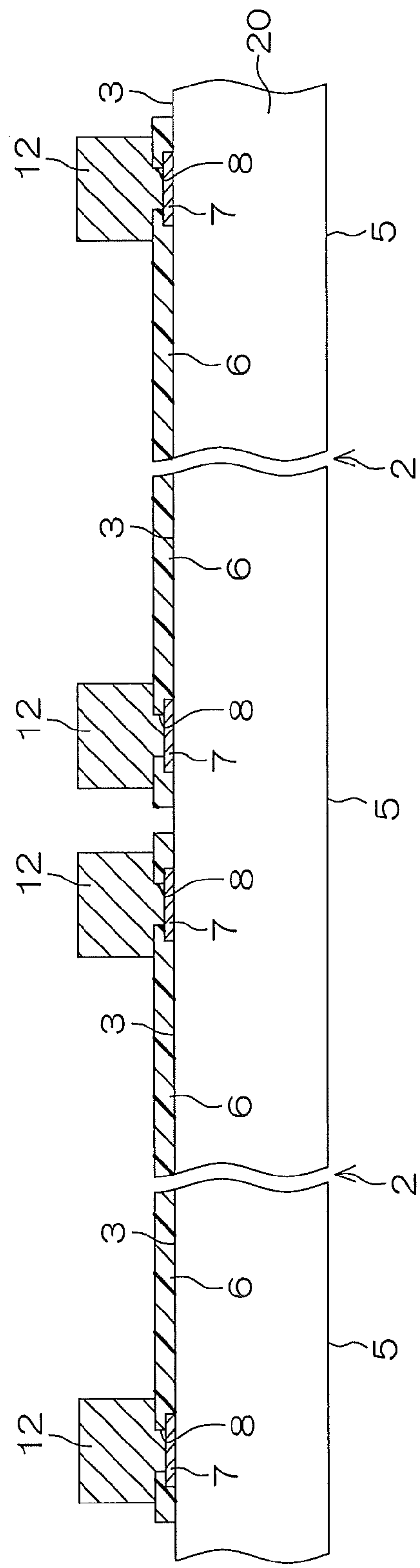
FIG. 5B A schematic sectional view showing a step subsequent to FIG. 5A.

Then, pillarlike posts 12 are formed on the respective electrode pads 7, as shown in FIG. 5B. The posts 12 can be formed by forming a mask having openings corresponding to portions where the posts 12 are formed on the passivation film 6, thereafter growing copper which is the material for the posts 12 in the openings of the mask by plating, and thereafter removing the mask, for example. The posts 12 can also be formed by forming a copper film (not shown) on the passivation film 6 and the electrode pads 7 by plating and thereafter selectively removing the copper film by photolithography and etching.

Figure 5C:
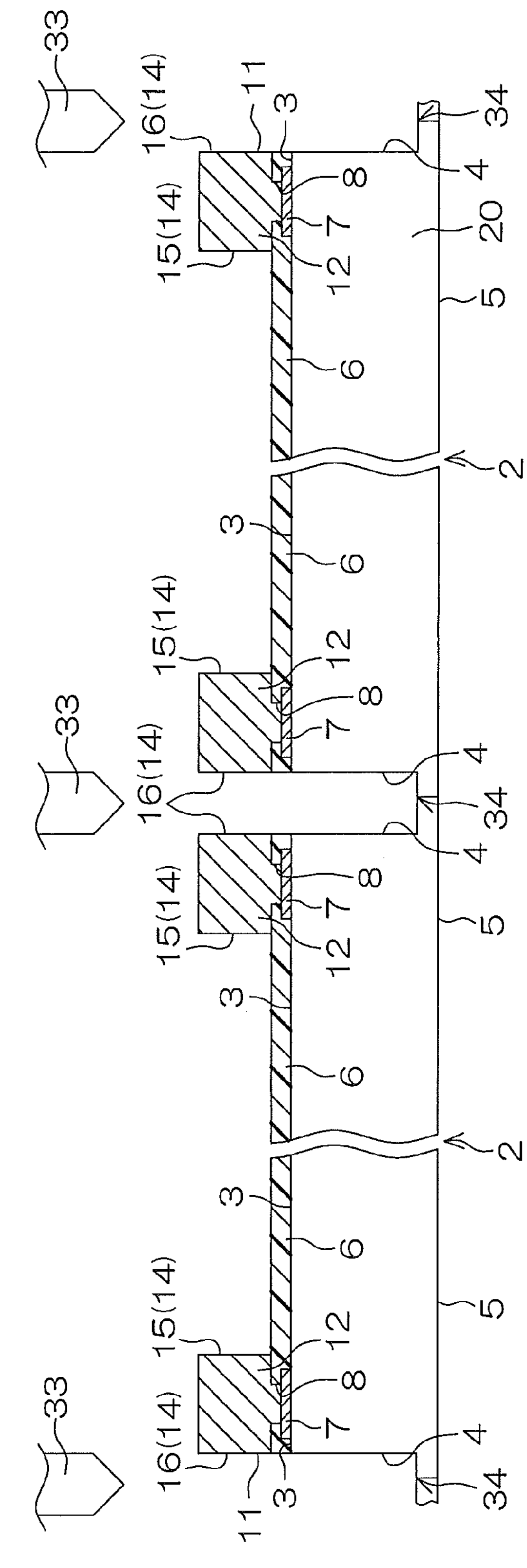
FIG. 5C A schematic sectional view showing a step subsequent to FIG. 5B.

Then, dicing blades 33 are advanced from the side of the front surface of the semiconductor chip 2, whereby trenches 34 as temporary trenches dug down from a front surface of a sealing resin layer 9 are formed on dicing lines set along peripheral edges of each semiconductor chip 2, as shown in FIG. 5C. The trenches 34 pass through the sealing resin layer 9 and the passivation film 6, and are dug down to such a depth that bottom surfaces thereof reach positions in the vicinity of a rear surface 5 of the semiconductor chip 2. Further, the trenches 34 are so formed that the width between side surfaces thereof is constant in the depth direction thereof. Thus, side surfaces 16 of the respective posts 12 and side surfaces 4 of the semiconductor chip 2 are exposed as parts of inner surfaces (side surfaces) of the trenches 34.

Then, liquid resin (epoxy resin, for example) which is the material for the sealing resin layer 9 is supplied onto the passivation film 6. The liquid resin is supplied up to such a height that the same buries the posts 12 therein (such a height that the same completely covers the posts 12). At this time, the liquid resin is also charged into the trenches 34 until the side surfaces 16 of the respective posts 12 and the side surfaces 4 of the semiconductor chip 2 get invisible. Then, a treatment for hardening the resin is performed, whereby the sealing resin layer 9 is formed on the passivation film 6, and resin material layers 35 completely filling up the trenches 34 are formed at the same time.

Figure 5D:
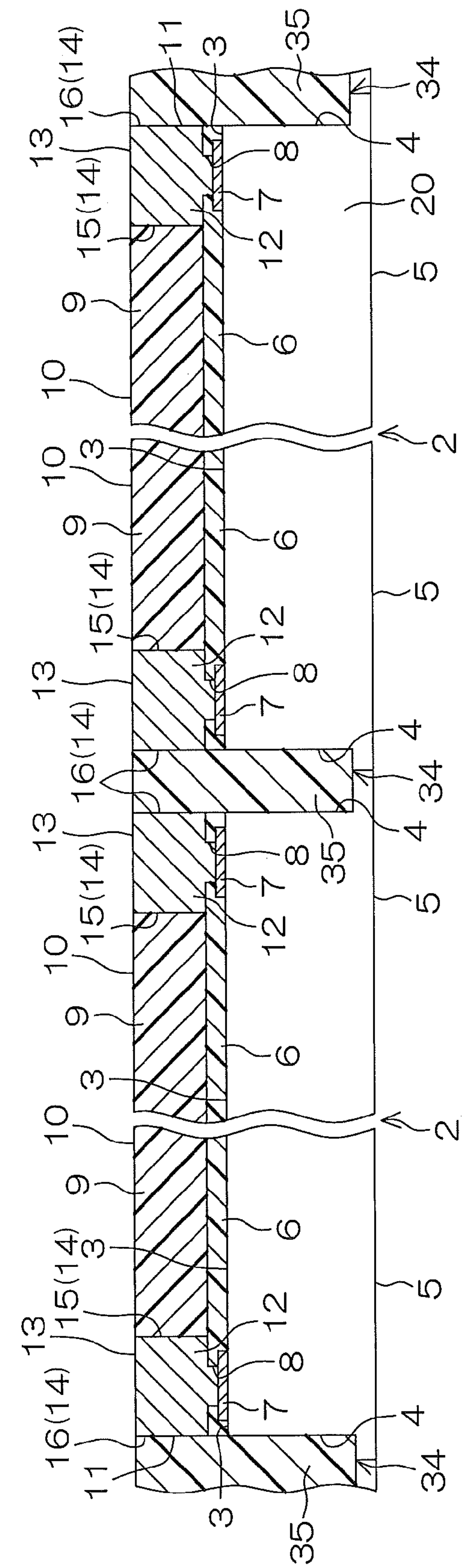
FIG. 5D A schematic sectional view showing a step subsequent to FIG. 5C.

Thereafter the sealing resin layer 9 is polished from the side of the front surface thereof. This polishing of the sealing resin layer 9 is continued until forward end surfaces 13 of the posts 12 are exposed from a front surface 10 of the sealing resin layer 9. As a result of this polishing, the forward end surfaces 13 of the posts 12 flush with the front surface 10 of the sealing resin layer 9 are obtained, as shown in FIG. 5D.

Figure 5E:
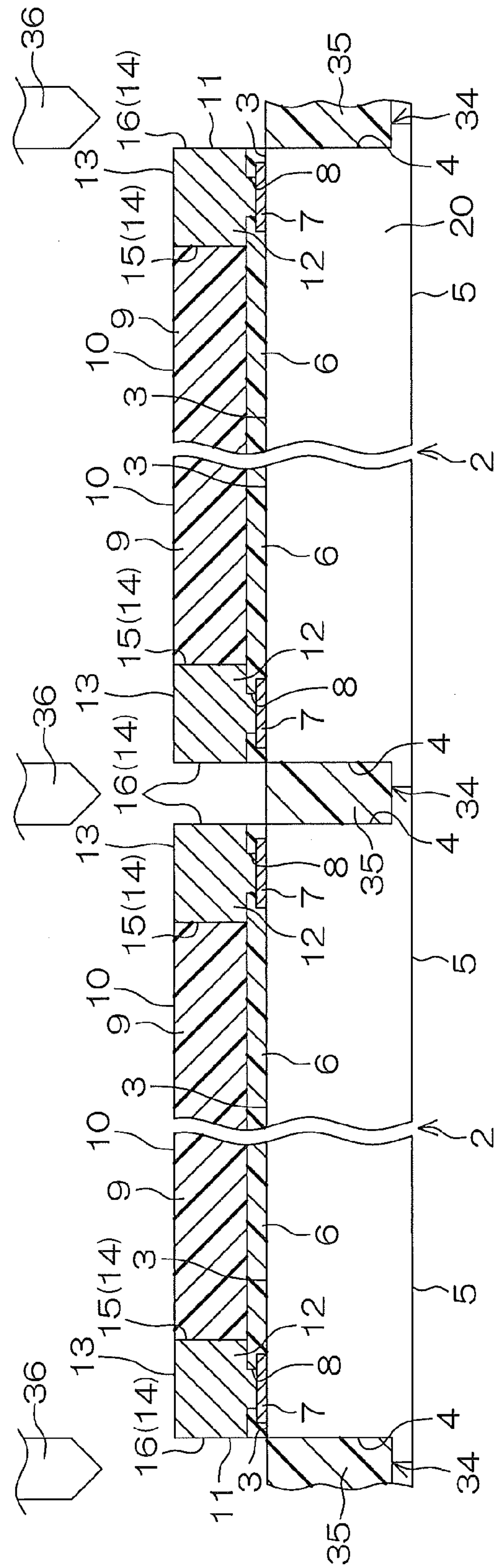
FIG. 5E A schematic sectional view showing a step subsequent to FIG. 5D.

Then, dicing blades 36 as first blades are advanced from the side of the front surface of the semiconductor chip 2, whereby portions of the resin material layers 35 upward beyond the front surface 3 of the semiconductor chip 2 are selectively removed, as shown in FIG. 5E. The dicing blades 36 have the same thickness as the dicing blades 33 employed for forming the trenches 34 in the step shown in FIG. 5C. Thus, the side surfaces 16 of the respective posts 12 are exposed.

Figure 5F:
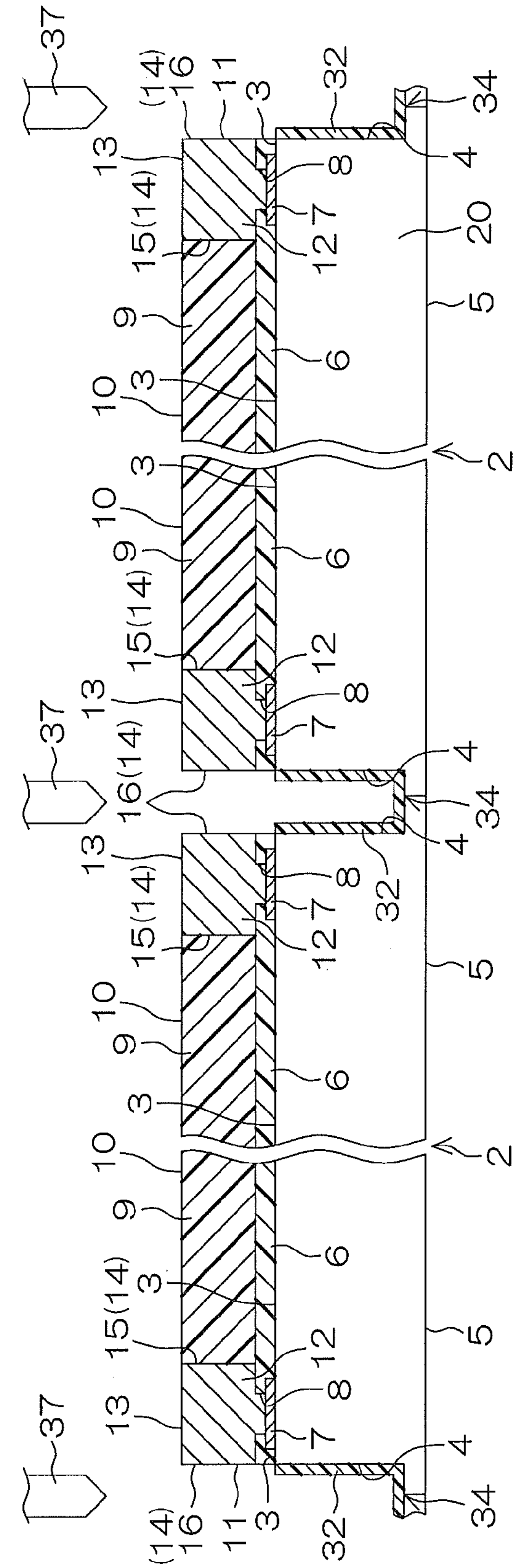
FIG. 5F A schematic sectional view showing a step subsequent to FIG. 5E.

Then, dicing blades 37 as second blades are advanced from the side of the front surface of the semiconductor 2, whereby central portions of the resin material layers 35 remaining in the trenches 34 are selectively removed, as shown in FIG. 5F. The dicing blades 37 have a smaller thickness than the dicing blades 36 employed for removing the portions of the resin material layers 35 upward beyond the front surface 3 of the semiconductor chip 2 in the step shown in FIG. 5E. Thus, the resin material layers 35 remain on the side surfaces 4 of the semiconductor chip 2 and the bottom surfaces of the trenches 34 in a filmlike manner, and the remaining portions become shielding films 32.

Figure 5G:
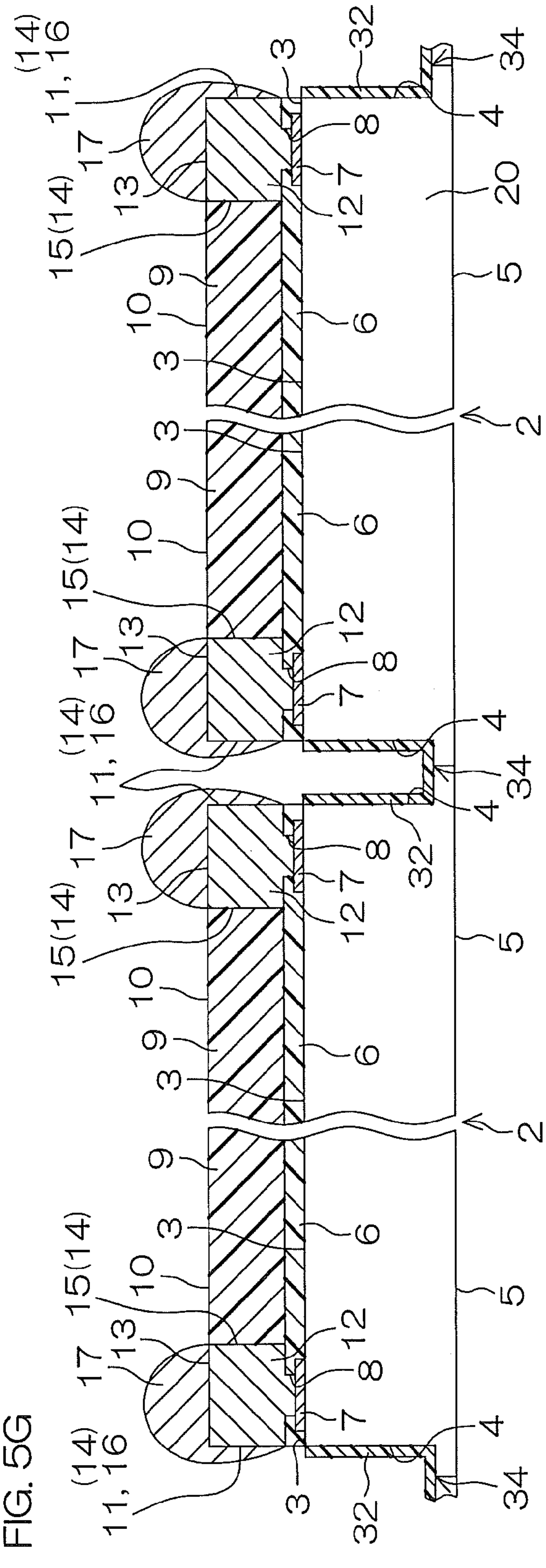
FIG. 5G A schematic sectional view showing a step subsequent to FIG. 5F.

Then, solder balls 17 are arranged on the forward end surfaces 13 of the posts 12, as shown in FIG. 5G. The solder balls 17 spread up to the side surfaces 16 of the posts 12, due to wettability thereof. Thus, the forward end surfaces 13 and the side surfaces 16 of the posts 12 are covered with the solder balls 17.

Figure 5H:
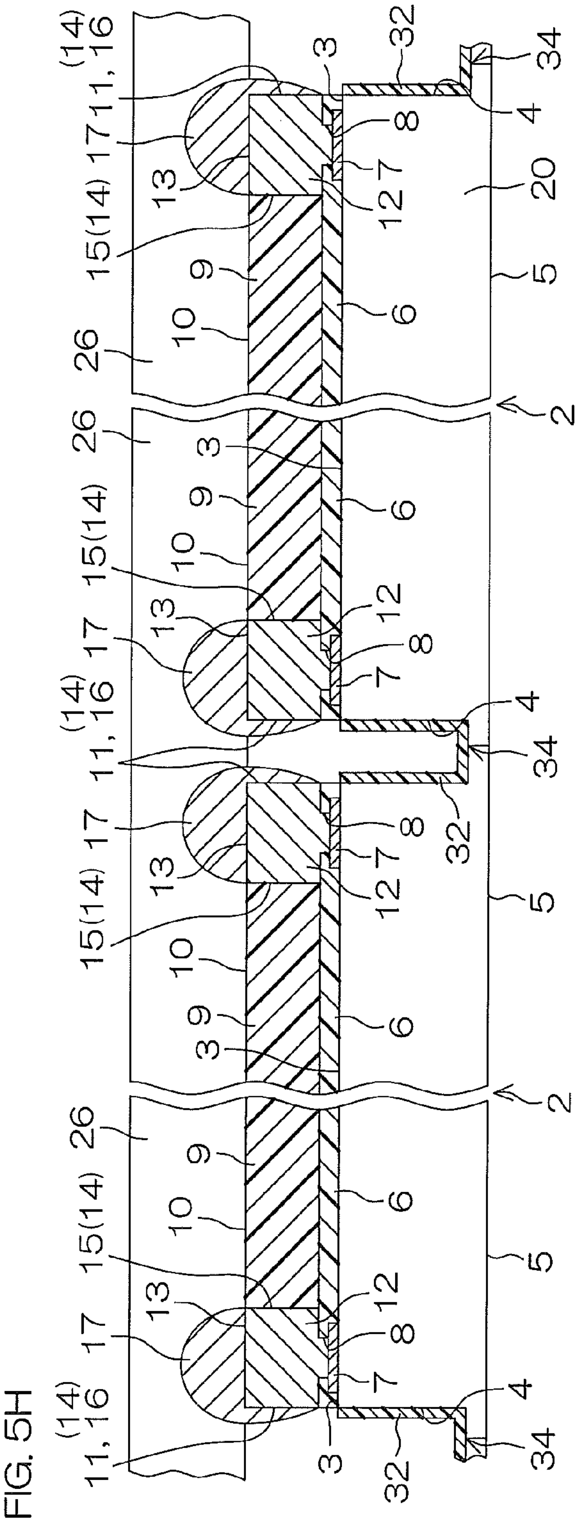
FIG. 5H A schematic sectional view showing a step subsequent to FIG. 5G.
Figure 5:
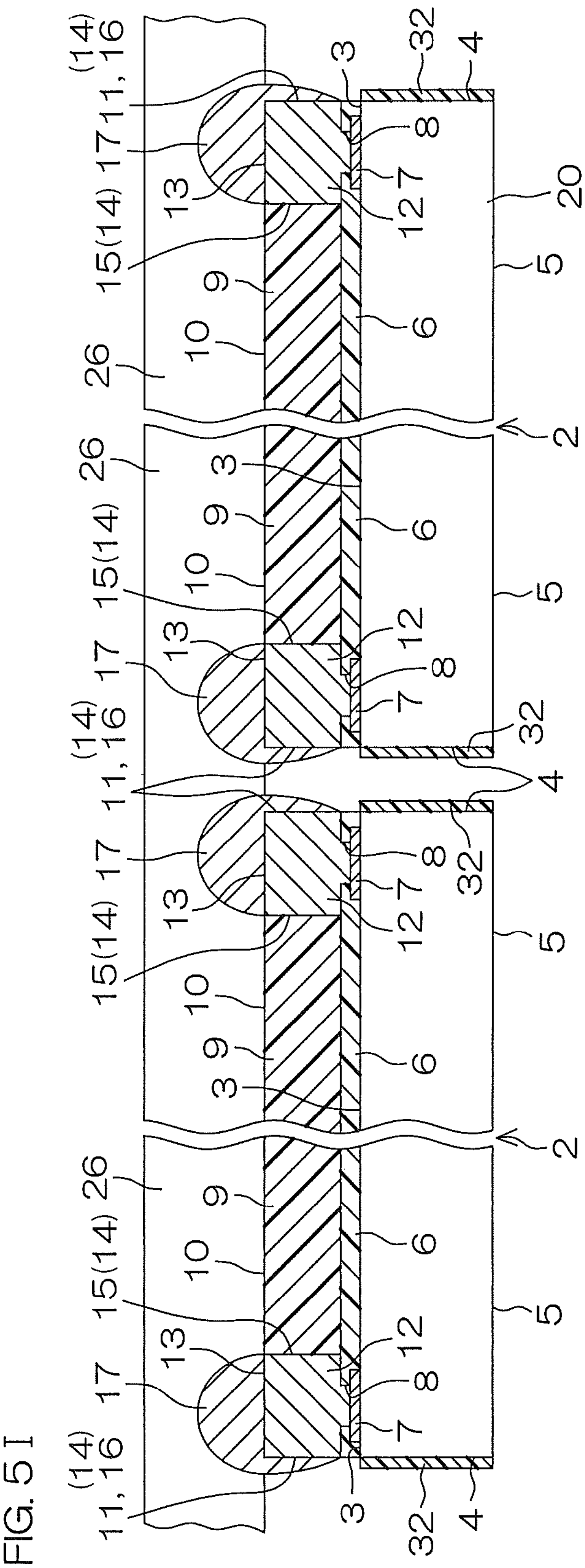
FIG. 5I A schematic sectional view showing a step subsequent to FIG. 5H.
FIG. 5J A schematic sectional view showing a step subsequent to FIG. M.

Then, the solder balls 17 are arranged on an adhesive surface of a dicing tape 26, and the wafer 20 is supported on the dicing tape 26, as shown in FIG. 5H.

Then, the semiconductor chip 2 (the wafer 20) is polished from the side of the rear surface 5 thereof. This polishing of the semiconductor chip 2 is performed until portions of the semiconductor chip 2 formed under the trenches 34 are completely removed and the inner sides of the trenches 34 and the side of the rear surface 5 of the semiconductor chip 2 communicate with one another, as shown in FIG. 5I. At this time, portions of the shielding films 32 applied to the bottom surfaces of the trenches 34 are removed.

Figure 5J:
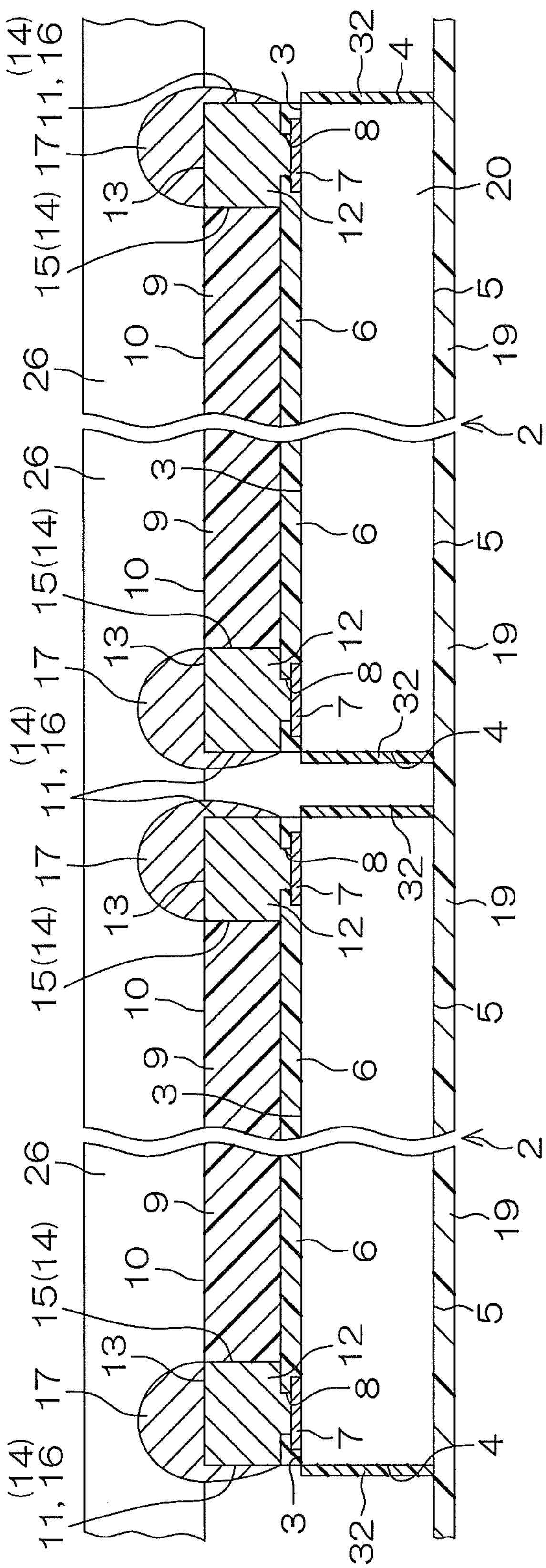

Thereafter a rear surface covering film 19 is formed on the whole area of the rear surface 5 of the semiconductor chip 2 (the wafer 20), as shown in FIG. 5J. The rear surface covering film 19 can be formed by coating (spin-coating) the whole area of the rear surface 5 of the wafer 20 with a resin material and hardening the resin material, for example. The rear surface covering film 19 can also be formed by sticking a resin film formed in a filmlike manner to the whole area of the rear surface 5 of the wafer 20.

Then, the rear surface covering film 19 is cut on the dicing lines with dicing blades (not shown), and the wafer 20 is singulated into each semiconductor chip 2. When the dicing tape 26 is thereafter removed, the semiconductor device 31 shown in FIG. 4 is obtained.

Also in the structure of the semiconductor device 31 obtained in this manner, effects similar to those of the structure of the semiconductor device 1 shown in FIG. 2 can be attained.

Third Embodiment

Figure 6:
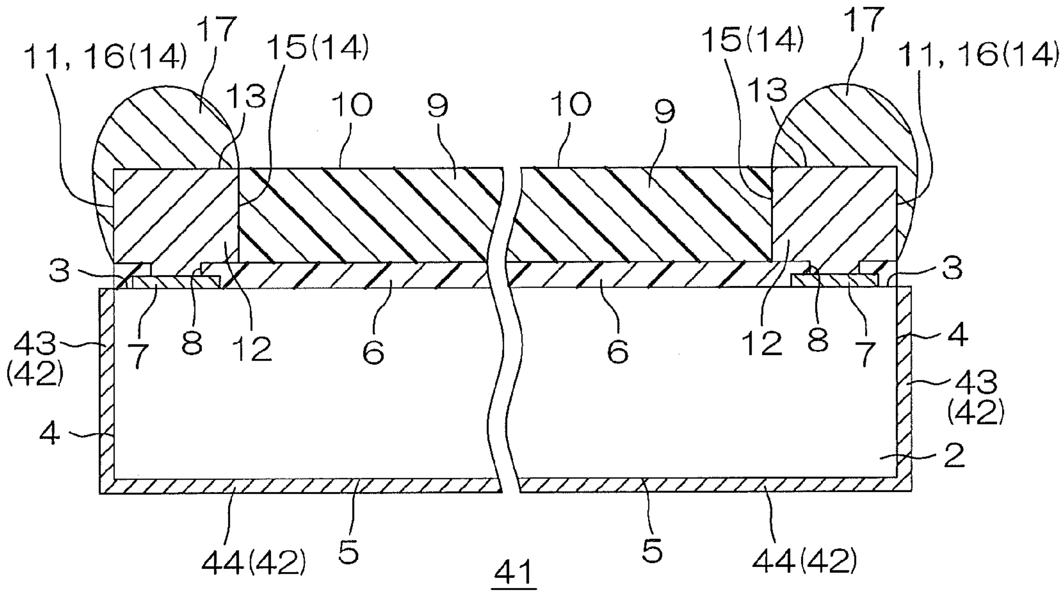
FIG. 6 A schematic sectional view of a semiconductor device according to a third embodiment of the present invention, showing a section taken along the same cutting plane line as the section of the semiconductor device of FIG. 2.

FIG. 6 is a schematic sectional view of a semiconductor device according to a third embodiment of the present invention, showing a section taken along the same cutting plane line as the section of the semiconductor device of FIG. 2. Referring to FIG. 6, portions corresponding to the respective parts of the portions shown in FIG. 2 are denoted by the same reference numerals as the reference numerals assigned to the respective parts. In the following, description as to the portions denoted by the same reference numerals is omitted.

In the semiconductor device 1 shown in FIG. 2, it has been assumed that the shielding films 18 made of the metallic material and the rear surface covering film 19 made of the resin material are separately formed. In a semiconductor device 41 shown in FIG. 6, on the other hand, the whole areas of side surfaces 4 and a rear surface 5 of a semiconductor chip 2 are covered with a protective film 42. In other words, the protective film 42 integrally includes shielding films 43 covering the whole areas of the side surfaces 4 of the semiconductor chip 2 and a rear surface covering film 44 covering the whole area of the rear surface 5 of the semiconductor chip 2. The protective film 42 is made of a metallic material having shielding properties against infrared rays. As metallic materials having shielding properties against infrared rays, Pd, Ni, Ti, Cr and TiW etc. can be illustrated, for example. The thickness of portions of the protective film 42 forming the shielding films 43 is not less than 0.1 μm and not more than 10 μm, for example. The thickness of a portion of the protective film 42 forming the rear surface covering film 44 is not less than 5 μm and not more than 50 μm, for example.

FIGS. 7A to 7L are schematic sectional views showing a method for manufacturing the semiconductor device shown in FIG. 6 in step order. Referring to FIGS. 7A to 7L, portions corresponding to the respective parts of the portions shown in FIGS. 3A to 3L are denoted by the same reference numerals as the reference numerals assigned to the respective parts.

Manufacturing of the semiconductor device 41 is progressed in a state of a wafer 20 before the semiconductor chip 2 is cut into an individual piece. A passivation film 6 is formed on a front surface of the semiconductor chip 2 (the wafer 20).

Figure 7A:
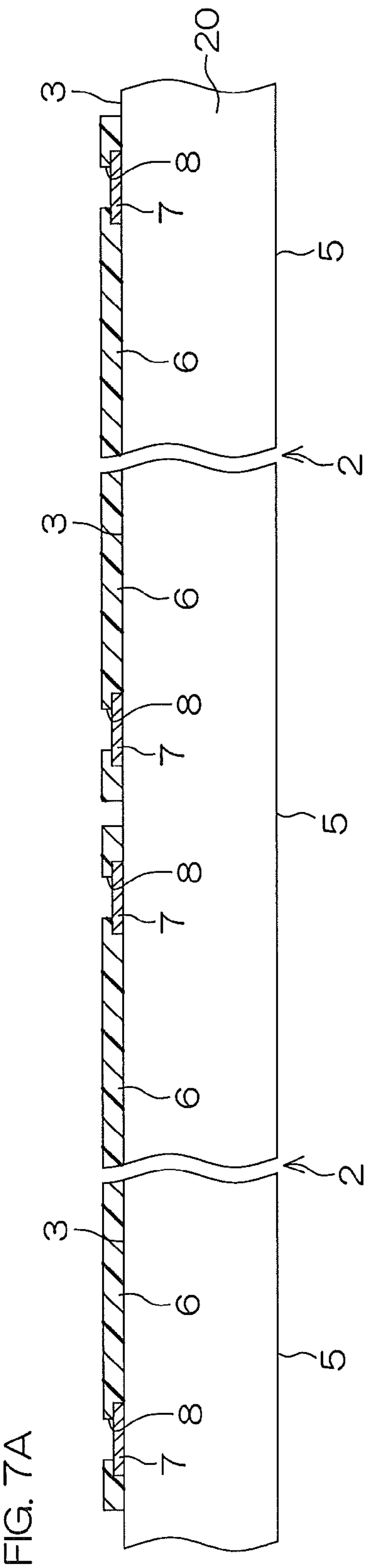
FIG. 7A A schematic sectional view showing a state in the process of manufacturing the semiconductor device shown in FIG. 6.

First, a plurality of pad openings 8 are formed in the passivation film 6 by photolithography and etching, as shown in FIG. 7A.

Figure 7B:
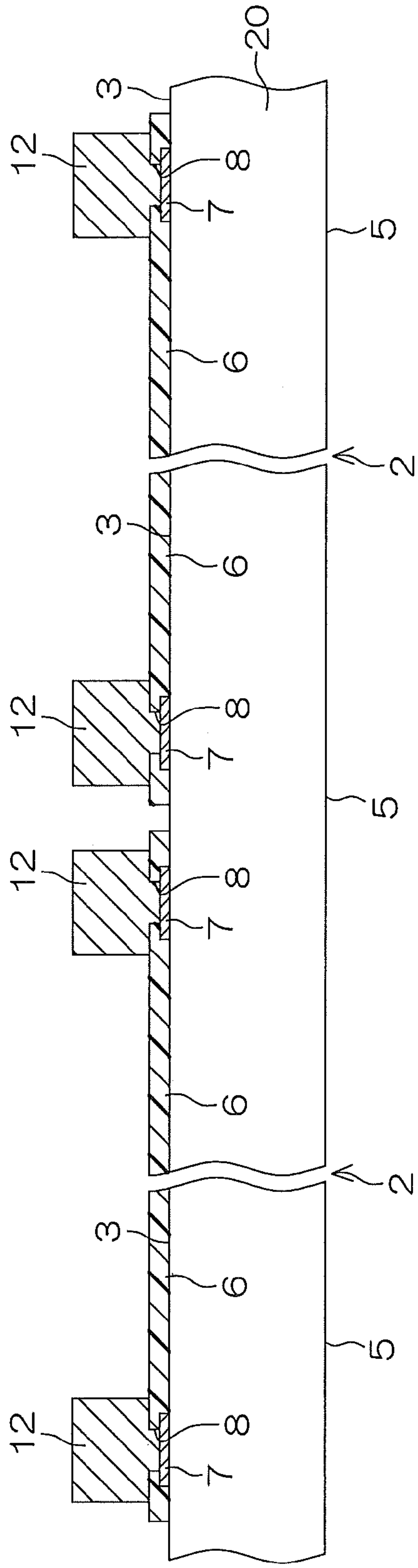
FIG. 7B A schematic sectional view showing a step subsequent to FIG. 7A.

Then, pillarlike posts 12 are formed on the respective electrode pads 7, as shown in FIG. 7B. The posts 12 can be formed by forming a mask having openings corresponding to portions where the posts 12 are formed on the passivation film 6, thereafter growing copper which is the material for the posts 12 in the openings of the mask by plating, and thereafter removing the mask, for example. The posts 12 can also be formed by forming a copper film (not shown) on the passivation film 6 and the electrode pads 7 by plating and thereafter selectively removing the copper film by photolithography and etching.

Figure 7C:
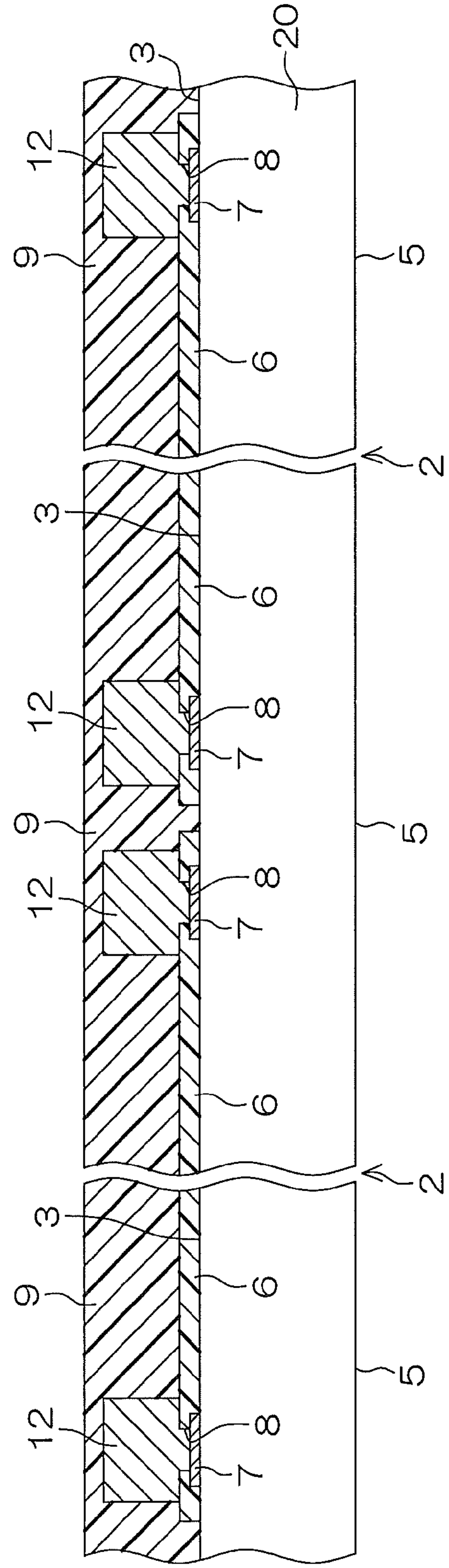
FIG. 7C A schematic sectional view showing a step subsequent to FIG. 7B.

Then, liquid resin (epoxy resin, for example) which is the material for a sealing resin layer 9 is supplied onto the passivation film 6, as shown in FIG. 7C. The liquid resin is supplied up to such a height that the same buries the posts 12 therein (such a height that the same completely covers the posts 12). Then, a treatment for hardening the resin is performed, whereby the sealing resin layer 9 is formed on the passivation film 6.

Figure 7D:
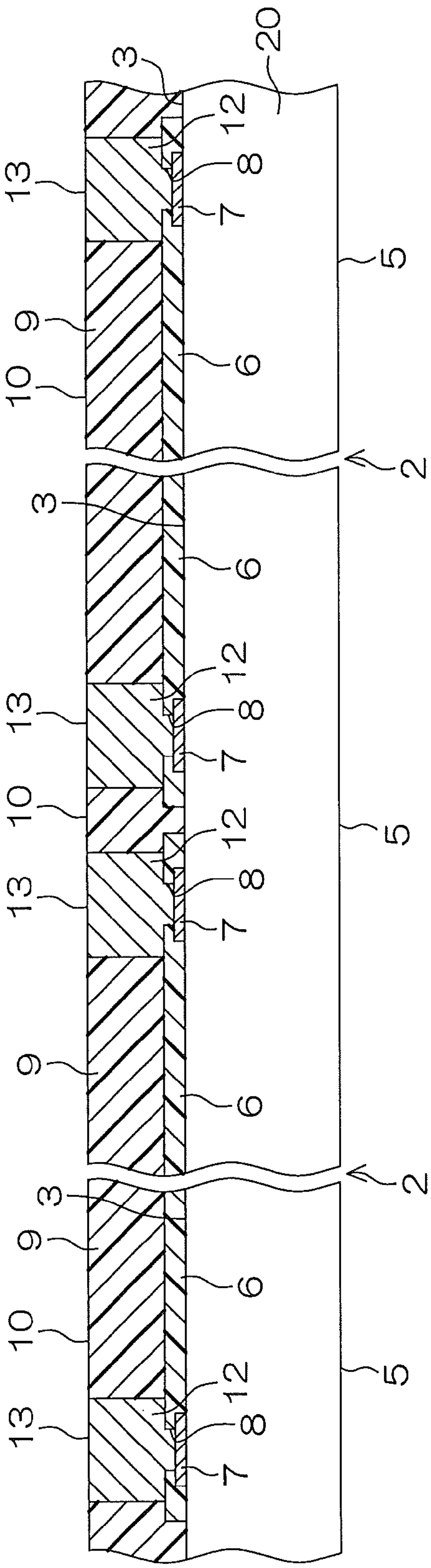
FIG. 7D A schematic sectional view showing a step subsequent to FIG. 7C.

Thereafter the sealing resin layer 9 is polished from the side of a front surface thereof. This polishing of the sealing resin layer 9 is continued until forward end surfaces 13 of the posts 12 are exposed from the front surface 10 of the sealing resin layer 9. As a result of this polishing, the forward end surfaces 13 of the posts 12 flush with the front surface 10 of the sealing resin layer 9 are obtained, as shown in FIG. 7D.

Figure 7E:
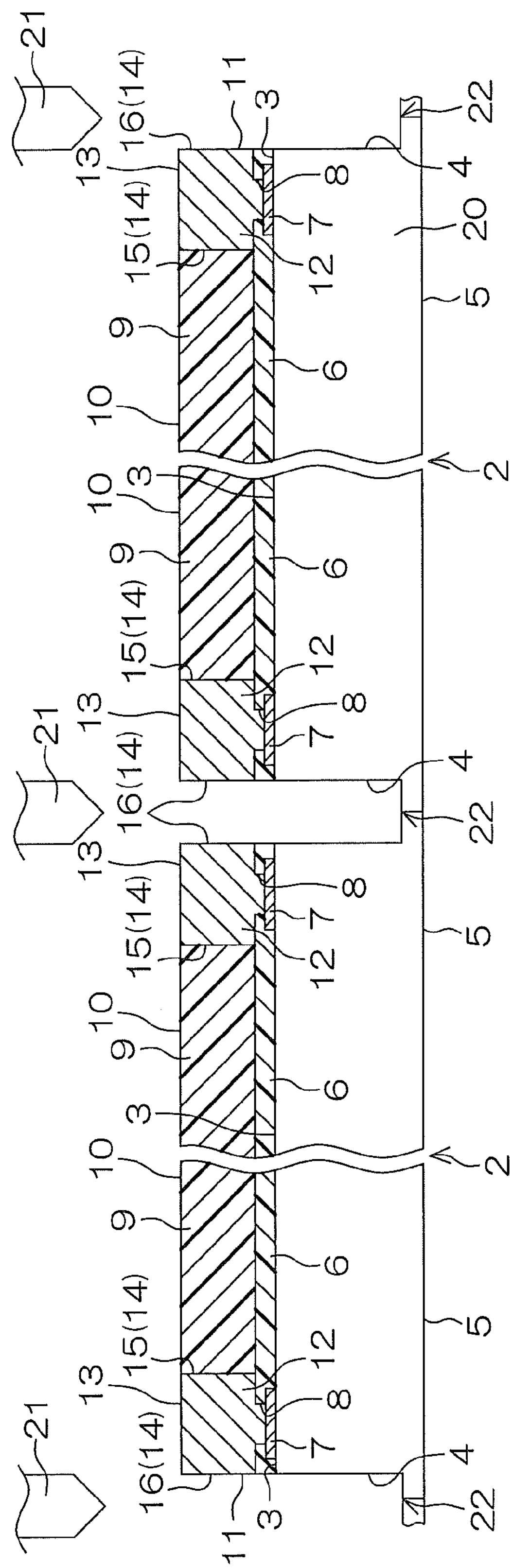
FIG. 7E A schematic sectional view showing a step subsequent to FIG. 7D.

Then, dicing blades 21 are advanced from the side of the front surface of the semiconductor chip 2, whereby trenches 22 dug down from the front surface of the sealing resin layer 9 are formed on dicing lines set along peripheral edges of each semiconductor chip 2, as shown in FIG. 7E. The trenches 22 pass through the sealing resin layer 9 and the passivation film 6, and are dug down to such a depth that bottom surfaces thereof reach positions in the vicinity of the rear surface 5 of the semiconductor chip 2. Further, the trenches 22 are so formed that the width between side surfaces thereof is constant in the depth direction thereof. Thus, side surfaces 16 of the respective posts 12 and side surfaces 4 of the semiconductor chip 2 are exposed as parts of inner surfaces (side surfaces) of the trenches 22.

Figure 7F:
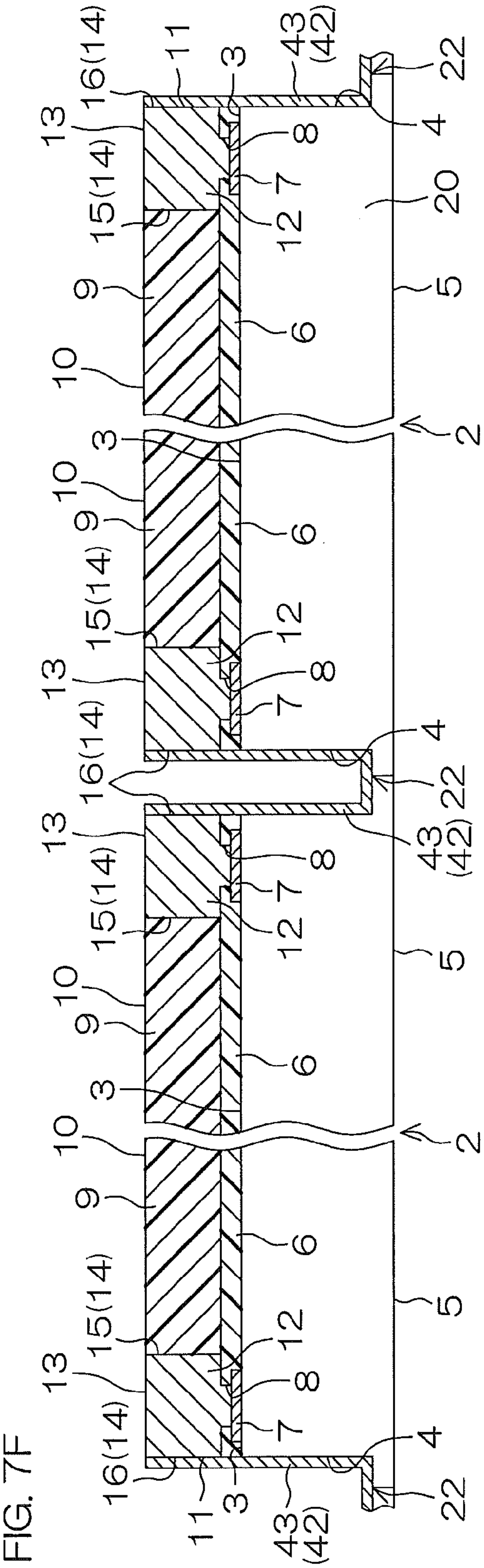
FIG. 7F A schematic sectional view showing a step subsequent to FIG. 7E.

Thereafter the shielding films 43 are applied to the whole areas of the inner surfaces of the trenches 22, as shown in FIG. 7F. The shielding films 43 may be formed by evaporating a metal consisting of the material for the shielding films 43 onto the inner surfaces of the trenches 22, or may be formed by electroless plating, for example.

Figure 7G:
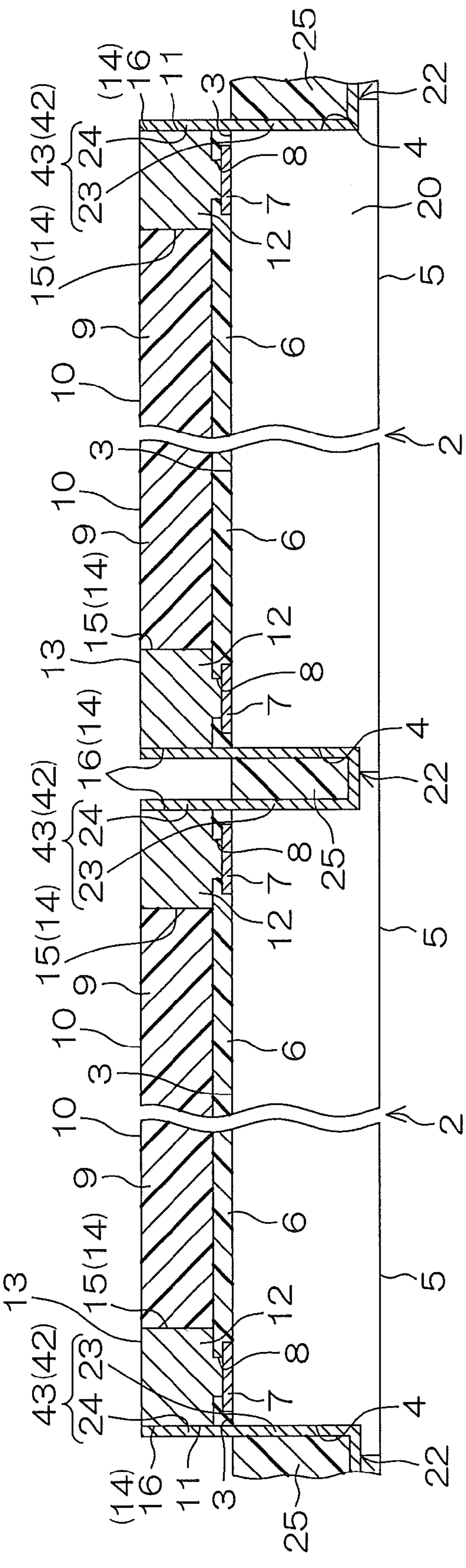
FIG. 7G A schematic sectional view showing a step subsequent to FIG. 7F.

After the formation of the shielding films 43, the same liquid resin (epoxy resin, for example) as the material for the sealing resin layer 9 is supplied into the trenches 22, as shown in FIG. 7G. This liquid resin has an etching selection ratio with respect to the shielding films 43, and is supplied up to such a height that a front surface thereof is flush with a front surface 3 of the semiconductor chip 2. Thus, protective layers 25 made of the liquid resin and embedded in the trenches 22 are formed. The protective layers 25 cover first portions 23 of the shielding films 43 on the side surfaces 4 of the semiconductor chip 2, and expose second portions 24 of the shielding films 43 on the side surfaces 16 of the posts 12 (do not cover the second portions 24). Then, an etchant (etching solution or etching gas) capable of etching the shielding films 43 at a higher etching rate as compared with the protective layers 25 is supplied, in the state covering the first portions 23 of the shielding films 43 with the protective layers 25.

Figure 7H:
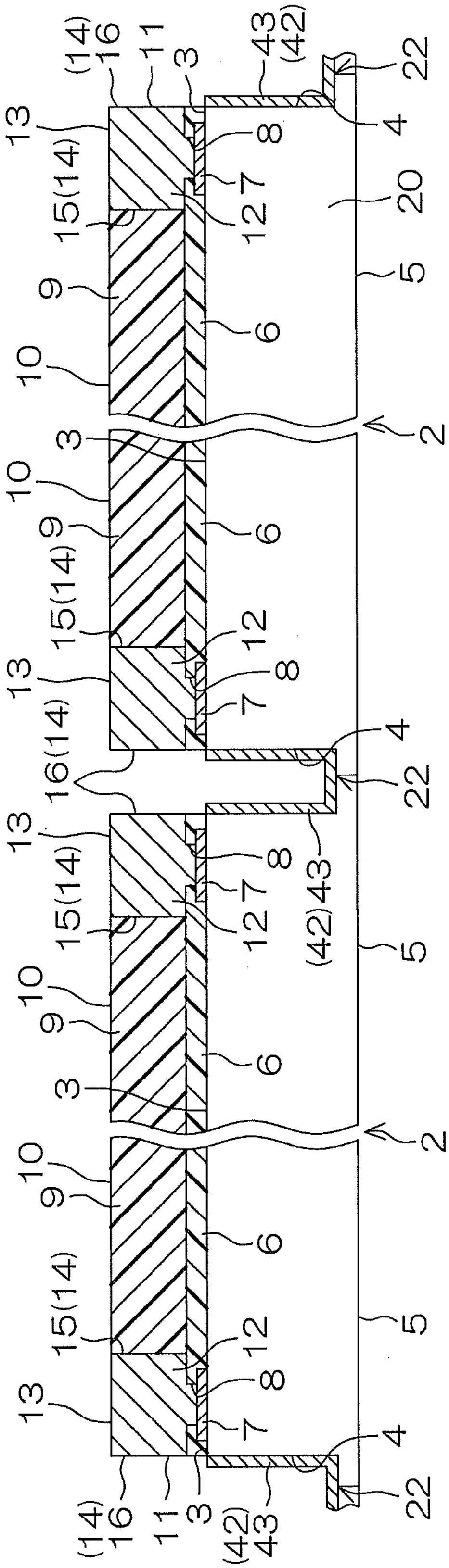
FIG. 7H A schematic sectional view showing a step subsequent to FIG. 7G.
Figure 7:
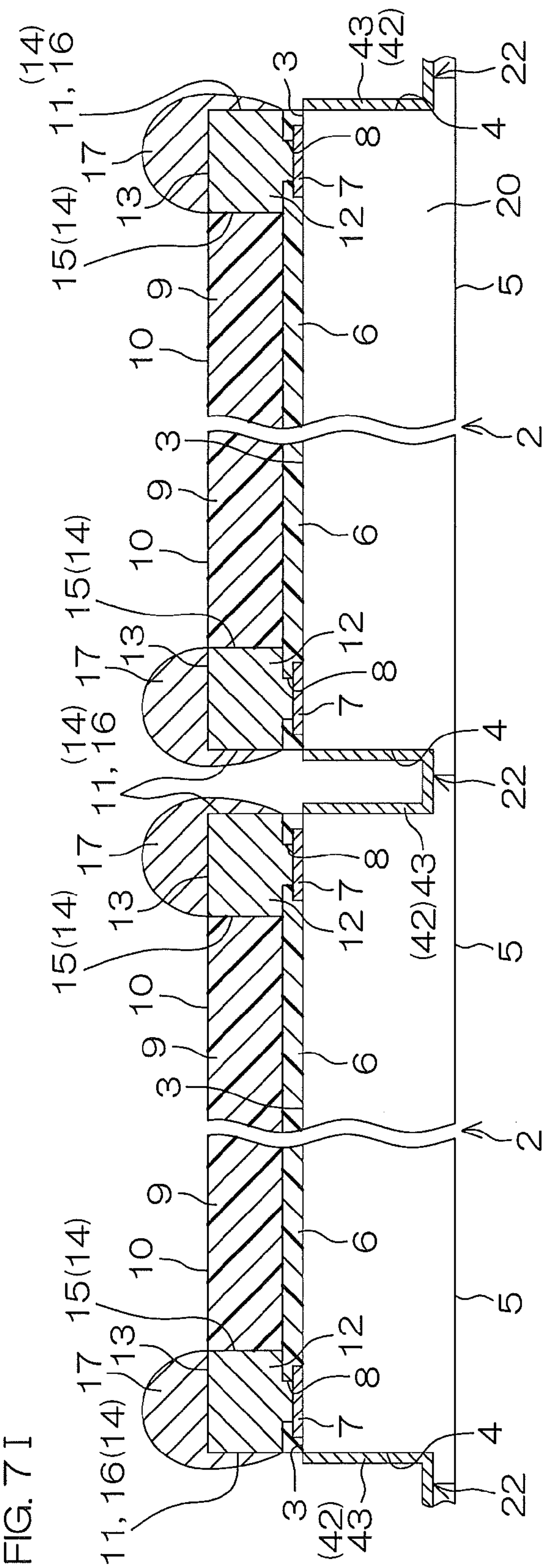
FIG. 7I A schematic sectional view showing a step subsequent to FIG. 7H.
FIG. 7J A schematic sectional view showing a step subsequent to FIG. 7I.
FIG. 7K A schematic sectional view showing a step subsequent to FIG. 7J.
FIG. 7L A schematic sectional view showing a step subsequent to FIG. 7K.

Thus, the second portions 24 of the shielding films 43 not covered with the protective layers 25 are selectively removed, while the first portions 23 of the shielding films 43 covered with the protective layers 25 remain in the trenches 22, as shown in FIG. 7H. Thereafter the protective layers 25 are removed.

Then, the solder balls 17 are arranged on the forward end surfaces 13 of the posts 12, as shown in FIG. 7I. The solder balls 17 spread up to the side surfaces 16 of the posts 12, due to wettability thereof. Thus, the forward end surfaces 13 and the side surfaces 16 of the posts 12 are covered with the solder balls 17.

Figure 7J:
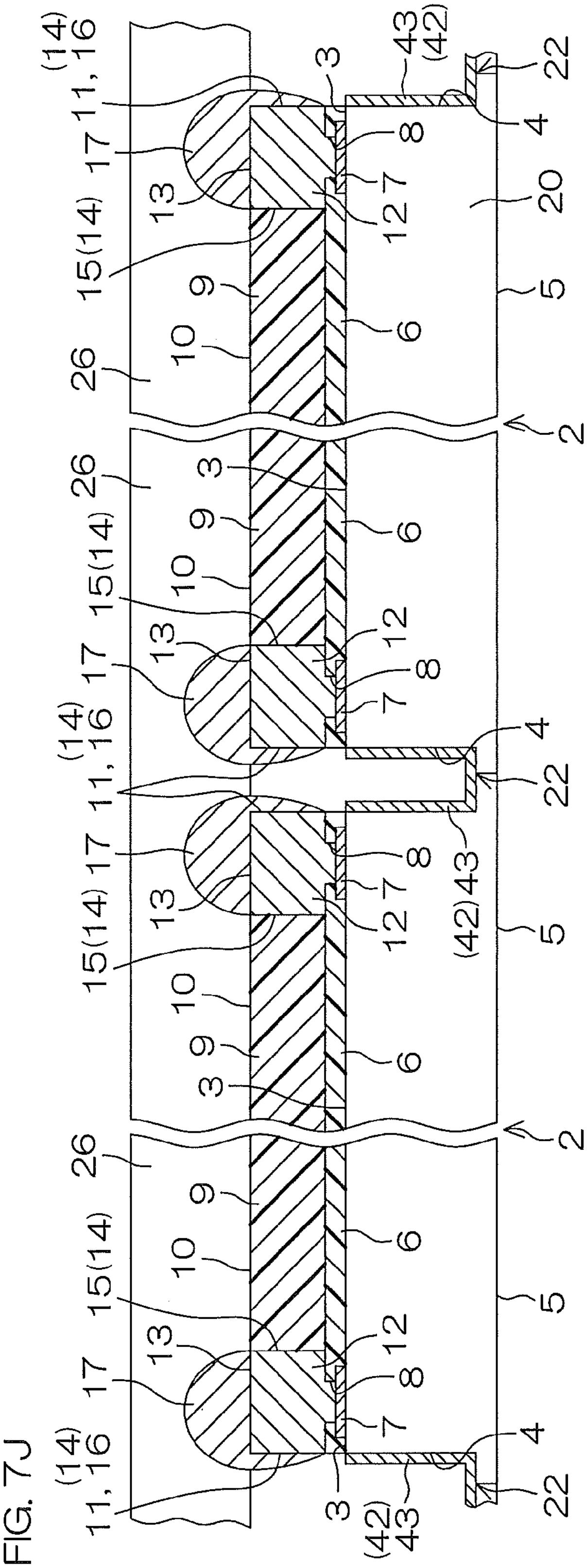

Then, the solder balls 17 are arranged on an adhesive surface of a dicing tape 26, and the wafer 20 is supported on the dicing tape 26, as shown in FIG. 7J.

Figure 7K:
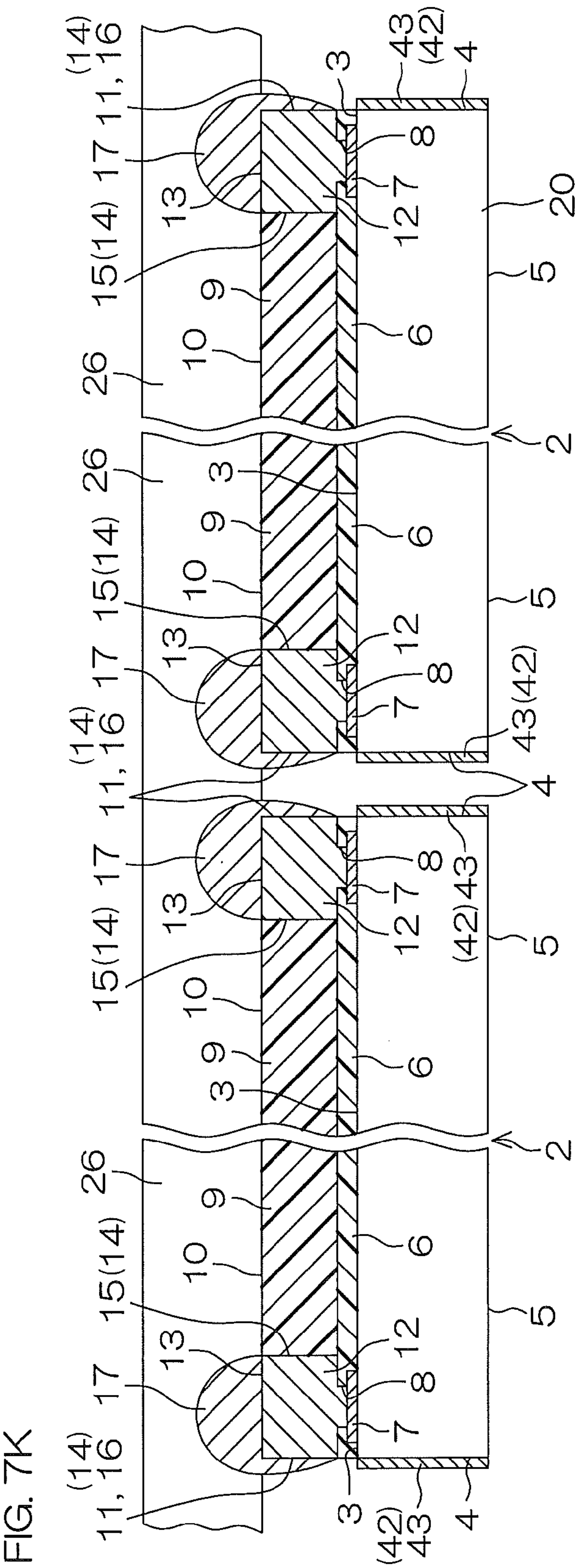
Figure 7L:
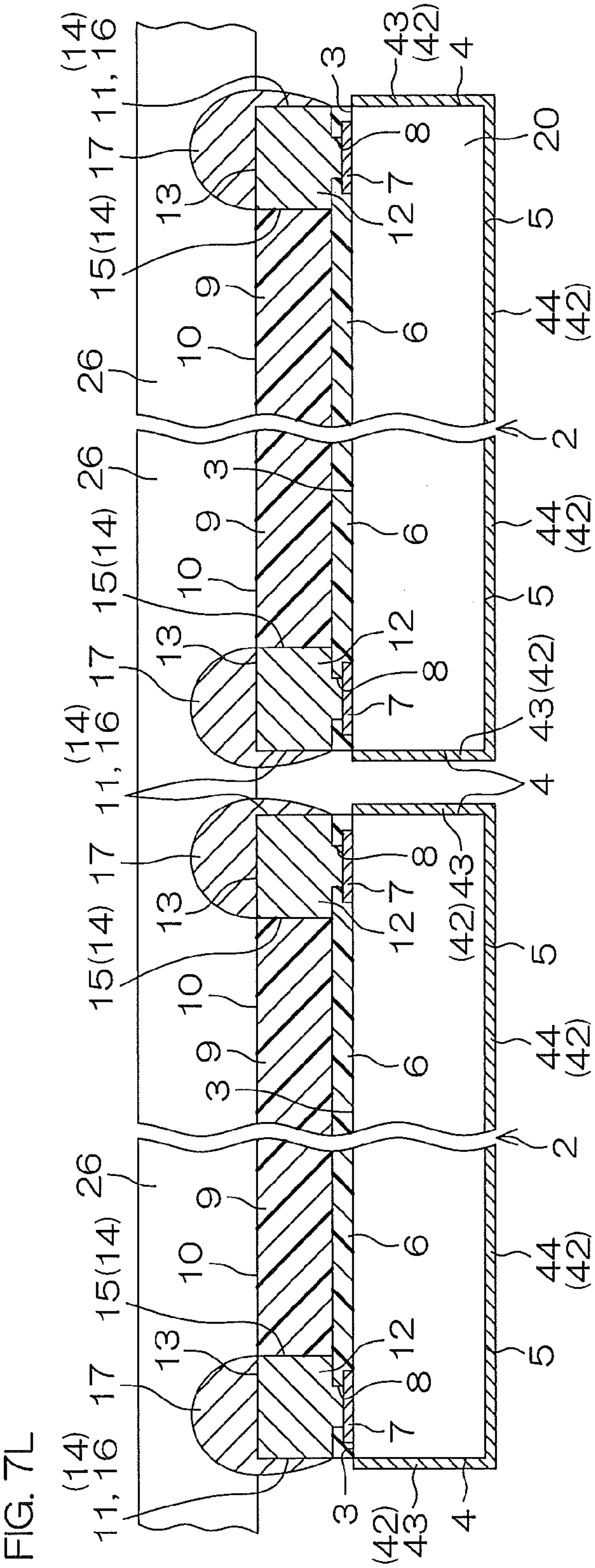

Then, the semiconductor chip 2 (the wafer 20) is polished from the side of the rear surface 5 thereof. This polishing of the semiconductor chip 2 is performed until portions of the semiconductor chip 2 formed under the trenches 22 are completely removed and inner sides of the trenches 22 and the side of the rear surface 5 of the semiconductor chip 2 communicate with one another, as shown in FIG. 7K. At this time, portions of the shielding films 43 applied to the bottom surfaces of the trenches 22 are removed.

Thereafter the rear surface covering film 44 is applied to the whole area of the rear surface 5 of the semiconductor chip 2 (the wafer 20) every semiconductor chip 2, as shown in FIG.

7L. The rear surface covering film 44 may be formed by evaporating a metal consisting of the material for the protective films 42 onto the rear surface 5 of the semiconductor chip 2, or may be formed by electroless plating, for example.

When the dicing tape 26 is detached, the semiconductor device 41 shown in FIG. 6 is obtained.

Also in this structure of the semiconductor device 41, effects similar to those of the structure of the semiconductor device 1 shown in FIG. 2 can be attained.

Fourth Embodiment

Figure 8:
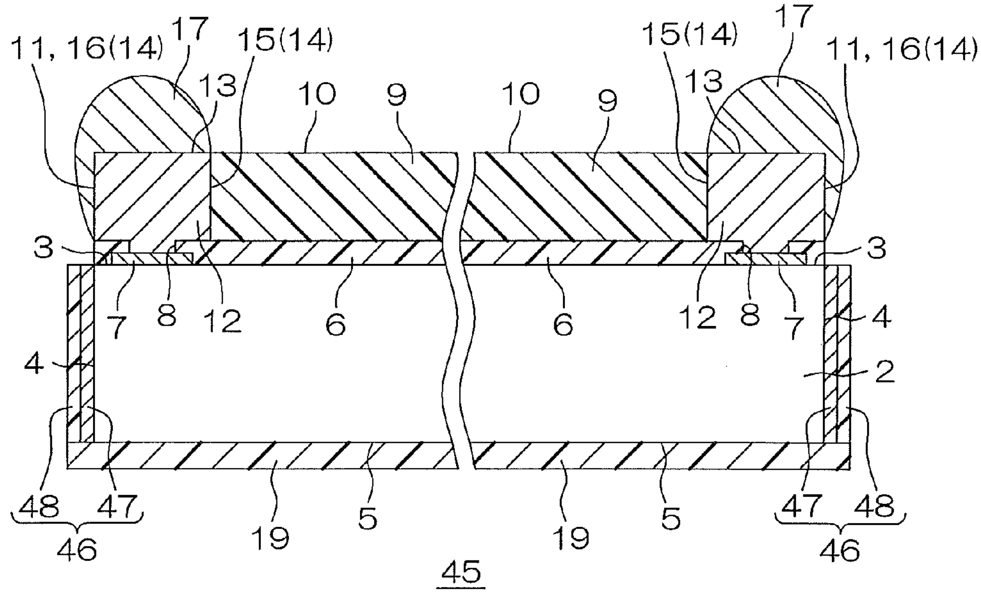
FIG. 8 A schematic sectional view of a semiconductor device according to a fourth embodiment of the present invention, showing a section taken along the same cutting plane line as the section of the semiconductor device of FIG. 2.

FIG. 8 is a schematic sectional view of a semiconductor device according to a fourth embodiment of the present invention, showing a section taken along the same cutting plane line as the section of the semiconductor device of FIG. 2. Referring to FIG. 8, portions corresponding to the respective parts of the portions shown in FIG. 2 are denoted by the same reference numerals as the reference numerals assigned to the respective parts. In the following, description as to the portions denoted by the same reference numerals is omitted.

In a semiconductor device 45, shielding films 46 covering side surfaces 4 of a semiconductor chip 2 have multilayer structures of metal layers 47 and resin layers 48. The metal layers 47 are made of Pd, Ni, Ti, Cr or TiW, for example. The resin layers 48 are made of a resin material such as epoxy resin, polyamide imide, polyamide, polyimide or phenol, for example.

FIGS. 9A to 9M are schematic sectional views showing a method for manufacturing the semiconductor device shown in FIG. 8 in step order. Referring to FIGS. 9A to 9M, portions corresponding to the respective parts of the portions shown in FIGS. 3A to 3L are denoted by the same reference numerals as the reference numerals assigned to the respective parts.

Manufacturing of the semiconductor device 45 is progressed in a state of a wafer 20 before the semiconductor chip 2 is cut into an individual piece. A passivation film 6 is formed on a front surface of the semiconductor chip 2 (the wafer 20).

Figure 9A:
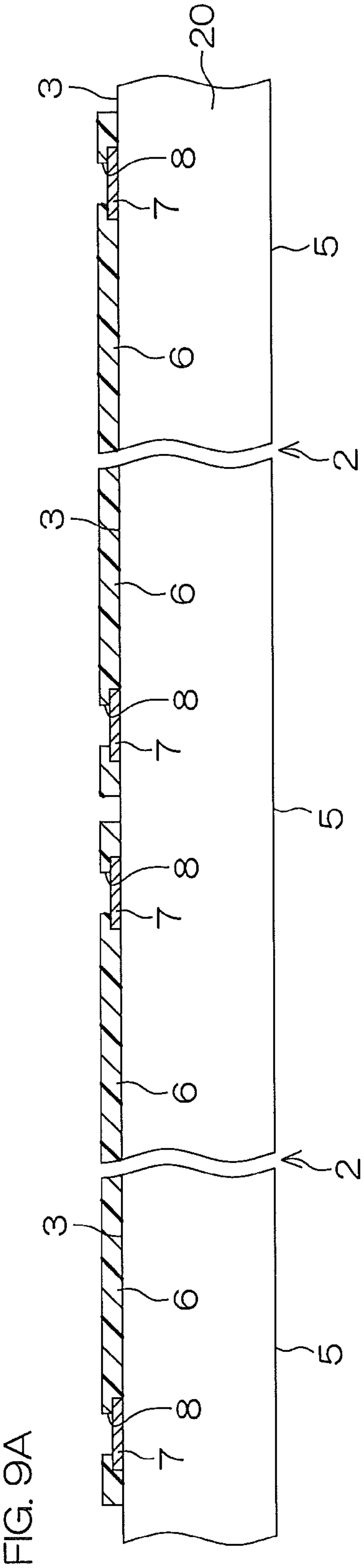
FIG. 9A A schematic sectional view showing a state in the process of manufacturing the semiconductor device shown in FIG. 8.

First, a plurality of pad openings 8 are formed in the passivation film 6 by photolithography and etching, as shown in FIG. 9A.

Figure 9B:
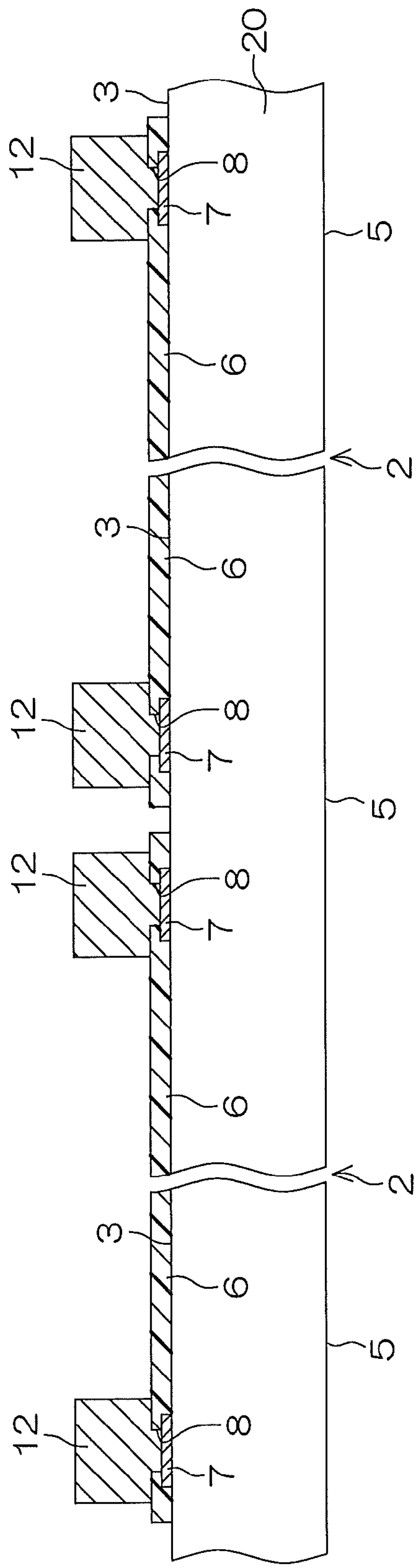
FIG. 9B A schematic sectional view showing a step subsequent to FIG. 9A.

Then, pillarlike posts 12 are formed on the respective electrode pads 7, as shown in FIG. 9B. The posts 12 can be formed by forming a mask having openings corresponding to portions where the posts 12 are formed on the passivation film 6, thereafter growing copper which is the material for the posts 12 in the openings of the mask by plating, and thereafter removing the mask, for example. The posts 12 can also be formed by forming a copper film (not shown) on the passivation film 6 and the electrode pads 7 by plating and thereafter selectively removing the copper film by photolithography and etching.

Figure 9C:
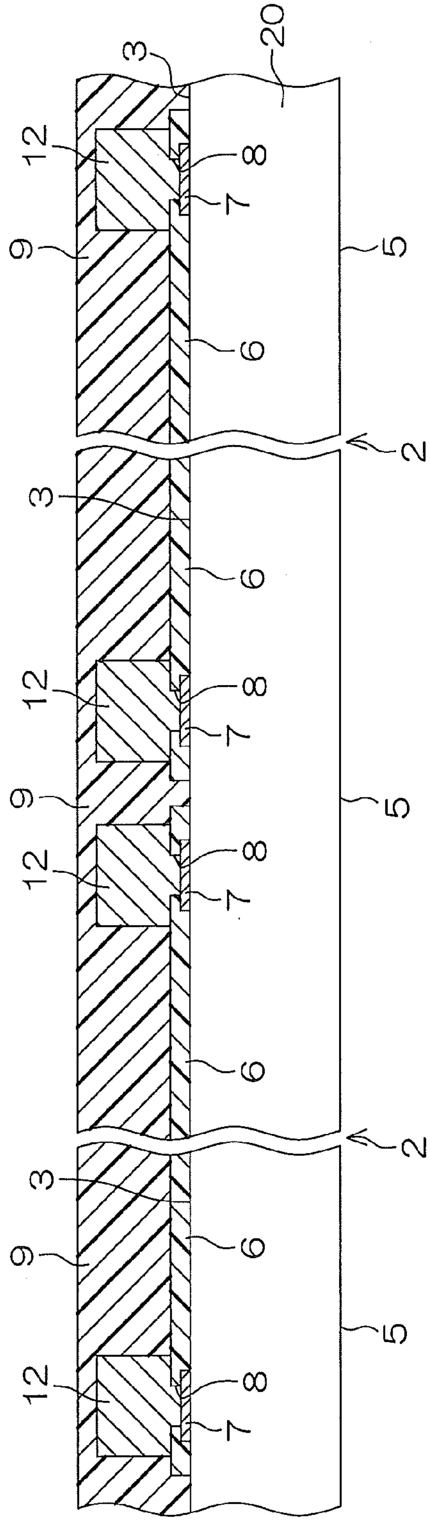
FIG. 9C A schematic sectional view showing a step subsequent to FIG. 9B.

Then, liquid resin (epoxy resin, for example) which is the material for a sealing resin layer 9 is supplied onto the passivation film 6, as shown in FIG. 9C. The liquid resin is supplied up to such a height that the same buries the posts 12 therein (such a height that the same completely covers the posts 12). Then, a treatment for hardening the resin is performed, whereby the sealing resin layer 9 is formed on the passivation film 6.

Figure 9D:
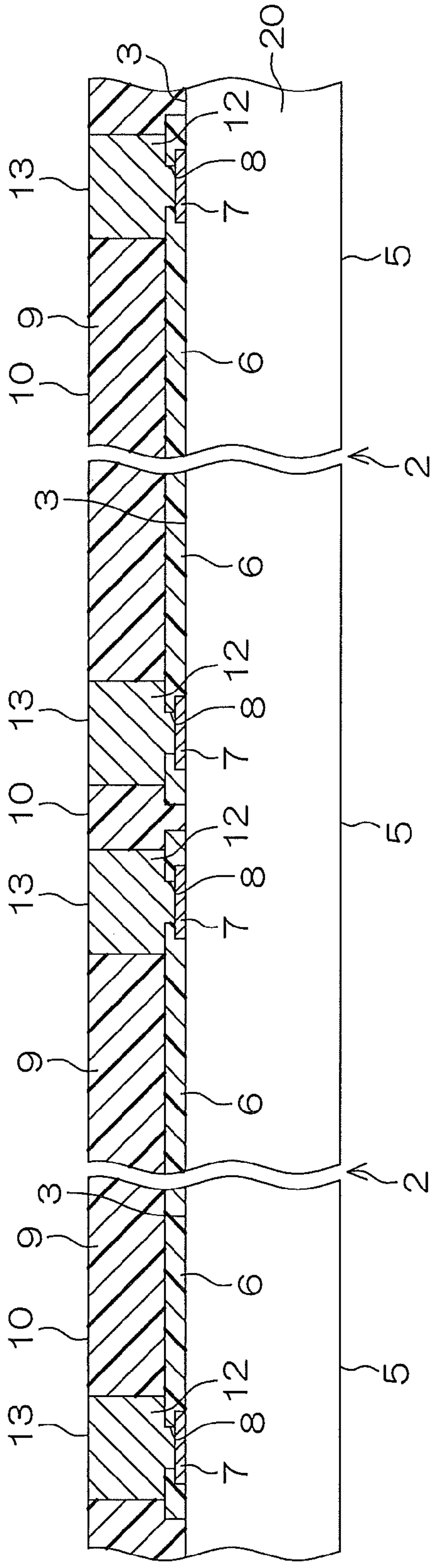
FIG. 9D A schematic sectional view showing a step subsequent to FIG. 9C.

Thereafter the sealing resin layer 9 is polished from the side of a front surface thereof. This polishing of the sealing resin layer 9 is continued until forward end surfaces 13 of the posts 12 are exposed from the front surface 10 of the sealing resin layer 9. As a result of this polishing, the forward end surfaces 13 of the posts 12 flush with the front surface 10 of the sealing resin layer 9 are obtained, as shown in FIG. 9D.

Figure 9E:
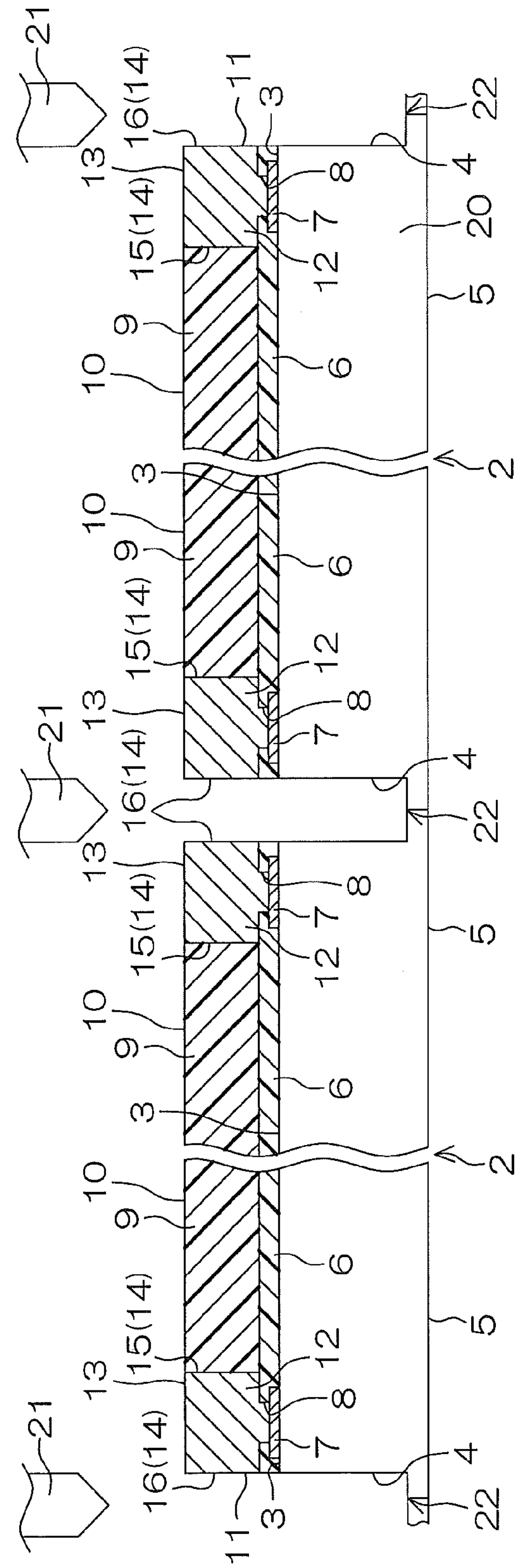
FIG. 9E A schematic sectional view showing a step subsequent to FIG. 9D.

Then, dicing blades 21 are advanced from the side of the front surface of the semiconductor chip 2, whereby trenches 22 dug down from the front surface of the sealing resin layer 9 are formed on dicing lines set along peripheral edges of each semiconductor chip 2, as shown in FIG. 9E. The trenches 22 pass through the sealing resin layer 9 and the passivation film 6, and are dug down to such a depth that bottom surfaces thereof reach positions in the vicinity of a rear surface 5 of the semiconductor chip 2. Further, the trenches 22 are so formed that the width between side surfaces thereof is constant in the depth direction thereof. Thus, side surfaces 16 of the respective posts 12 and side surfaces 4 of the semiconductor chip 2 are exposed as parts of inner surfaces (side surfaces) of the trenches 22.

Figure 9F:
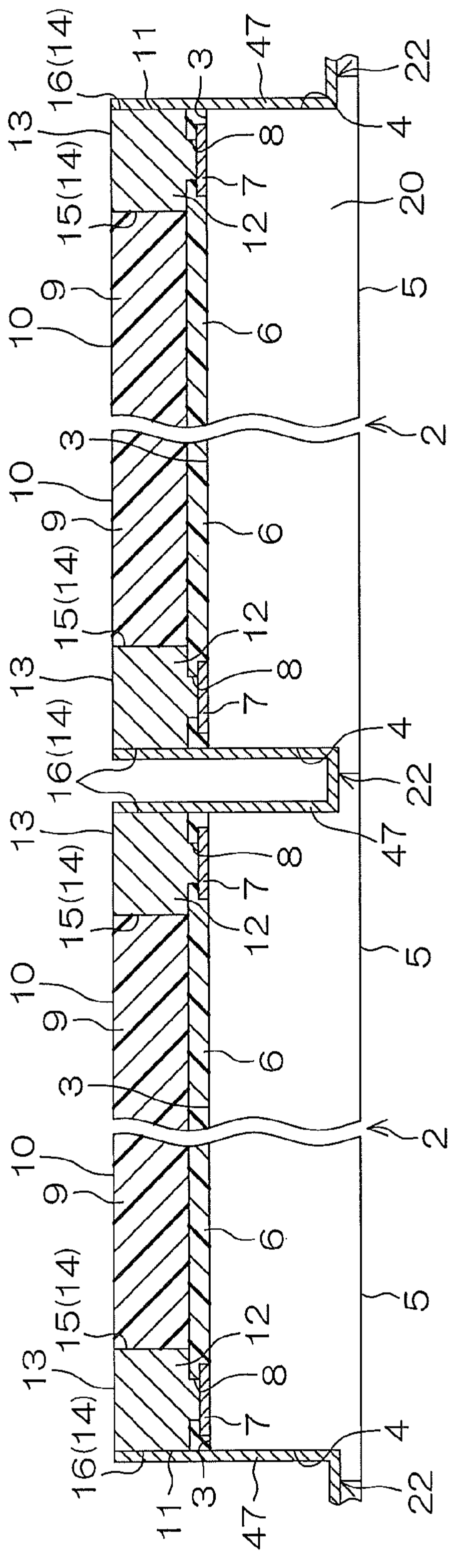
FIG. 9F A schematic sectional view showing a step subsequent to FIG. 9E.

Thereafter the metal layers 47 as first shielding films are applied to the whole areas of the inner surfaces of the trenches 22, as shown in FIG. 9F. The metal layers 47 may be formed by evaporating a metal consisting of the material for the metal layers 47 onto the inner surfaces of the trenches 22, or may be formed by electroless plating, for example.

Figure 9G:
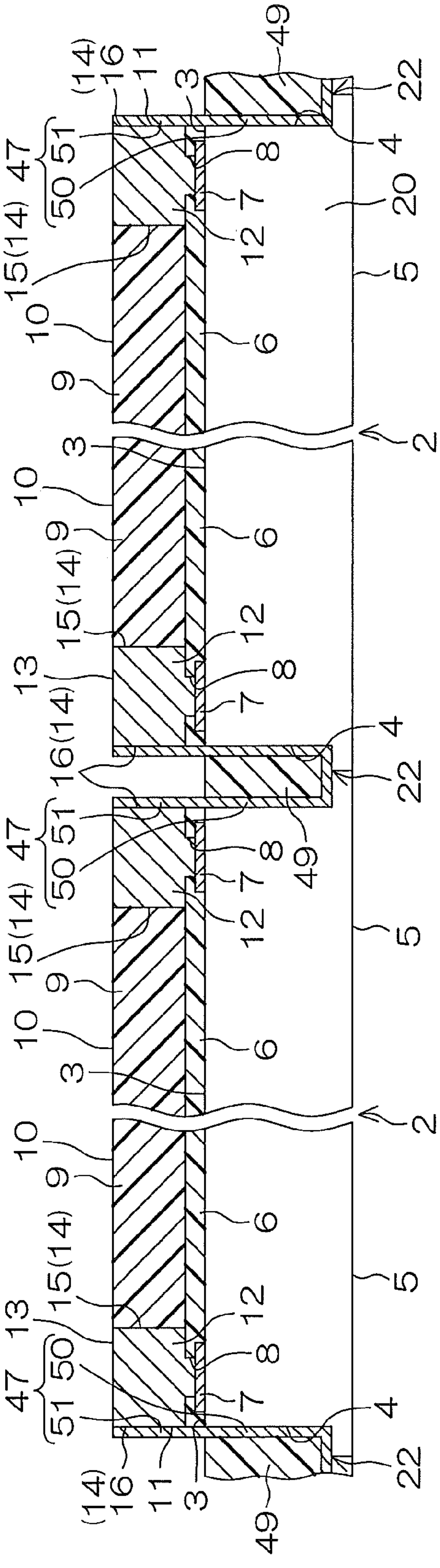
FIG. 9G A schematic sectional view showing a step subsequent to FIG. 9F.

After the formation of the metal layers 47, the same liquid resin (epoxy resin, for example) as the material for the sealing resin layer 9 is supplied into the trenches 22, as shown in FIG. 9G. This liquid resin has an etching selection ratio with respect to the metal layers 47, and is supplied up to such a height that a front surface thereof is flush with a front surface 3 of the semiconductor chip 2. Thus, the resin material layers 49 in which the liquid resin is embedded in the trenches 22 are formed. The resin material layers 49 cover first portions 50 of the metal layers 47 on the side surfaces 4 of the semiconductor chip 2, and expose second portions 51 of the metal layers 47 on the side surfaces 16 of the posts 12 (do not cover the second portions 51). Then, an etchant (etching solution or etching gas) capable of etching the metal layers 47 at a higher etching rate as compared with the resin material layers 49 is supplied, in the state covering the first portions 50 of the metal layers 47 with the resin material layers 47.

Figure 9H:
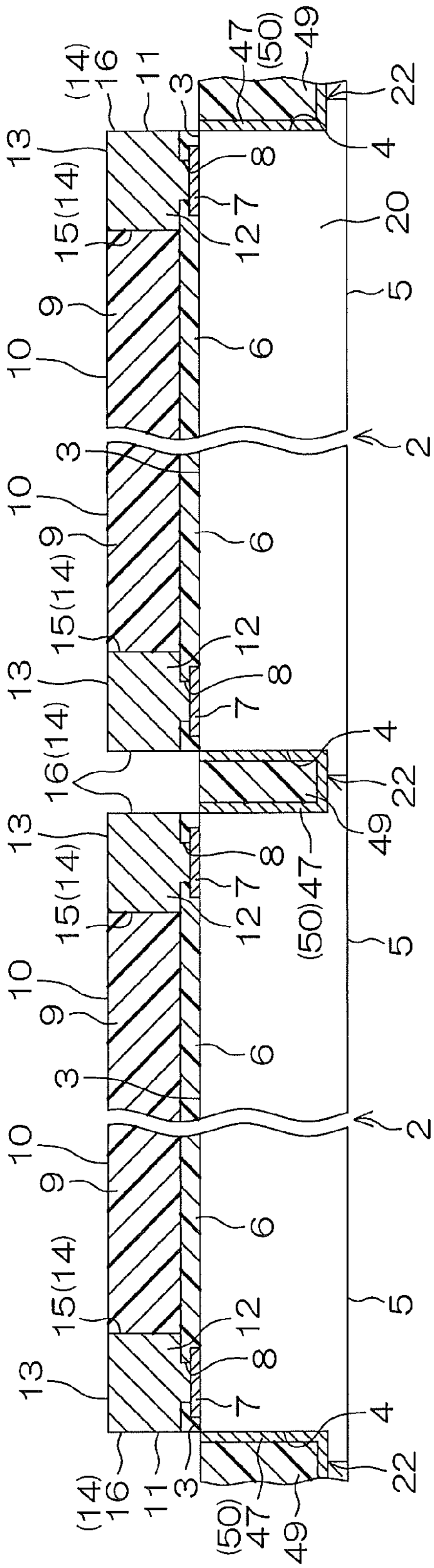
FIG. 9H A schematic sectional view showing a step subsequent to FIG. 9G.

Thus, the second portions 51 of the metal layers 47 not covered with the resin material layers 49 are selectively removed, while the first portions 50 of the metal layers 47 covered with the resin material layers 49 remain in the trenches 22, as shown in FIG. 9H.

Figure 9I:
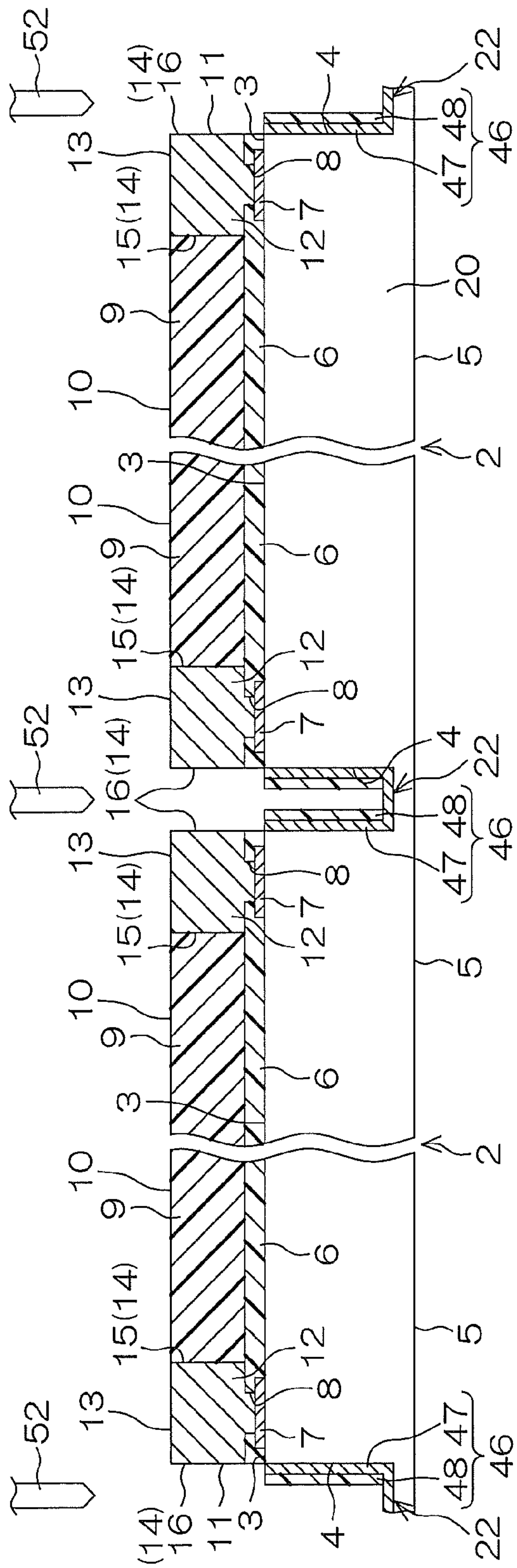
FIG. 9I A schematic sectional view showing a step subsequent to FIG. 9H.

Then, dicing blades 52 are advanced from the side of the front surface of the semiconductor chip 2, whereby central portions of the resin material layers 49 remaining in the trenches 22 are selectively removed, as shown in FIG. 9I. The dicing blades 52 have a smaller thickness than the dicing blades 21 employed for forming the trenches 22 in the step shown in FIG. 9E. Thus, the resin material layers 49 remain on the metal layers 47 in a filmlike manner, and the remaining portions become the resin layers 48 as second shielding films. Thus, the shielding films 46 having the multilayer structures of the metal layers 47 and the resin layers 48 are formed.

Figure 9J:
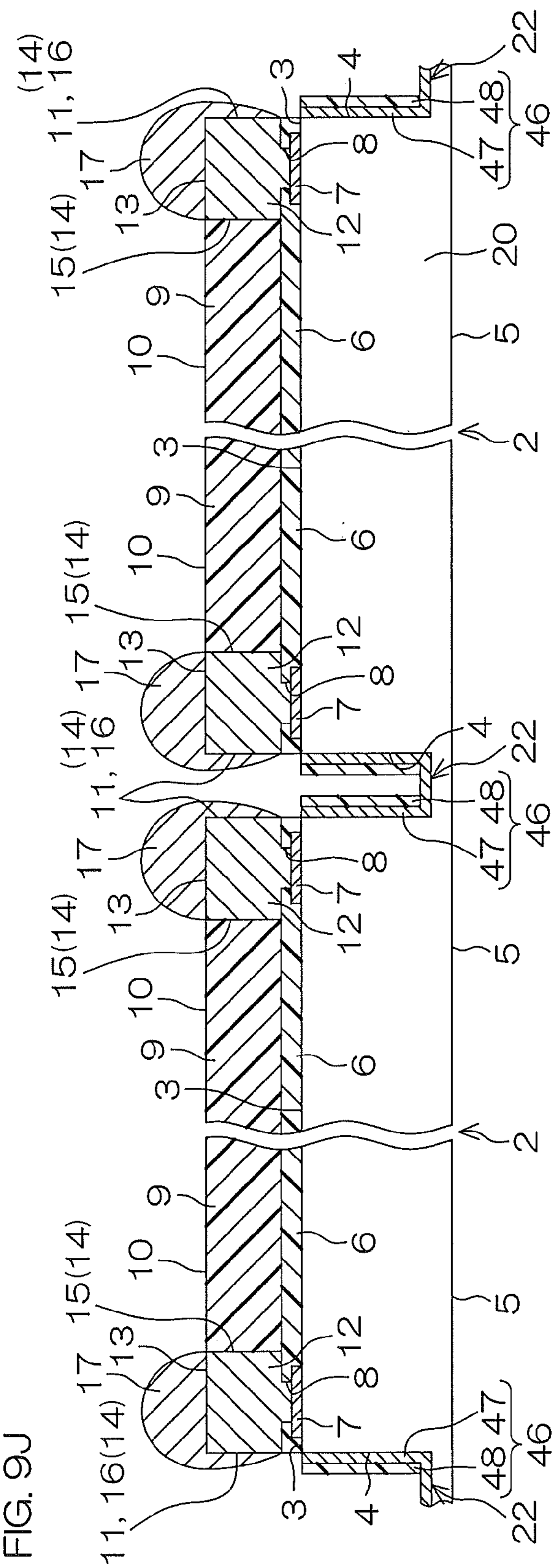
FIG. 9J A schematic sectional view showing a step subsequent to FIG. 9I.

Then, solder balls 17 are arranged on the forward end surfaces 13 of the posts 12, as shown in FIG. 9J. The solder balls 17 spread up to the side surfaces 16 of the posts 12, due to wettability thereof. Thus, the forward end surfaces 13 and the side surfaces 16 of the posts 12 are covered with the solder balls 17.

Figure 9K:
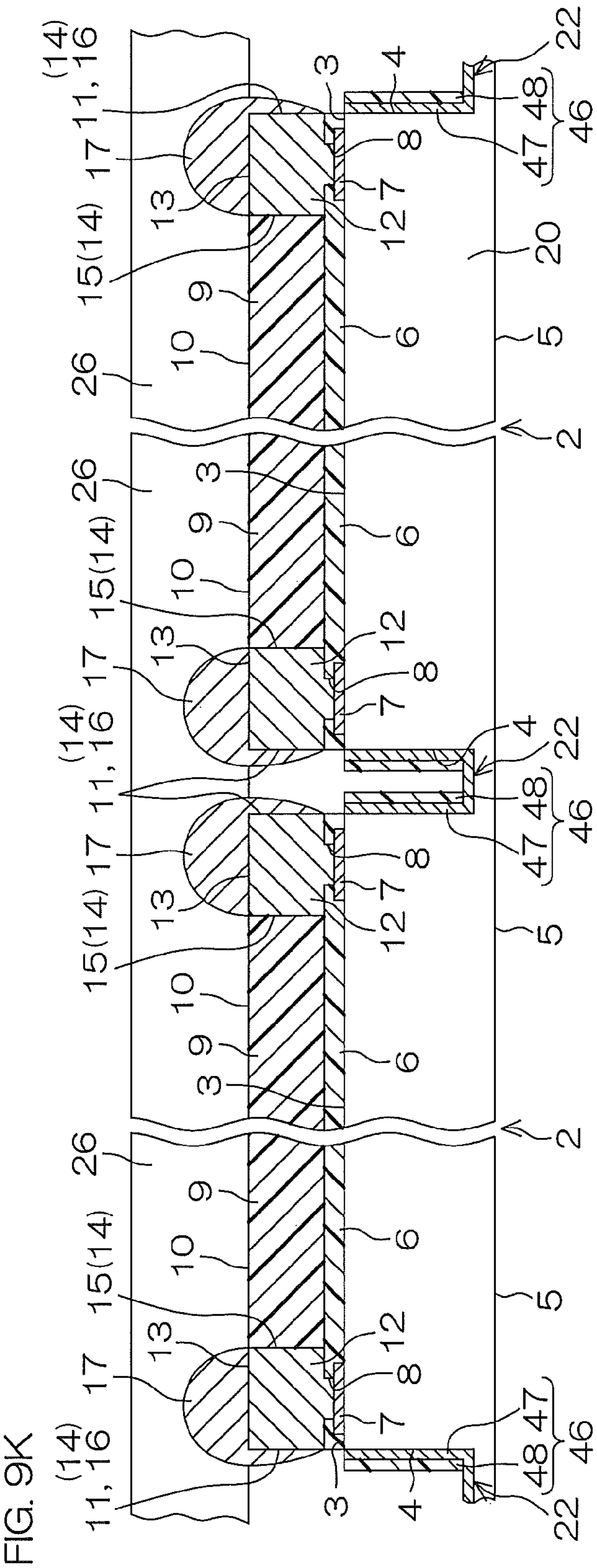
FIG. 9K A schematic sectional view showing a step subsequent to FIG. 9J.

Then, the solder balls 17 are arranged on an adhesive surface of a dicing tape 26, and the wafer 20 is supported on the dicing tape 26, as shown in FIG. 9K.

Figure 9L:
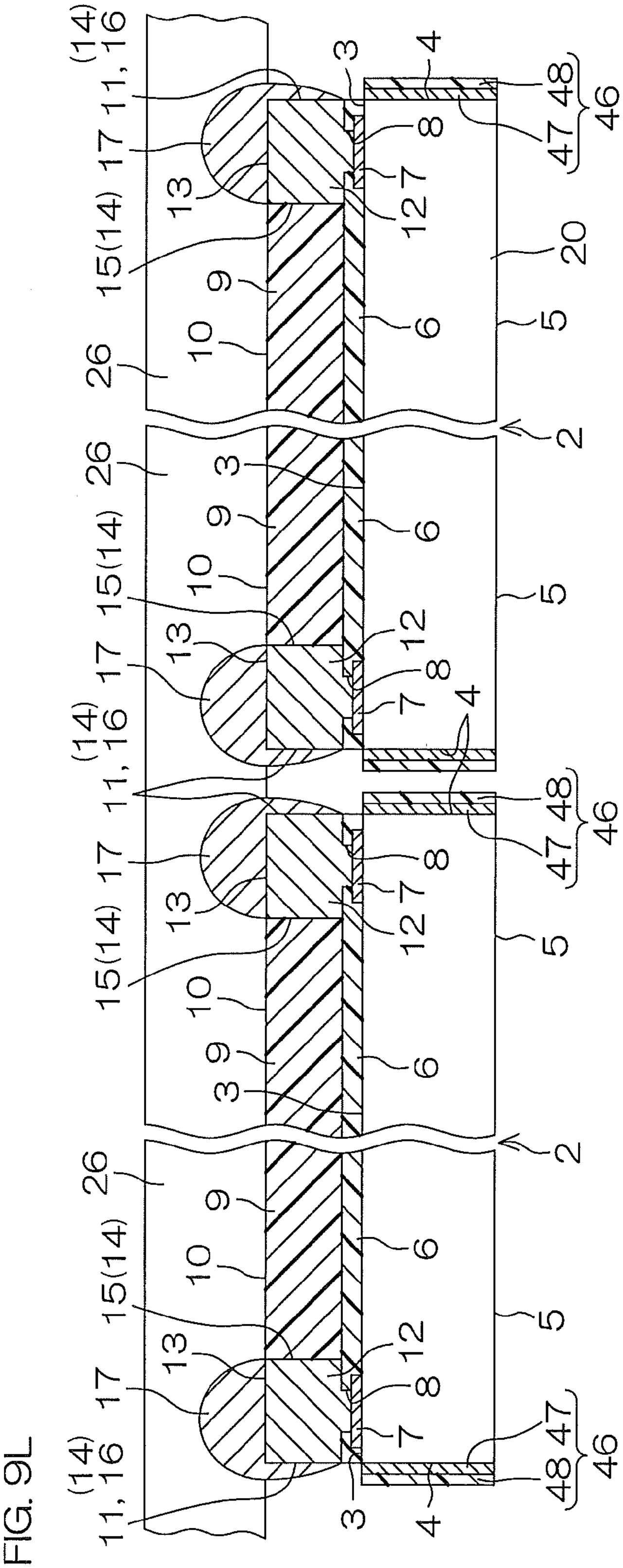
FIG. 9L A schematic sectional view showing a step subsequent to FIG. 9K.

Then, the semiconductor chip 2 (the wafer 20) is polished from the side of the rear surface 5 thereof. This polishing of the semiconductor chip 2 is performed until portions of the semiconductor chip 2 formed under the trenches 22 are completely removed and the inner sides of the trenches 22 and the side of the rear surface 5 of the semiconductor chip 2 communicate with one another, as shown in FIG. 9L. At this time, portions of the shielding films 46 applied to the bottom surfaces of the trenches 22 are removed.

Figure 9M:
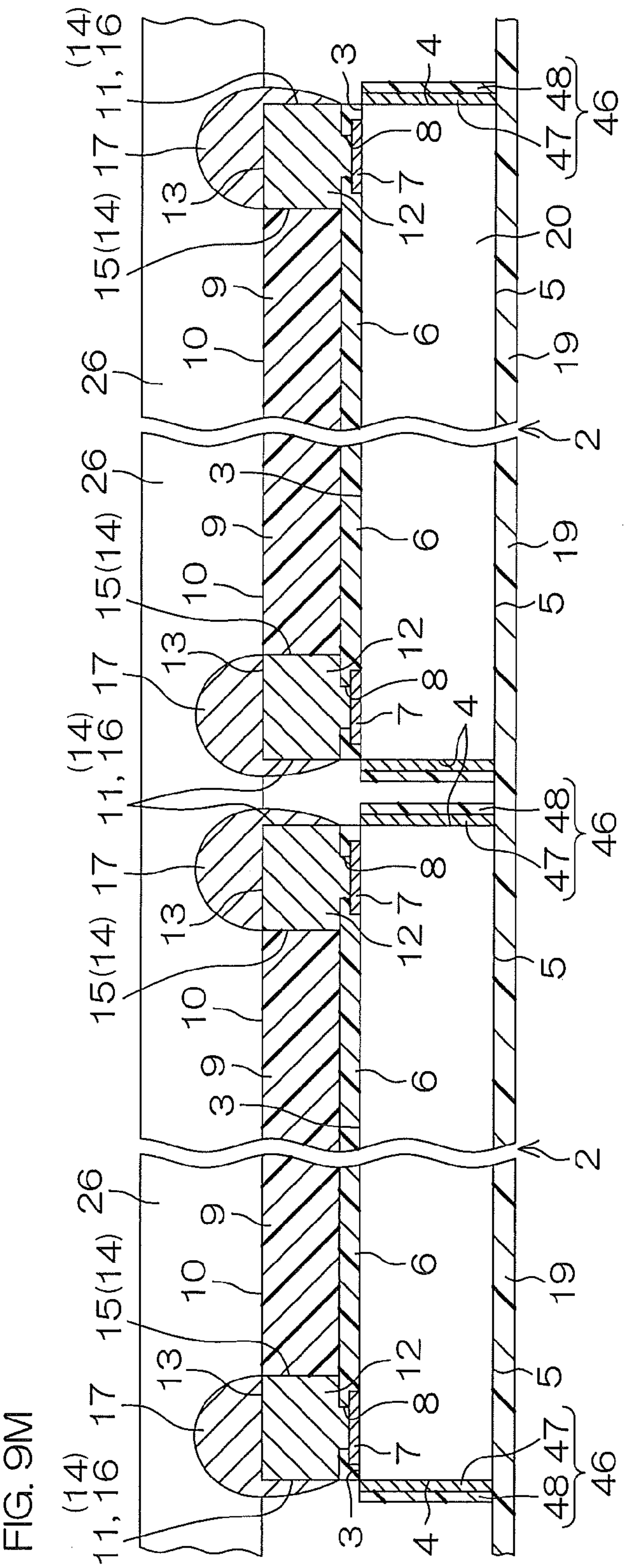
FIG. 9M A schematic sectional view showing a step subsequent to FIG. 9L.

Thereafter a rear surface covering film 19 is formed on the whole area of the rear surface 5 of the semiconductor chip 2 (the wafer 20), as shown in FIG. 9M. The rear surface covering film 19 can be formed by coating (spin-coating) the whole area of the rear surface 5 of the wafer 20 with a resin material and hardening the resin material, for example. The rear surface covering film 19 can also be formed by sticking a resin film formed in a filmlike manner to the whole area of the rear surface 5 of the wafer 20.

Then, the rear surface covering film 19 is cut on the dicing lines with dicing blades (not shown), and the wafer 20 is singulated into each semiconductor chip 2. When the dicing tape 26 is thereafter removed, the semiconductor device 45 shown in FIG. 8 is obtained.

Also in this structure of the semiconductor device 45, effects similar to those of the structure of the semiconductor device 1 shown in FIG. 2 can be attained.

Fifth Embodiment

Figure 10:
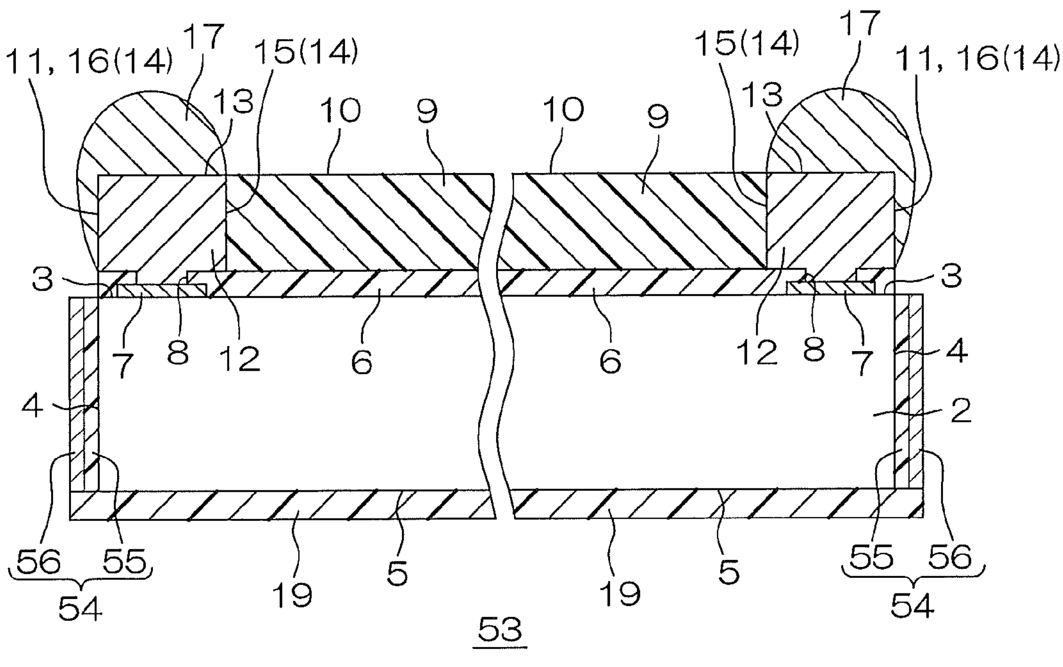
FIG. 10 A schematic sectional view of a semiconductor device according to a fifth embodiment of the present invention, showing a section taken along the same cutting plane line as the section of the semiconductor device of FIG. 2.

FIG. 10 is a schematic sectional view of a semiconductor device according to a fifth embodiment of the present invention, showing a section taken along the same cutting plane line as the section of the semiconductor device of FIG. 2. Referring to FIG. 10, portions corresponding to the respective parts of the portions shown in FIG. 2 are denoted by the same reference numerals as the reference numerals assigned to the respective parts. In the following, description as to the portions denoted by the same reference numerals is omitted.

In a semiconductor device 53, shielding films 54 covering side surfaces 4 of a semiconductor chip 2 have multilayer structures of resin layers 55 and metal layers 56. The resin layers 55 are made of a resin material such as epoxy resin, polyamide imide, polyamide, polyimide or phenol, for example. The metal layers 56 are made of Pd, Ni, Ti, Cr or TiW, for example.

Also in this structure of the semiconductor device 53, effects similar to those of the structure of the semiconductor device 1 shown in FIG. 2 can be attained.

Sixth Embodiment

Figure 11:
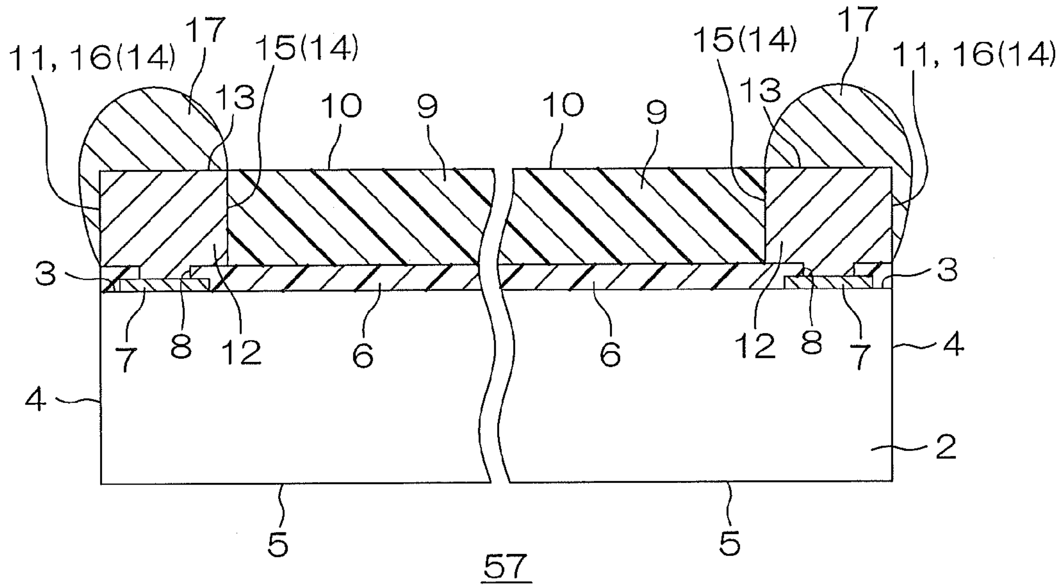
FIG. 11 A schematic sectional view of a semiconductor device according to a sixth embodiment of the present invention, showing a section taken along the same cutting plane line as the section of the semiconductor device of FIG. 2.

FIG. 11 is a schematic sectional view of a semiconductor device according to a sixth embodiment of the present invention, showing a section taken along the same cutting plane line as the section of the semiconductor device of FIG. 2. Referring to FIG. 11, portions corresponding to the respective parts of the portions shown in FIG. 2 are denoted by the same reference numerals as the reference numerals assigned to the respective parts. In the following, description as to the portions denoted by the same reference numerals is omitted.

In a semiconductor device 57, shielding films 18 covering side surfaces 4 of a semiconductor chip 2 and a rear surface covering film 19 covering a rear surface 5 of the semiconductor chip 2 are omitted.

FIGS. 12A to 12G are schematic sectional views showing a method for manufacturing the semiconductor device shown in FIG. 11 in step order. Referring to FIGS. 12A to 12G, portions corresponding to the respective parts of the portions shown in FIGS. 3A to 3L are denoted by the same reference numerals as the reference numerals assigned to the respective parts.

Manufacturing of the semiconductor device 57 is progressed in a state of a wafer 20 before the semiconductor chip 2 is cut into an individual piece. A passivation film 6 is formed on a front surface of the semiconductor chip 2 (the wafer 20).

Figure 12A:
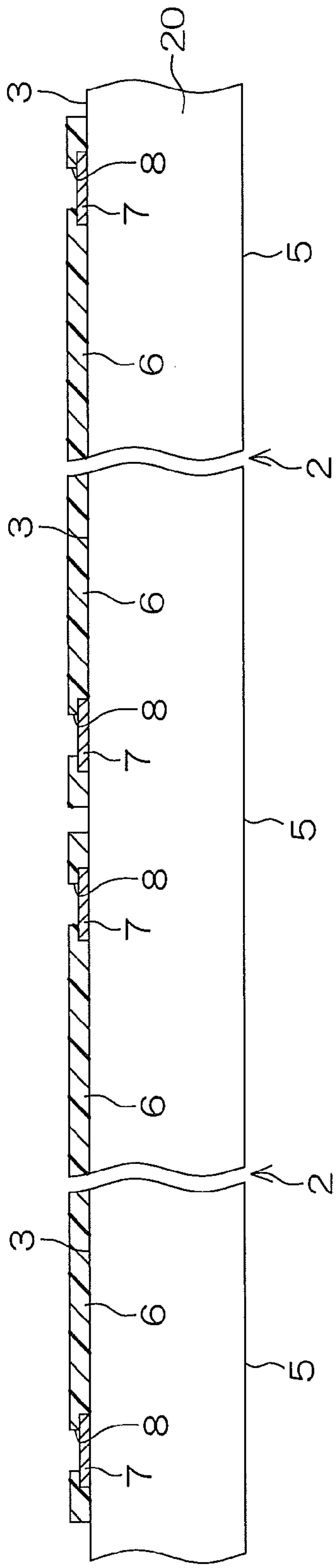
FIG. 12A A schematic sectional view showing a state in the process of manufacturing the semiconductor device shown in FIG. 11.

First, a plurality of pad openings 8 are formed in the passivation film 6 by photolithography and etching, as shown in FIG. 12A.

Figure 12B:
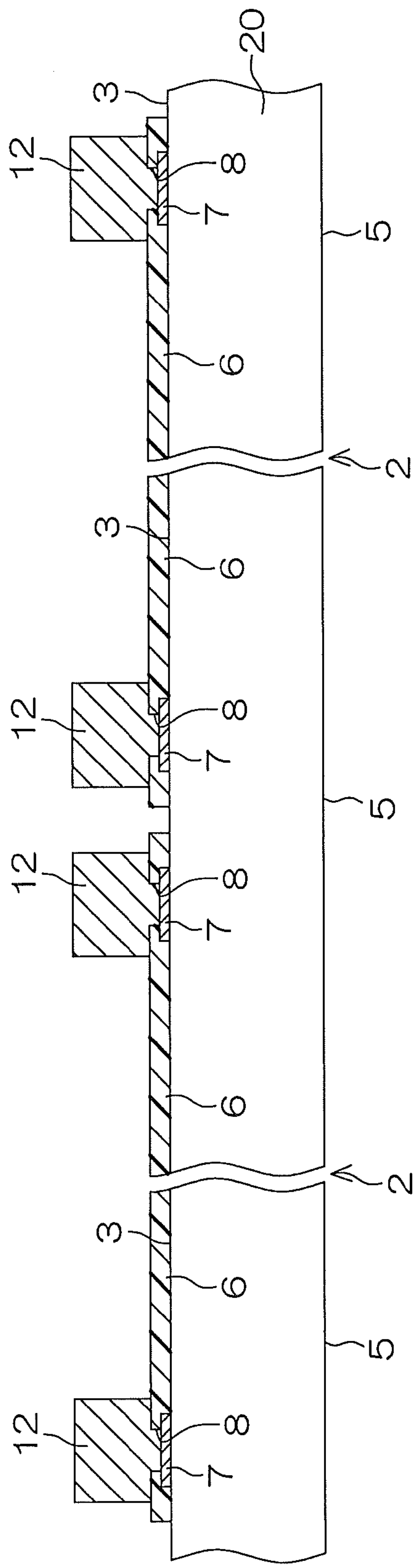
FIG. 12B A schematic sectional view showing a step subsequent to FIG. 12A.

Then, pillarlike posts 12 are formed on the respective electrode pads 7, as shown in FIG. 12B. The posts 12 can be formed by forming a mask having openings corresponding to portions where the posts 12 are formed on the passivation film 6, thereafter growing copper which is the material for the posts 12 in the openings of the mask by plating, and thereafter removing the mask, for example. The posts 12 can also be formed by forming a copper film (not shown) on the passivation film 6 and the electrode pads 7 by plating and thereafter selectively removing the copper film by photolithography and etching.

Figure 12C:
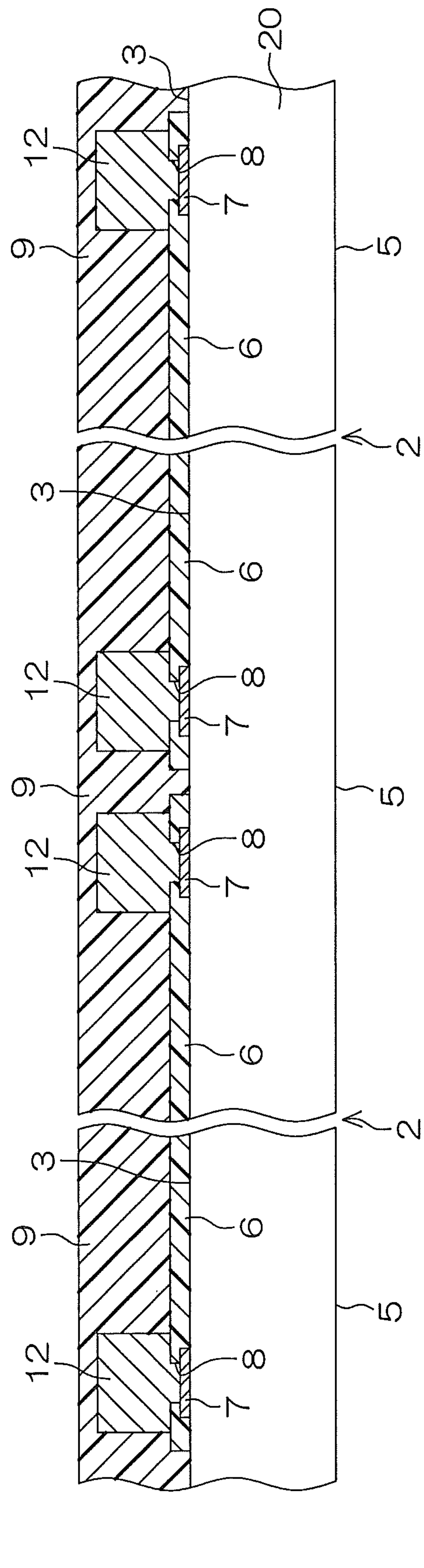
FIG. 12C A schematic sectional view showing a step subsequent to FIG. 12B.

Then, liquid resin (epoxy resin, for example) which is the material for a sealing resin layer 9 is supplied onto the passivation film 6, as shown in FIG. 12C. The liquid resin is supplied up to such a height that the same buries the posts 12 therein (such a height that the same completely covers the posts 12). Then, a treatment for hardening the resin is performed, whereby the sealing resin layer 9 is formed on the passivation film 6.

Figure 12D:
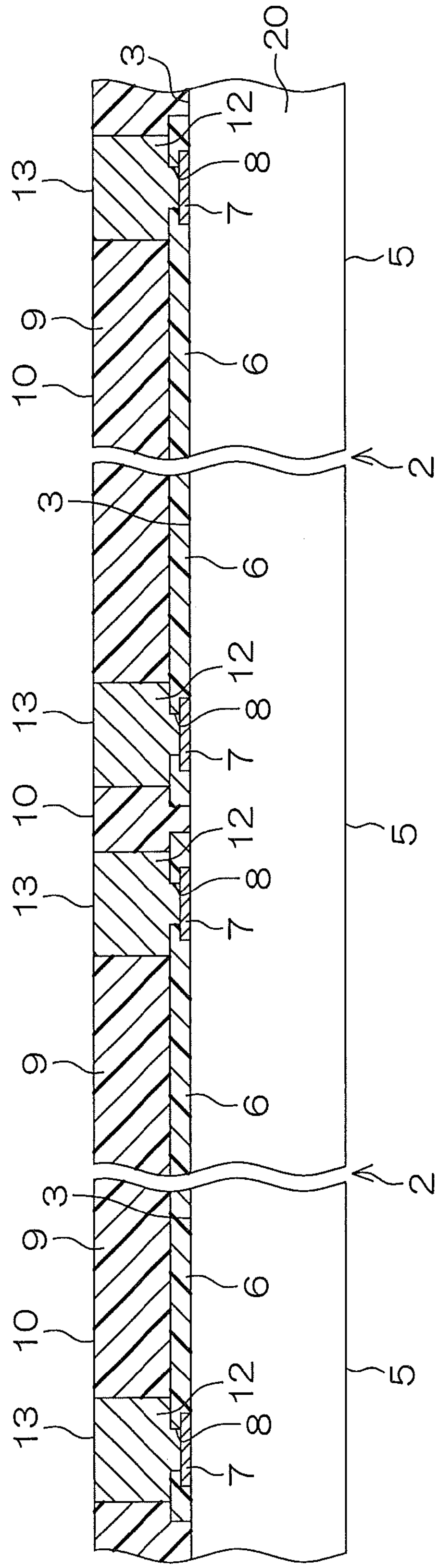
FIG. 12D A schematic sectional view showing a step subsequent to FIG. 12C.

Thereafter the sealing resin layer 9 is polished from the side of a front surface thereof. This polishing of the sealing resin layer 9 is continued until forward end surfaces 13 of the posts 12 are exposed from the front surface 10 of the sealing resin layer 9. As a result of this polishing, the forward end surfaces 13 of the posts 12 flush with the front surface 10 of the sealing resin layer 9 are obtained, as shown in FIG. 12D.

Figure 12E:
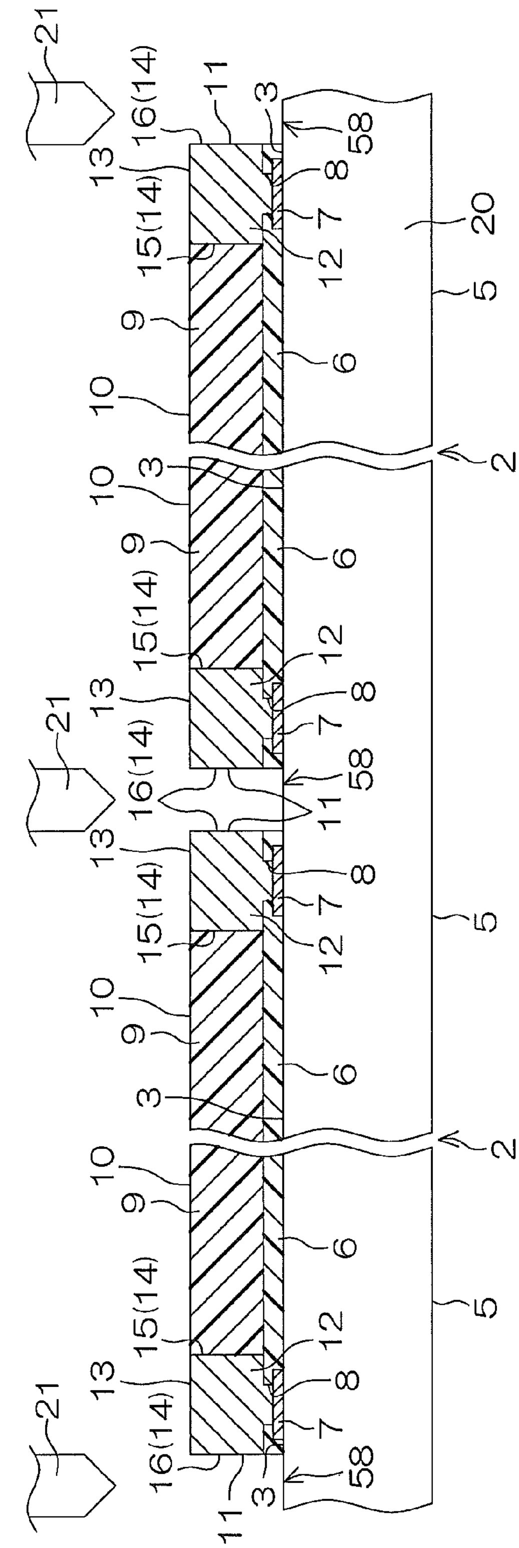
FIG. 12E A schematic sectional view showing a step subsequent to FIG. 12D.

Then, dicing blades 21 are advanced from the side of the front surface of the semiconductor chip 2, whereby trenches 58 dug down from the front surface of the sealing resin layer 9 are formed on dicing lines set along peripheral edges of each semiconductor chip 2, as shown in FIG. 12E. The trenches 58 pass through the sealing resin layer 9 and the passivation film 6, and are dug down to such a depth that bottom surfaces thereof reach the front surface 3 of the semiconductor chip 2. Thus, side surfaces 16 of the respective posts 12 are exposed on inner surfaces of the trenches 58.

Figure 12F:
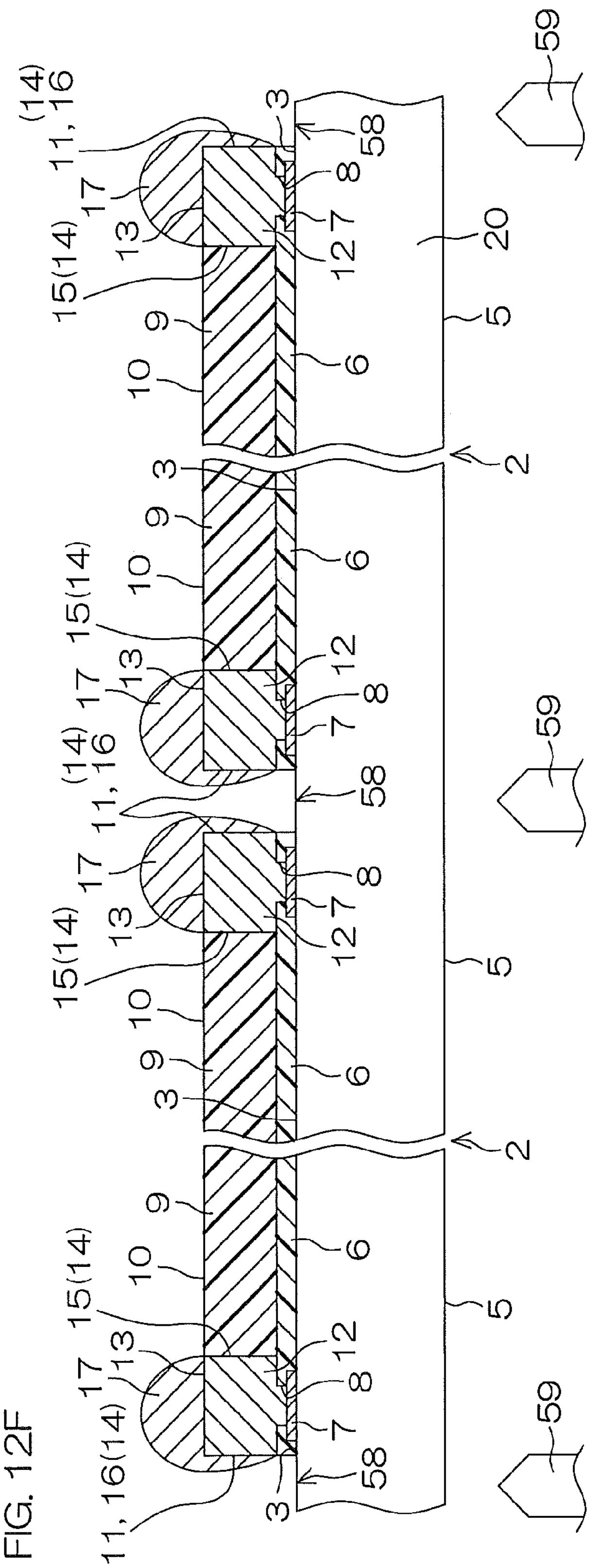
FIG. 12F A schematic sectional view showing a step subsequent to FIG. 12E.

Then, solder balls 17 are arranged on the forward end surfaces 13 of the posts 12, as shown in FIG. 12F. The solder balls 17 spread up to the side surfaces 16 of the posts 12, due to wettability thereof. Thus, the forward end surfaces 13 and the side surfaces 16 of the posts 12 are covered with the solder balls 17. Then, dicing blades 59 having the same blade width as the dicing blades 21 are advanced from the side of the rear surface 5 of the semiconductor chip 2 onto the dicing lines in a state where the solder balls 17 are arranged on an adhesive surface of a dicing tape (not shown) and the wafer 20 is supported on the dicing tape.

Figure 12G:
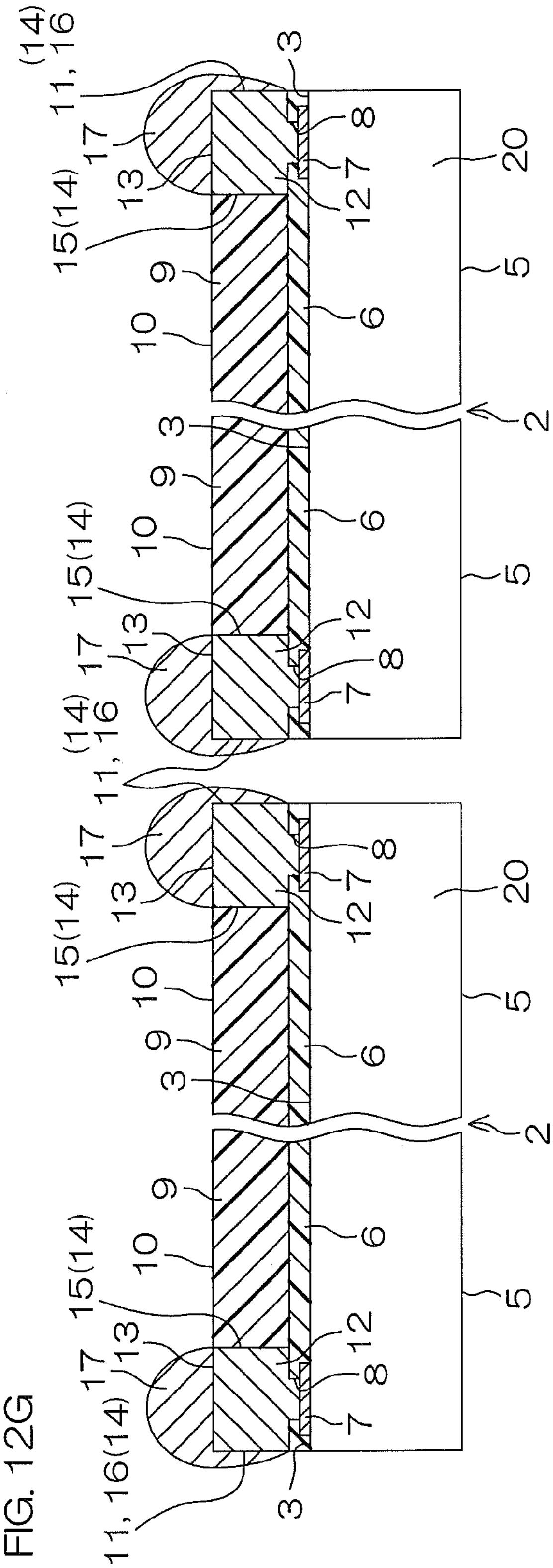
FIG. 12G A schematic sectional view showing a step subsequent to FIG. 12F.

Then, the wafer 20 is dug down from the side of the rear surface 5, and the wafer 20 is singulated into each semiconductor chip 2, as shown in FIG. 12G. When the dicing tape is thereafter removed, the semiconductor device 57 shown in FIG. 11 is obtained.

Also in this structure of the semiconductor device 57, effects similar to those of the structure of the semiconductor device 1 shown in FIG. 2 can be attained.

Seventh Embodiment

Figure 13:
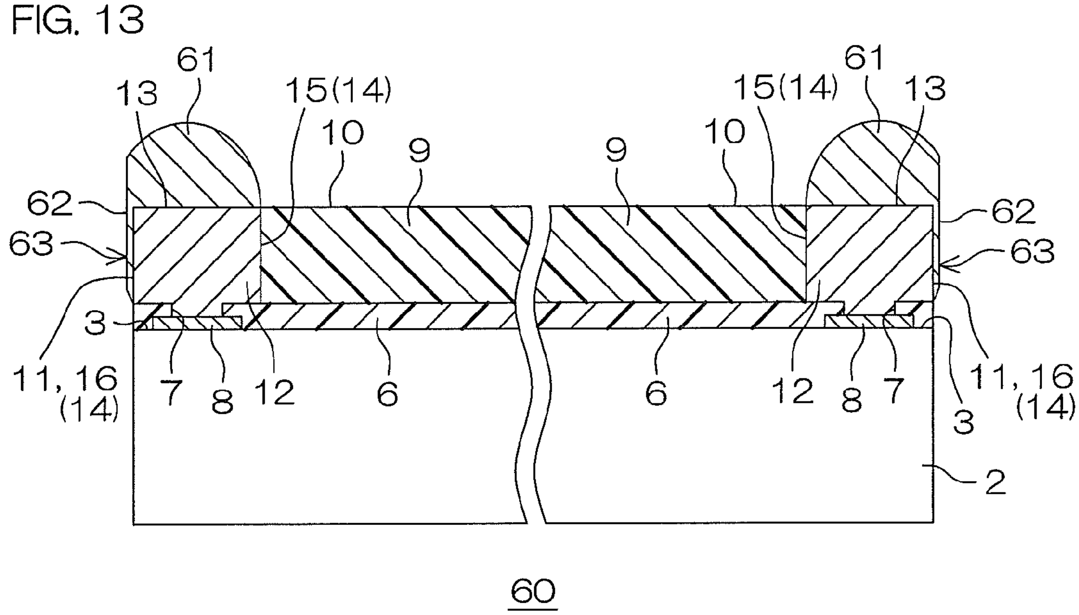
FIG. 13 A schematic sectional view of a semiconductor device according to a seventh embodiment of the present invention, showing a section taken along the same cutting plane line as the section of the semiconductor device of FIG. 2.

FIG. 13 is a schematic sectional view of a semiconductor device according to a seventh embodiment of the present invention, showing a section taken along the same cutting plane line as the section of the semiconductor device of FIG. 2. Referring to FIG. 13, portions corresponding to the respective parts of the portions shown in FIG. 2 are denoted by the same reference numerals as the reference numerals assigned to the respective parts. In the following, description as to the portions denoted by the same reference numerals is omitted.

In the semiconductor device 1 shown in FIG. 1, it has been assumed that the solder balls 17 are generally spherically formed. In a semiconductor device 60 shown in FIG. 13, on the other hand, ball side surfaces 62 parallel to side surfaces 11 of a sealing resin layer 9 and side surfaces 16 of posts 12 are formed on solder balls 61.

More specifically, the solder balls 61 extend up to the side surfaces 16 of the posts 12, and cover the portions. These covering portions 63 are provided in the form of thin films parallelly extending along the side surfaces 16 of the posts 12. Side surfaces of outer sides (peripheral edge sides of the semiconductor chip 2) of these covering portions 63 form the ball side surfaces 62.

In the semiconductor device 60, shielding films 18 covering side surfaces 4 of a semiconductor chip 2 and a rear surface covering film 19 covering a rear surface 5 of the semiconductor chip 2 are omitted.

Figure 14A:
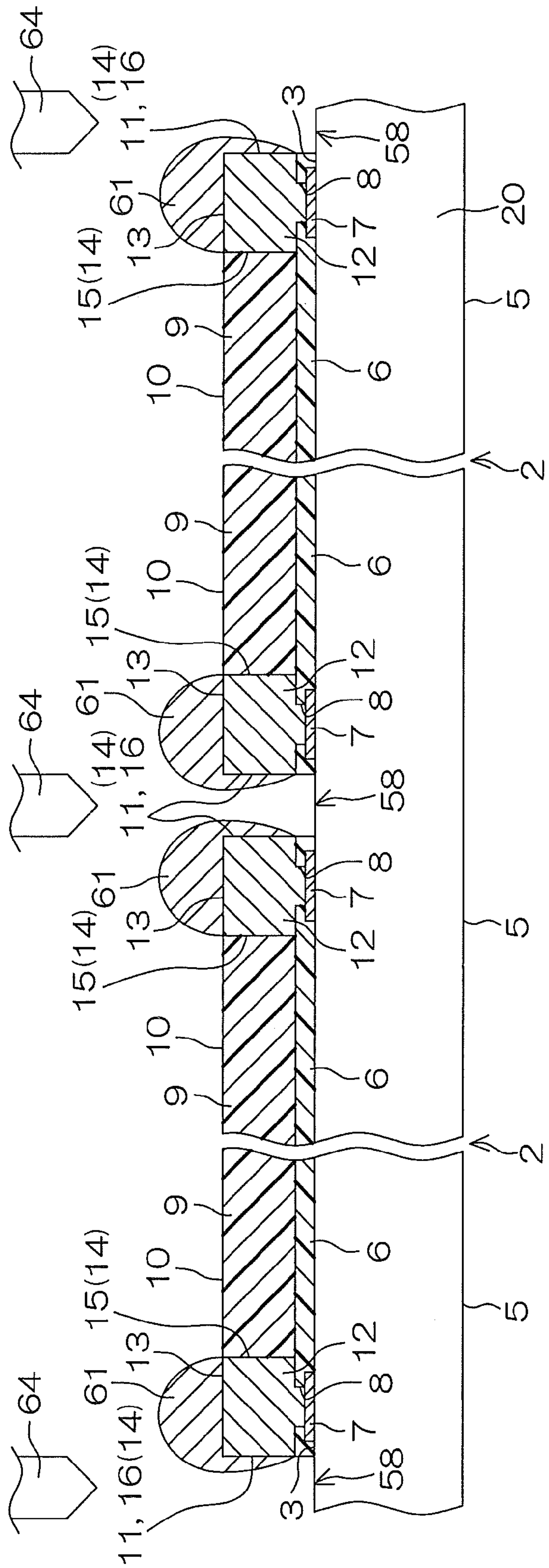
FIG. 14A A schematic sectional view showing a state in the process of manufacturing the semiconductor device shown in FIG. 13.
Figure 14B:
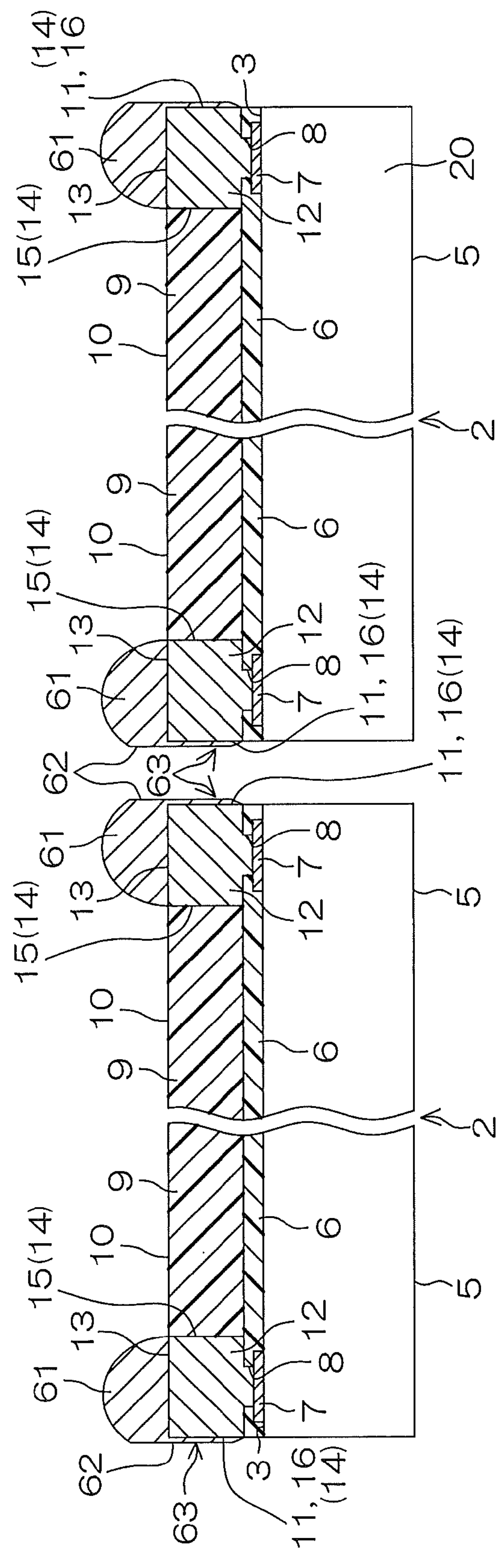
FIG. 14B A schematic sectional view showing a step subsequent to FIG. 14A.

FIGS. 14A and 14B are schematic sectional views in respective manufacturing steps for the semiconductor device shown in FIG. 13.

The steps shown in FIGS. 14A and 14B are carried out subsequently to the steps shown in FIGS. 12A to 12E.

After trenches 58 dug down from a front surface of the sealing resin layer 9 are formed through the step shown in FIG. 12E, the solder balls 61 are arranged on forward end surfaces 13 of the posts 12, as shown in FIG. 14A. The solder balls 61 spread up to the side surfaces 16 of the posts 12, due to wettability thereof. Thus, the forward end surfaces 13 and the side surfaces 16 of the posts 12 are covered with the solder balls 61. Then, dicing blades 64 are advanced from the side of a front surface 3 of a wafer 20 into the trenches 58 in a state where the rear surface 5 of the semiconductor chip 2 is bonded to an adhesive surface of a dicing tape (not shown) and the wafer 20 is supported on the dicing tape.

Then, the wafer 20 is dug down from the side of the front surface 3, and the wafer 20 is singulated into each semiconductor chip 2, as shown in FIG. 14B. At this time, portions of the solder balls 61 overlapping with the dicing lines are cut following the advancement of the dicing blades 64. Thus, the ball side surfaces 62 are formed on the solder balls 61. When the dicing tape is thereafter removed, the semiconductor device 60 shown in FIG. 13 is obtained.

Also in the semiconductor device 60 obtained in this manner, effects similar to those of the semiconductor device 1 shown in FIG. 2 can be attained.

While the first to seventh embodiments of the present invention have been described, the present invention may be embodied in other ways.

Figure 15:
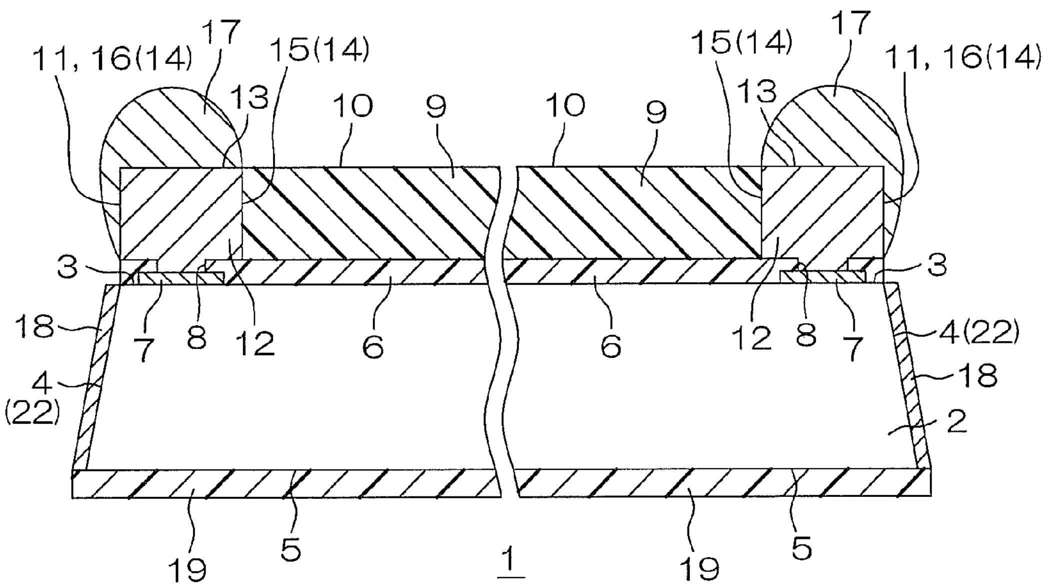
FIG. 15 A schematic sectional view showing a modification of the semiconductor device shown in FIG. 2.

For example, side surfaces of trenches 22 may be provided in such tapered shapes that the interval therebetween widens as reaching the side of a front surface 3 of a semiconductor chip 2, as shown in FIG. 15.

Such tapered trenches 22 can be formed by employing those having cutting blades, generally U-shaped in section, whose thicknesses decrease as approaching cutting edges as the dicing blades 21 advanced from the side of the front surface 3 of the semiconductor chip 2 in the step shown in FIG. 3E, for example.

While such a structure that the metallic material having shielding properties against infrared rays is employed as the material for the shielding films 18 and the resin material is employed as the material for the rear surface covering film 19 has been adopted in the semiconductor device 1 shown in FIG. 2, a resin material may be employed as the material for the shielding films 18, and a metallic material (Pd, Ni, Ti, Cr or TiW, for example) having shielding properties against infrared rays may be employed as the material for the rear surface covering film 19. In this case, a resin material having shielding properties against infrared rays such as epoxy resin, polyamide imide, polyamide, polyimide or phenol, for example, is preferably employed as the resin material which is the material for the shielding films 18.

While copper has been illustrated as the material for the posts 12, a metallic material such as gold (Au) or Ni (nickel) may be employed as the material for the posts 12.

While it has been assumed that the posts 12 are arranged in a line in the form of an annulus along the peripheral edges of the semiconductor chip 2, the posts 12 may be arranged in a plurality of lines in the form of annuli along the peripheral edges of the semiconductor chip 2, depending on the number (pin number) of the posts 12. In a case where 100 posts 12 are provided, for example, the posts 12 may be arranged in five lines in the form of annuli along the peripheral edges of the semiconductor chip 2.

Eighth Embodiment

Figure 16:
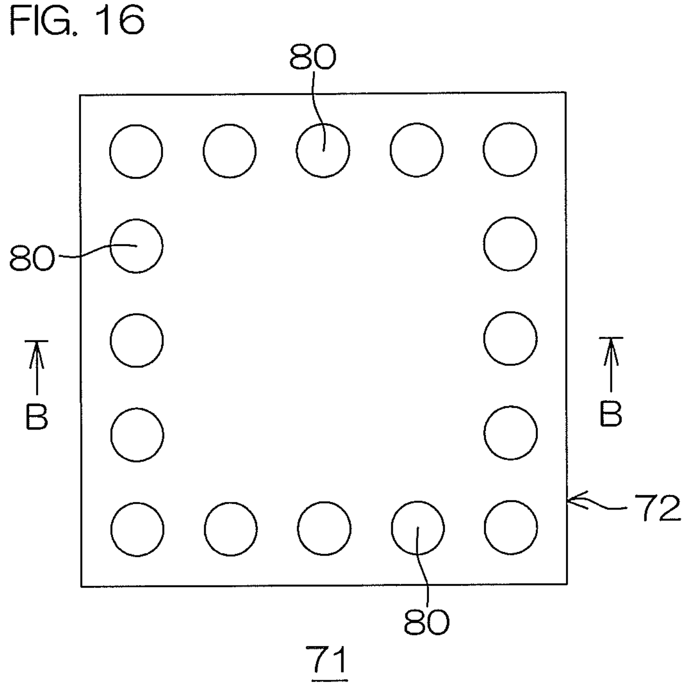
FIG. 16 A schematic plan view of a semiconductor device according to an eight embodiment of the present invention.
Figure 17:
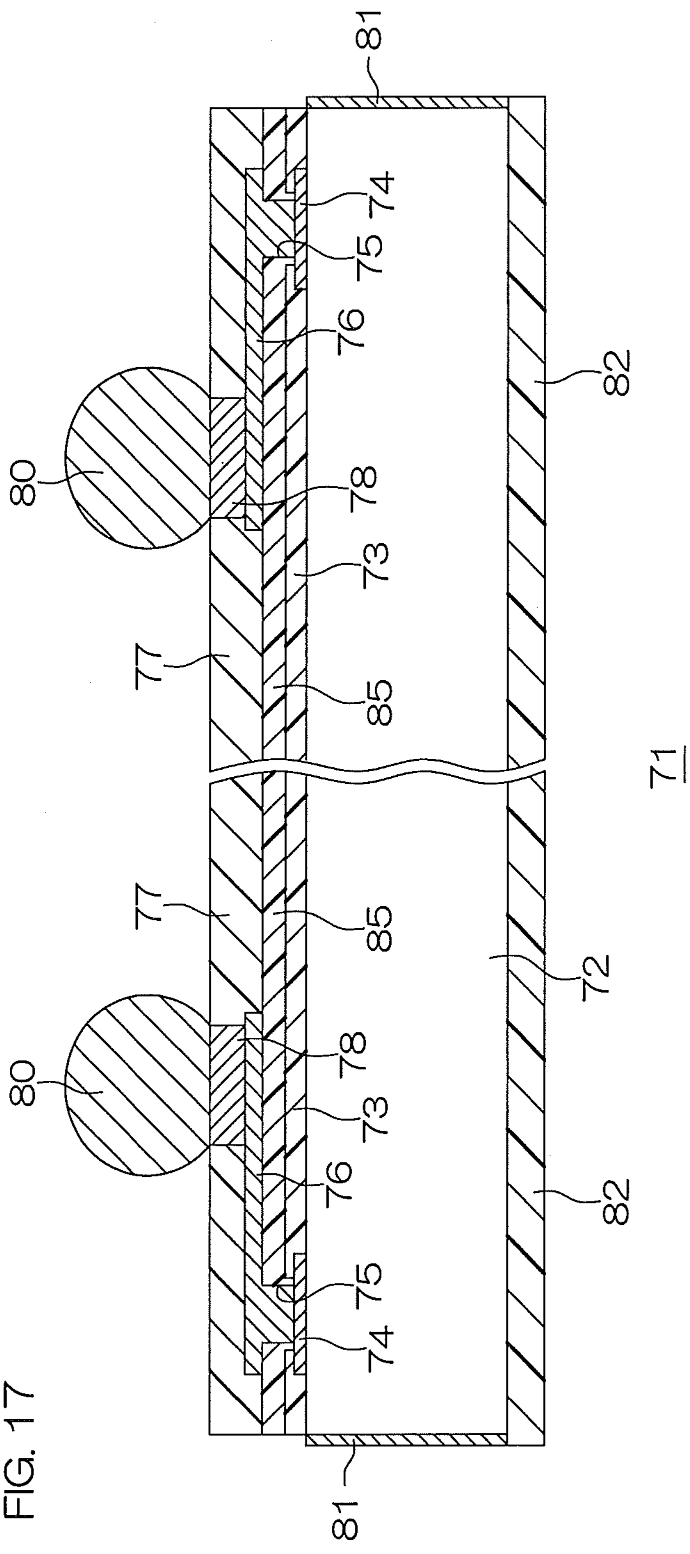
FIG. 17 A schematic sectional view of the semiconductor device according to the eighth embodiment of the present invention, showing a section taken along a cutting plane line B-B in FIG. 16.

FIG. 16 is a schematic plan view of a semiconductor device according to an eight embodiment of the present invention. FIG. 17 is a schematic sectional view of the semiconductor device according to the eighth embodiment of the present invention, showing a section taken along a cutting plane line B-B in FIG. 16.

A semiconductor device 71 is a semiconductor device to which a WLCSP is applied, and includes a semiconductor chip 72. The semiconductor chip 72 is a silicon chip, for example, and quadrangularly formed in plan view.

A passivation film (surface protective film) 73 is formed on the outermost surface of the semiconductor chip 72. The passivation film 73 is made of silicon oxide or silicon nitride, for example. A plurality of electrode pads 74 electrically connected with elements built into the semiconductor chip 72 are formed on the semiconductor chip 72. The passivation film 73 is removed from central portions of the respective electrode pads 74.

An organic insulating film 85 is formed on the passivation film 73. The organic insulating film 85 is made of an organic material such as polyimide, for example. A plurality of pad openings 75 for exposing the electrode pads 74 are formed in the organic insulating film 85. The plurality of electrode pads 74 (pad openings 75) are arranged in a line in the form of a quadrangular annulus along peripheral edges of the semiconductor chip 72.

A plurality of rewires 76 are formed on the organic insulating film 85. The rewires 76 are made of a metallic material such as aluminum, for example. The respective rewires 76 are drawn from the electrode pads 74 onto the organic insulating film 85 through the pad openings 75, and extend along a front surface of the organic insulating film 85.

A sealing resin layer 77 is stacked on the organic insulating film 85. The sealing resin layer 77 is made of epoxy resin, for example. The sealing resin layer 77 covers front surfaces of the organic insulating film 85 and the rewires 76, and seals the side of the front surface of the semiconductor device 71 (the semiconductor chip 72). A front surface of the sealing resin layer 77 is formed as a planar surface, while side surfaces thereof are formed to be flush with side surfaces of the semiconductor chip 72.

Columnar posts 78 are provided on the respective rewires 76 to pass through the sealing resin layer 77 in the thickness direction thereof. The posts 78 are made of copper (Cu), for example. Forward end surfaces of the posts 78 are flush with the front surface of the sealing resin layer 77.

Solder balls 80 as external connecting terminals are bonded onto the forward end surfaces of the respective posts 78. The solder balls 80 are electrically connected with the elements built into the semiconductor chip 72 through the electrode pads 74, the rewires 76 and the posts 78.

The solder balls 80 are connected to pads (not shown) of a mounting substrate, whereby mounting of the semiconductor device 71 on the mounting substrate is achieved. In other words, the solder balls 80 are connected to the pads on the mounting substrate, whereby the semiconductor device 71 is supported on the mounting substrate, while electrical connection between the mounting substrate and the semiconductor chip 72 is achieved.

The whole areas of the side surfaces of the semiconductor chip 72 are covered with shielding films 81. The shielding films 81 are made of a metallic material having shielding properties against infrared rays. As metallic materials having shielding properties against infrared rays, Pd (palladium), Ni (nickel), Ti (titanium), Cr (chromium) and TiW (titanium-tungsten alloy) etc. can be illustrated, for example. The thickness of the shielding films 81 is not less than 0.1 μm and not more than 10 μm, for example.

The whole area of a rear surface of the semiconductor chip 72 is covered with a rear surface covering film 82. The rear surface covering film 82 is made of a resin material such as epoxy resin, polyamide imide, polyamide, polyimide or phenol, for example. The thickness of the rear surface covering film 82 is not less than 3 μm and not more than 100 μm, for example.

FIGS. 18A to 18J are schematic sectional views showing a method for manufacturing the semiconductor device shown in FIG. 17 in step order.

Manufacturing of the semiconductor device 71 is progressed in a state of a wafer before the semiconductor chip 72 is cut into an individual piece. The passivation film 73 is formed on the front surface of the semiconductor chip 72 (the wafer). The organic insulating film 85 is formed on the passivation film 73.

Figure 18A:
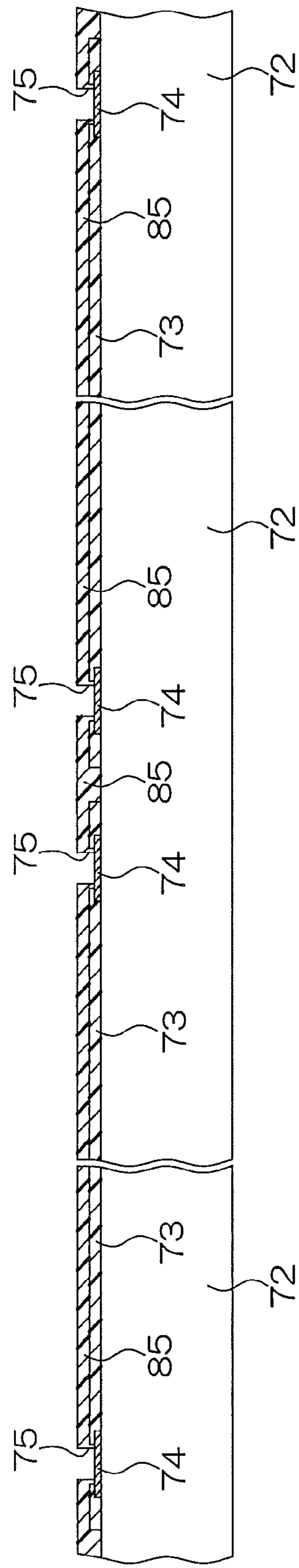
FIG. 18A A schematic sectional view showing a state in the process of manufacturing the semiconductor device shown in FIG. 17.

First, the plurality of pad openings 75 are formed in the organic insulating film 85 by photolithography and etching, as shown in FIG. 18A.

Figure 18B:
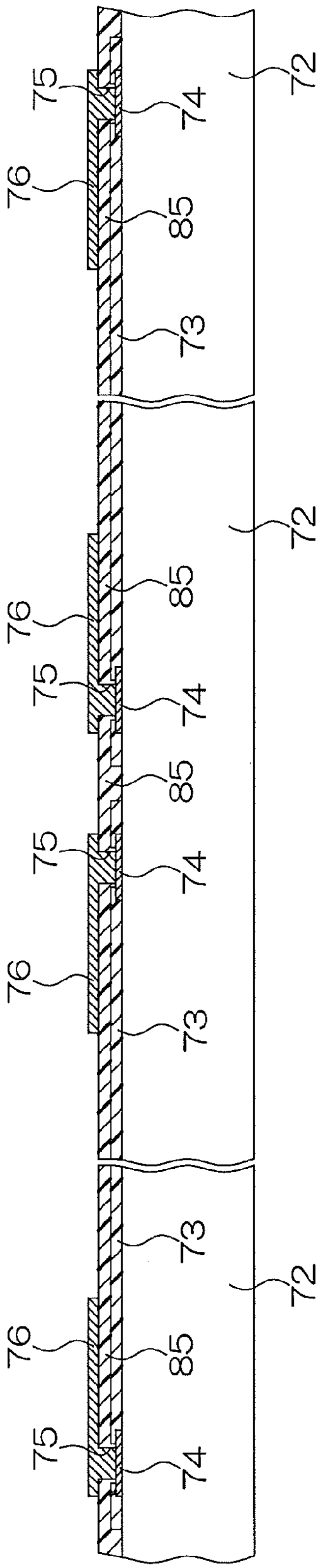
FIG. 18B A schematic sectional view showing a step subsequent to FIG. 18A.

Then, a plating layer made of the material for the rewires 76 is formed on the organic insulating film 85 and the electrode pads 74 exposed from the respective pad openings 75, and the plating layer is patterned into the plurality of rewires 76 by photolithography and etching, as shown in FIG. 18B.

Figure 18C:
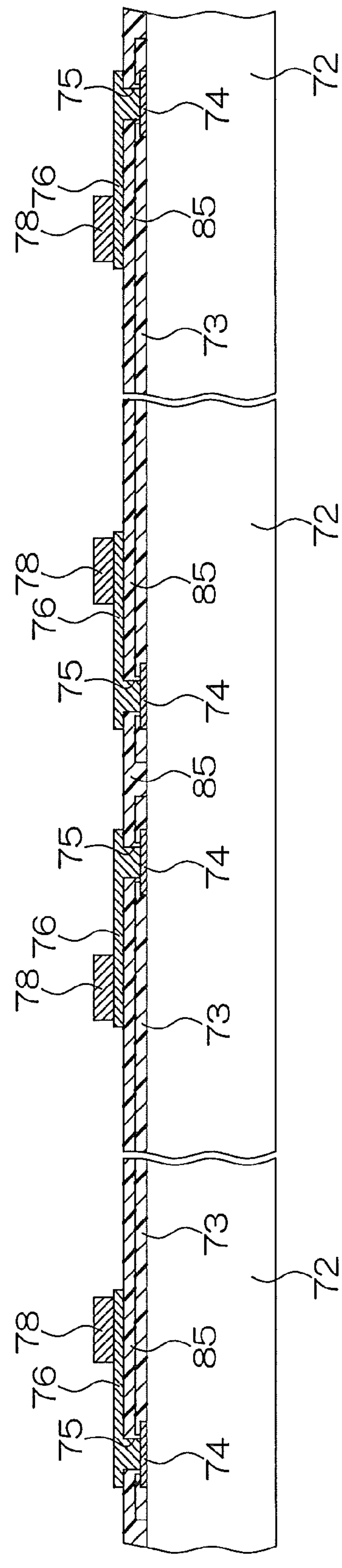
FIG. 18C A schematic sectional view showing a step subsequent to FIG. 18B.

Thereafter the columnar posts 78 are formed on the respective rewires 76, as shown in FIG. 18C. The posts 78 can be formed by forming a mask having openings corresponding to portions where the posts 78 are formed on the organic insulating film 85 and the rewires 76, thereafter growing copper which is the material for the posts 78 in the openings of the mask and thereafter removing the mask, for example. The posts 78 can also be formed by forming a copper film (not shown) on the organic insulating film 85 and the rewires 76 by plating and thereafter selectively removing the copper film by photolithography and etching.

Figure 18D:
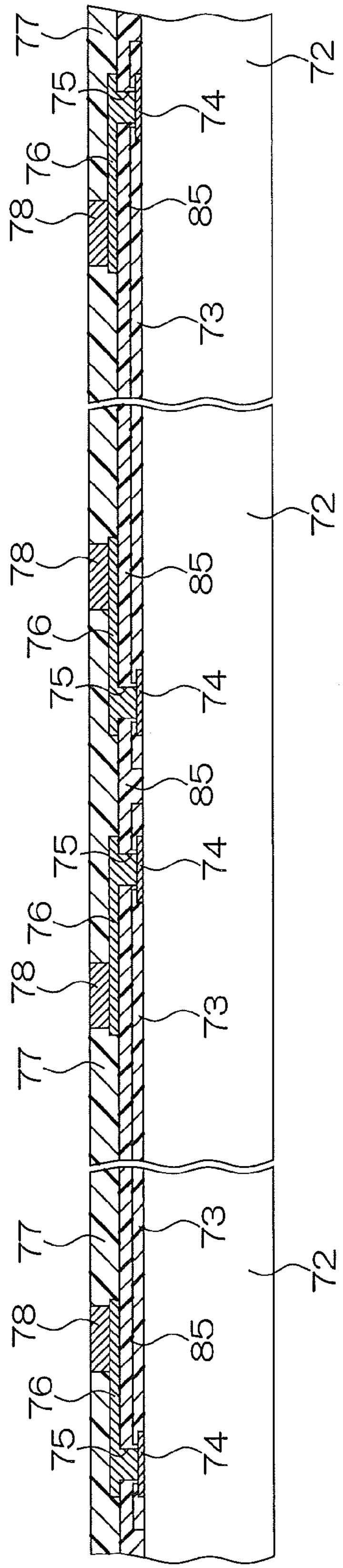
FIG. 18D A schematic sectional view showing a step subsequent to FIG. 18C.

Then, liquid resin (epoxy resin, for example) which is the material for the sealing resin layer 77 is supplied onto the organic insulating film 85. The liquid resin is supplied up to such a height that the same buries the posts 78 therein. Then, after a treatment for hardening the resin is performed, the sealing resin layer 77 is polished from the side of the front surface thereof. This polishing of the sealing resin layer 77 is continued until the forward end surfaces of the posts 78 are flush with the front surface of the sealing resin layer 77, as shown in FIG. 18D.

Figure 18E:
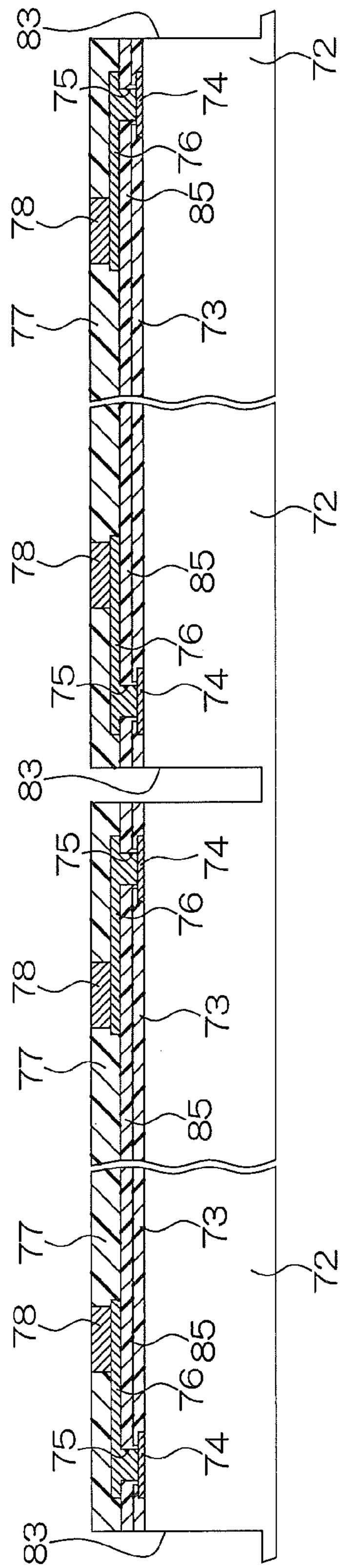
FIG. 18E A schematic sectional view showing a step subsequent to FIG. 18D.

Then, dicing blades (not shown) are advanced from the side of the front surface of the semiconductor chip 72, whereby trenches 83 dug down from the front surface of the sealing resin layer 77 are formed on dicing lines set along the peripheral edges of each semiconductor chip 72, as shown in FIG. 18E. The trenches 83 are dug down to such a depth that bottom surfaces thereof reach positions in the vicinity of the rear surface of the semiconductor chip 72. Further, the trenches 83 are so formed that the width between side surfaces thereof is constant in the depth direction thereof.

Figure 18F:
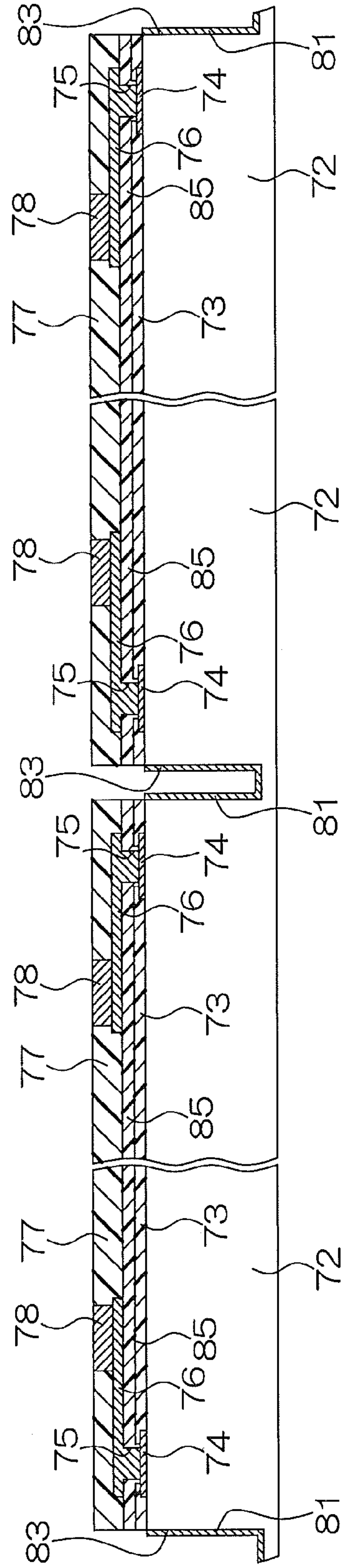
FIG. 18F A schematic sectional view showing a step subsequent to FIG. 18E.

Thereafter the shielding films 81 are applied to the whole areas of inner surfaces of the trenches 83, as shown in FIG. 18F. The shielding films 81 may be formed by evaporating a metal consisting of the material for the shielding films 81 onto the inner surfaces of the trenches 83, or may be formed by electroless plating, for example.

Figure 18G:
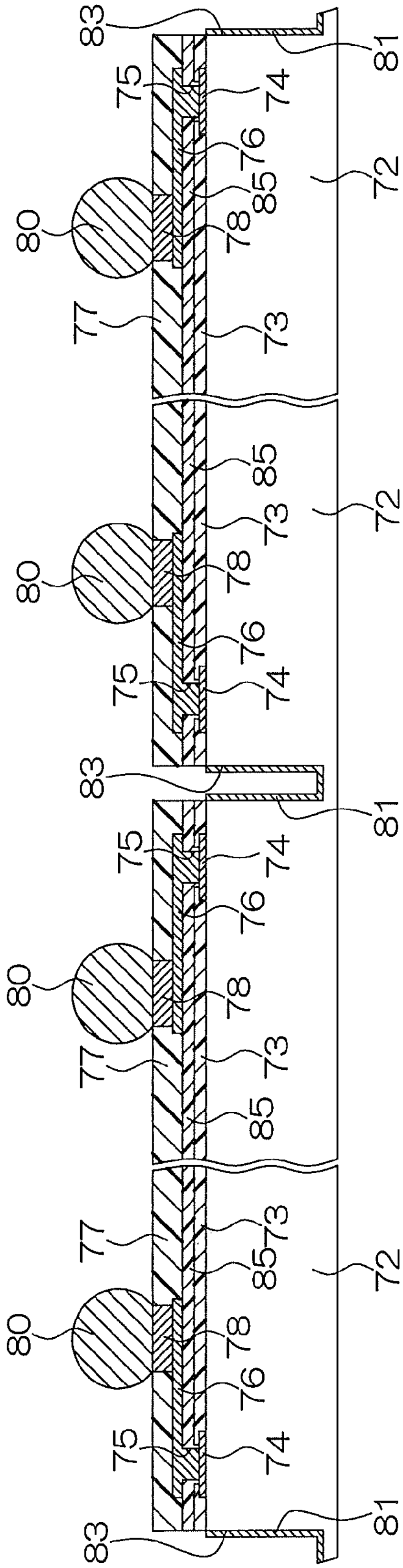
FIG. 18G A schematic sectional view showing a step subsequent to FIG. 18F.

Then, the solder balls 80 are arranged on the forward end surfaces of the posts 78, as shown in FIG. 18G.

Figure 18H:
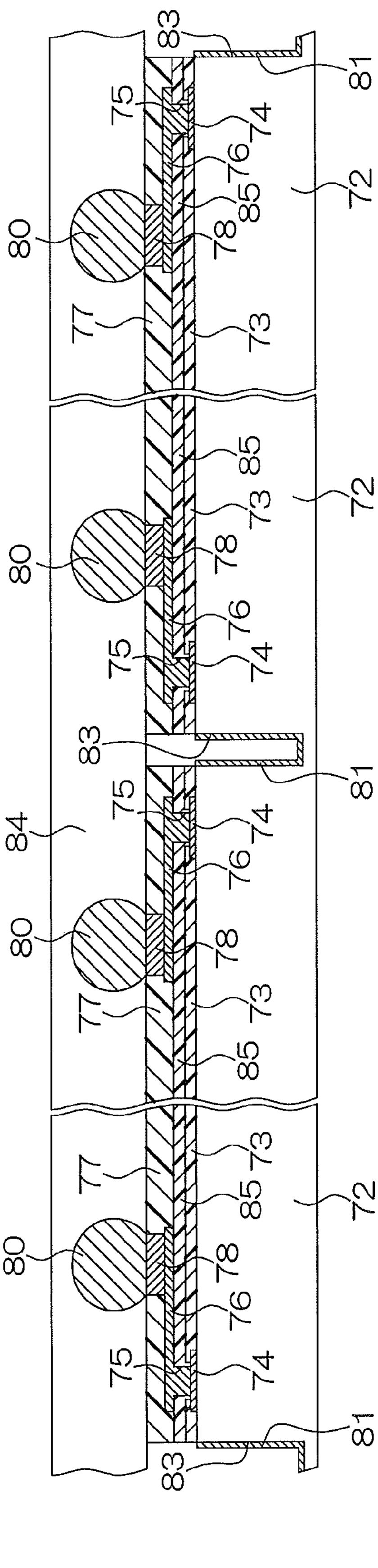
FIG. 18H A schematic sectional view showing a step subsequent to FIG. 18G.
Figure 18:
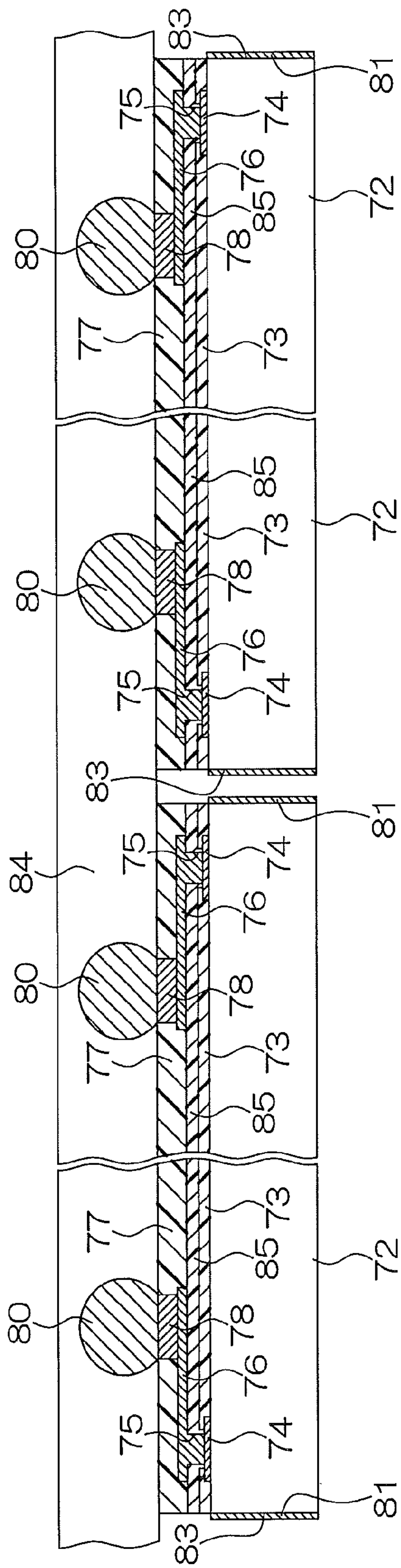
FIG. 18I A schematic sectional view showing a step subsequent to FIG. 18H.
FIG. 18J A schematic sectional view showing a step subsequent to FIG. 18I.

Then, the solder balls 80 are arranged on an adhesive surface of a dicing tape 84, and the wafer is supported on the dicing tape 84, as shown in FIG. 18H.

Then, the semiconductor chip 72 (the wafer) is polished from the side of the rear surface thereof. This polishing of the semiconductor chip 72 is performed until portions of the semiconductor chip 72 formed under the trenches 83 are completely removed and the inner sides of the trenches 83 and the side of the rear surface of the semiconductor chip 72 communicate with one another, as shown in FIG. 18I. At this time, portions of the shielding films 81 applied to the bottom surfaces of the trenches 83 are removed.

Figure 18J:
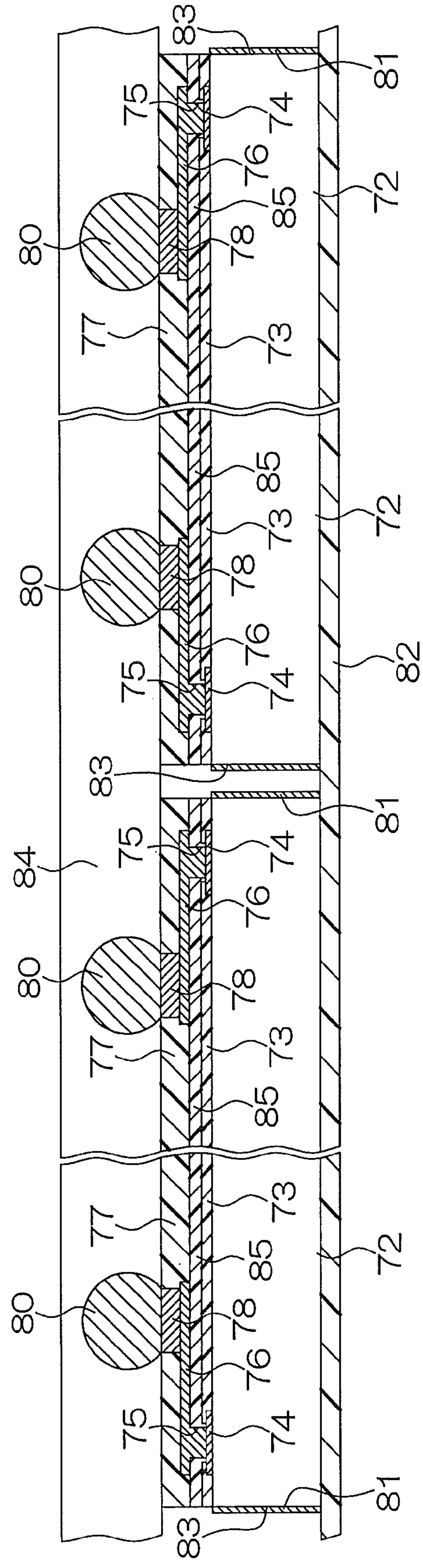

Thereafter the rear surface covering film 82 is formed on the whole area of the rear surface of the semiconductor chip 72 (the wafer), as shown in FIG. 18J. The rear surface covering film 82 can be formed by coating (spin-coating) the whole area of the rear surface of the wafer with a resin material and hardening the resin material, for example. The rear surface covering film 82 can also be formed by sticking a resin film formed in a filmlike manner to the whole area of the rear surface of the wafer.

Then, the rear surface covering film 82 is cut on the dicing lines with dicing blades (not shown), and the wafer is singulated into each semiconductor chip 72. The dicing blades (not shown) have the same thickness as the dicing blades employed for forming the trenches 83 in the step shown in FIG. 18E. When the dicing tape 84 is thereafter removed, the semiconductor device 71 shown in FIG. 17 is obtained.

In the semiconductor device 71, as hereinabove described, the side surfaces of the semiconductor chip 72 are covered with the shielding films 81 made of the material having shielding properties against infrared rays. Thus, penetration of infrared rays from the side surfaces of the semiconductor chip 72 into the inner portion thereof can be prevented. Further, the resin sealing layer 77 is stacked on the front surface of the semiconductor chip 72 and the rear surface of the semiconductor chip 72 is covered with the rear surface covering film 82, whereby no infrared rays penetrate from the front surface and the rear surface of the semiconductor chip 72 into the inner portion. Therefore, no infrared rays penetrate into the inner portion of the semiconductor chip 72, whereby occurrence of an inconvenience such as a malfunction of an IC resulting from penetration of infrared rays can be prevented.

Ninth Embodiment

Figure 19:
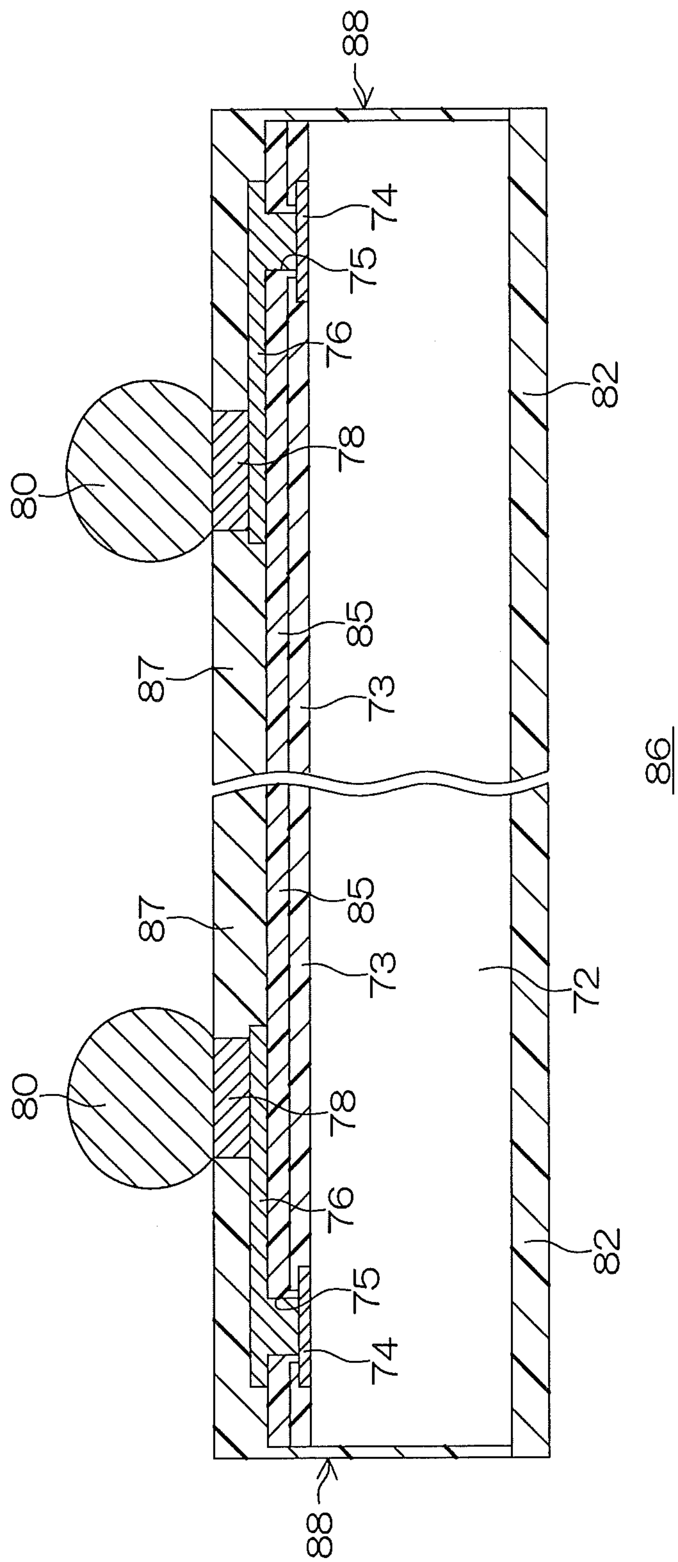
FIG. 19 A schematic sectional view of a semiconductor device according to a ninth embodiment of the present invention, showing a section taken along the same cutting plane line as the section of the semiconductor device of FIG. 17.

FIG. 19 is a schematic sectional view of a semiconductor device according to a ninth embodiment of the present invention, showing a section taken along the same cutting plane line as the section of the semiconductor device of FIG. 17. Referring to FIG. 19, portions corresponding to the respective parts of the portions shown in FIG. 17 are denoted by the same reference numerals as the reference numerals assigned to the respective parts. In the following, description as to the portions denoted by the same reference numerals is omitted.

In the semiconductor device 71 shown in FIG. 17, it has been assumed that the whole areas of the side surfaces of the semiconductor chip 72 are covered with the shielding films 81 made of the metallic material. In a semiconductor device 86 shown in FIG. 19, on the other hand, the whole areas of side surfaces of a semiconductor chip 72 are covered with a sealing resin layer 87. In other words, the sealing resin layer 87 stacked on an organic insulating film 85 covers front surfaces of the organic insulating film 85 and rewires 76 and the whole areas of the side surfaces of the semiconductor chip 72, and seals a front surface and side surfaces of the semiconductor device 86 (the semiconductor chip 72). Portions of the sealing resin layer 87 covering the side surfaces of the semiconductor chip 72 form shielding films 88 for preventing penetration of infrared rays into the inner portion of the semiconductor chip 72. The shielding films 88 are formed into a thickness of not less than 5 μm and not more than 50 μm, for example.

FIGS. 20A to 20H are schematic sectional views showing a method for manufacturing the semiconductor device shown in FIG. 19 in step order. Referring to FIGS. 20A to 20H, portions corresponding to the respective parts of the portions shown in FIGS. 18A to 18J are denoted by the same reference numerals as the reference numerals assigned to the respective parts.

Manufacturing of the semiconductor device 86 is progressed in a state of a wafer before the semiconductor chip 72 is cut into an individual piece. A passivation film 73 is formed on the front surface of the semiconductor chip 72 (the wafer). The organic insulating film 85 is formed on the passivation film 73.

Figure 20A:
FIG. 20A A schematic sectional view showing a state in the process of manufacturing the semiconductor device shown in FIG. 19.

First, a plurality of pad openings 75 are formed in the organic insulating film 85 by photolithography and etching, as shown in FIG. 20A.

Figure 20B:
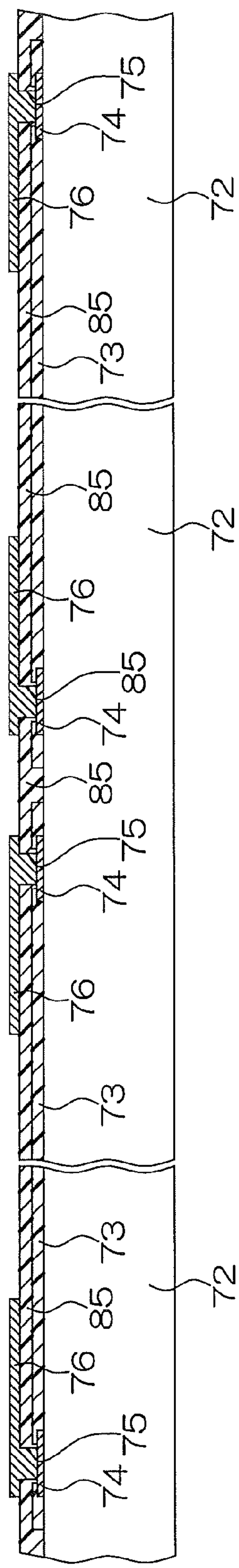
FIG. 20B A schematic sectional view showing a step subsequent to FIG. 20A.

Then, a plating layer made of the material for the rewires 76 is formed on the organic insulating film 85 and electrode pads 74 exposed from the respective pad openings 75, and the plating layer is patterned into the plurality of rewires 76 by photolithography and etching, as shown in FIG. 20B.

Figure 20C:
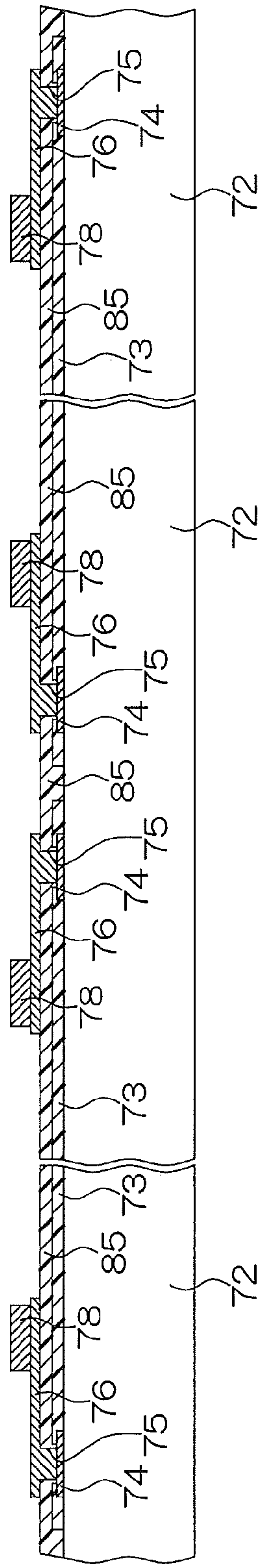
FIG. 20C A schematic sectional view showing a step subsequent to FIG. 20B.

Thereafter columnar posts 78 are formed on the respective rewires 76, as shown in FIG. 20C. The posts 78 can be formed by forming a mask having openings corresponding to portions where the posts 78 are formed on the organic insulating film 85 and the rewires 76, thereafter growing copper which is the material for the posts 78 in the openings of the mask by plating, and thereafter removing the mask, for example. The posts 78 can also be formed by forming a copper film (not shown) on the organic insulating film 85 and the rewires 76 by plating and thereafter selectively removing the copper film by photolithography and etching.

Figure 20D:
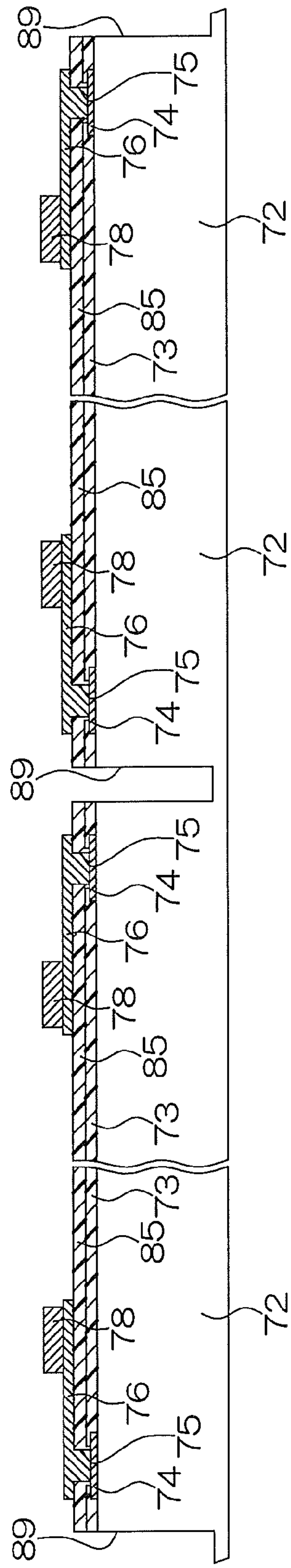
FIG. 20D A schematic sectional view showing a step subsequent to FIG. 20C.

Then, dicing blades (not shown) are advanced from the side of the front surface of the semiconductor chip 72, whereby trenches 89 are formed on dicing lines set along peripheral edges of each semiconductor chip 72, as shown in FIG. 20D. The trenches 89 are dug down to such a depth that bottom surfaces thereof reach positions in the vicinity of the rear surface of the semiconductor chip 72. Further, the trenches 89 are so formed that the width between side surfaces thereof is constant in the depth direction thereof.

Figure 20E:
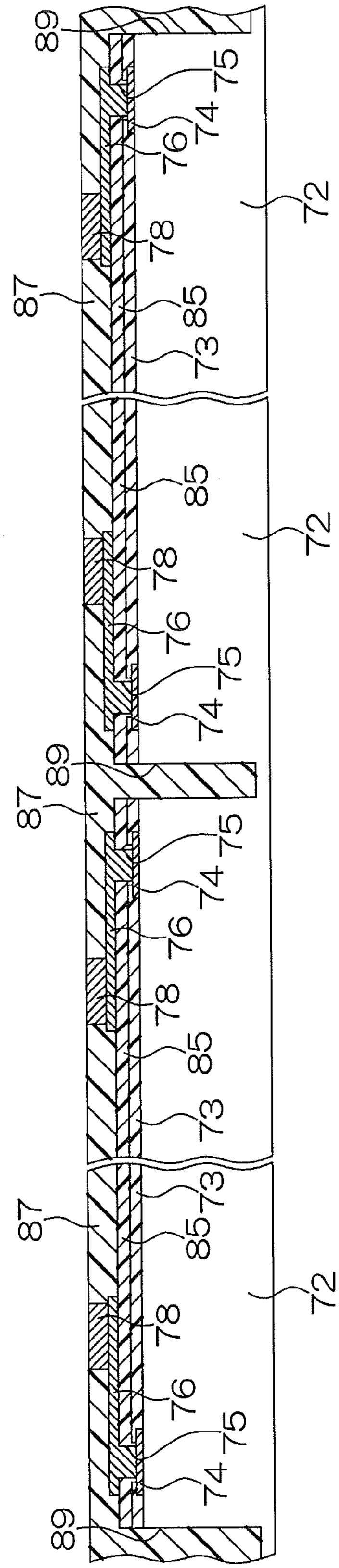
FIG. 20E A schematic sectional view showing a step subsequent to FIG. 20D.

Then, liquid resin (epoxy resin, for example) which is the material for the sealing resin layer 87 is supplied onto the organic insulating film 85 and into the trenches 89. The liquid resin is supplied up to such a height that the same fills up the inner portions of the trenches 89 and buries the posts 78 therein. Then, after a treatment for hardening the resin is performed, the sealing resin layer 87 is polished from the side of the front surface thereof. This polishing of the sealing resin layer 87 is continued until forward end surfaces of the posts 78 are flush with the front surface of the sealing resin layer 87, as shown in FIG. 20E.

Figure 20F:
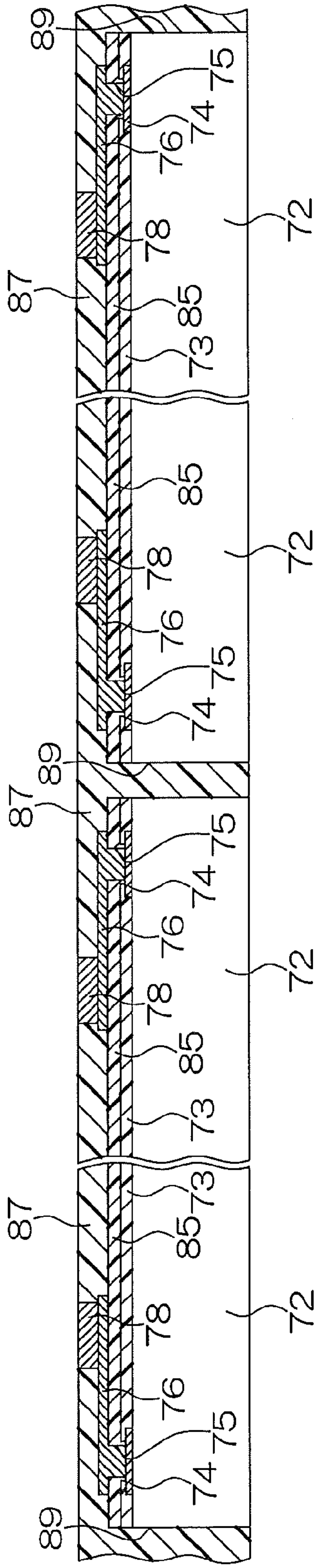
FIG. 20F A schematic sectional view showing a step subsequent to FIG. 20E.

Then, the semiconductor chip 72 (the wafer) is polished from the side of the rear surface thereof. This polishing of the semiconductor chip 72 is performed until portions of the semiconductor chip 72 formed under the trenches 89 are completely removed and lower end portions of the sealing resin layer 87 filling up the trenches 89 are exposed on the side of the rear surface of the semiconductor chip 72, as shown in FIG. 20F.

Figure 20G:
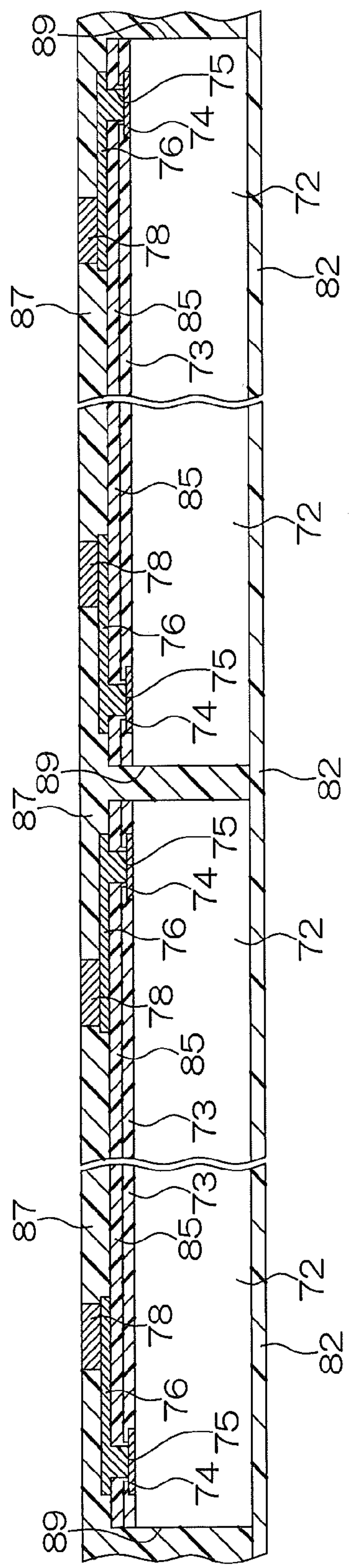
FIG. 20G A schematic sectional view showing a step subsequent to FIG. 20F.

Thereafter the rear surface covering film 82 is formed on the whole area of the rear surface of the semiconductor chip 72 (the wafer), as shown in FIG. 20G. The rear surface covering film 82 can be formed by coating (spin-coating) the whole area of the rear surface of the semiconductor wafer with a resin material and hardening the resin material, for example. The rear surface covering film 82 can also be formed by sticking a resin film formed in a filmlike manner to the whole area of the rear surface of the semiconductor chip 72 (the wafer).

Figure 20H:
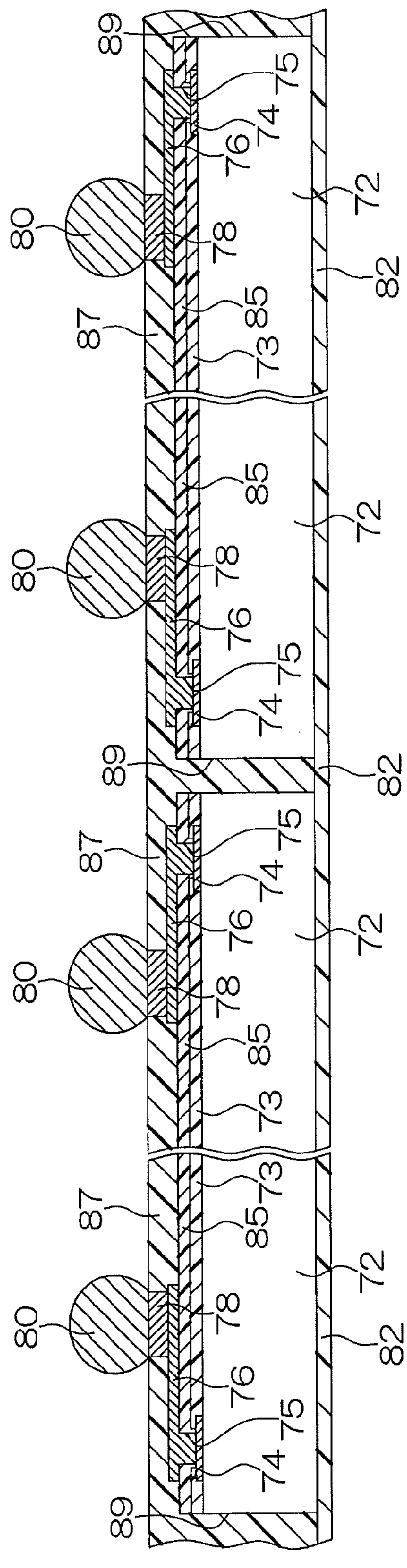
FIG. 20H A schematic sectional view showing a step subsequent to FIG. 20G.

Then, solder balls 80 are arranged on the forward end surfaces of the respective posts 78, as shown in FIG. 20H. Thereafter the rear surface covering film 82 and the sealing resin layer 87 are cut on the dicing lines with dicing blades (not shown). As the dicing blades, those having a smaller thickness than the dicing blades employed for forming the trenches 89 in the step shown in FIG. 20D are employed. Thus, the sealing resin layer 87 is left on the inner surfaces of the trenches 89 (side surfaces of the semiconductor chip 72), and the left portions become the shielding films 88.

Also in the structure of the semiconductor device 86 obtained in this manner, effects similar to those of the structure of the semiconductor device 71 shown in FIG. 17 can be attained.

Tenth Embodiment

Figure 21:
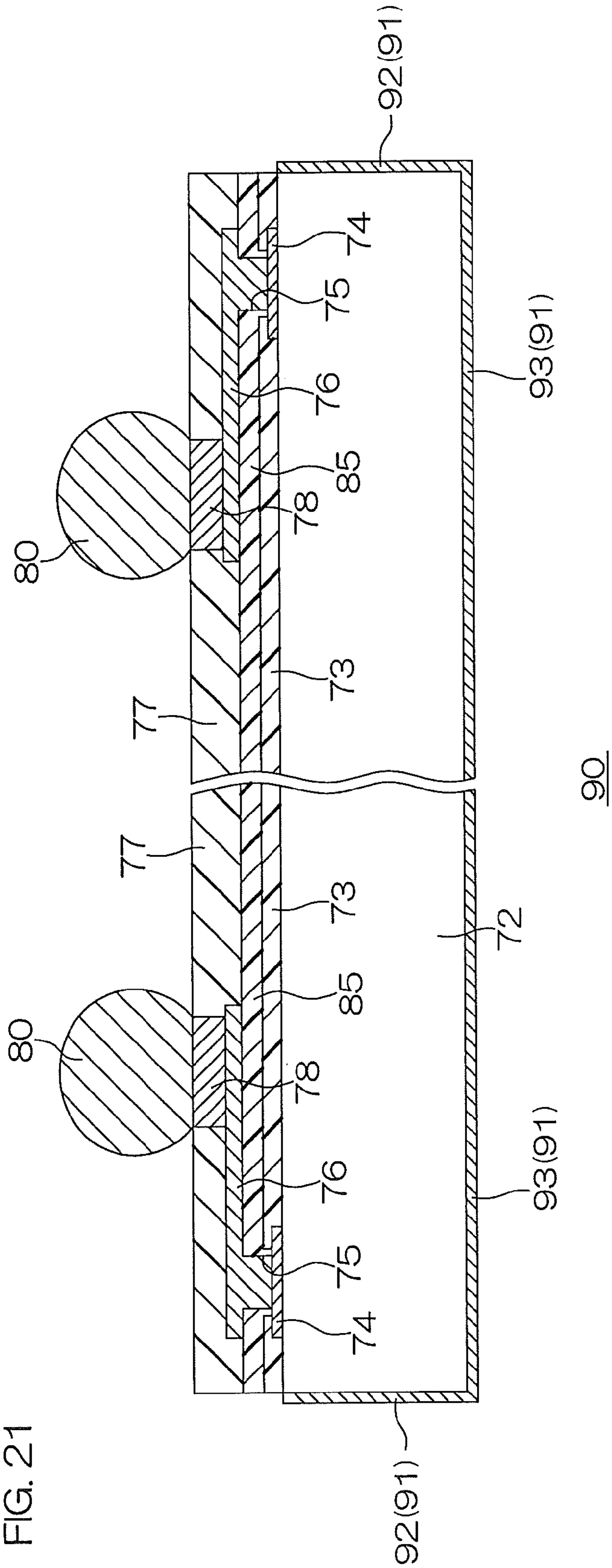
FIG. 21 A schematic sectional view of a semiconductor device according to a tenth embodiment of the present invention, showing a section taken along the same cutting plane line as the section of the semiconductor device of FIG. 17.

FIG. 21 is a schematic sectional view of a semiconductor device according to a tenth embodiment of the present invention, showing a section taken along the same cutting plane line as the section of the semiconductor device of FIG. 17. Referring to FIG. 21, portions corresponding to the respective parts of the portions shown in FIG. 17 are denoted by the same reference numerals as the reference numerals assigned to the respective parts. In the following, description as to the portions denoted by the same reference numerals is omitted.

In the semiconductor device 71 shown in FIG. 17, it has been assumed that the shielding films 81 made of the metallic material and the rear surface covering film 82 made of the resin material are separately formed. In a semiconductor device 90 shown in FIG. 21, on the other hand, the whole areas of side surfaces and a rear surface of a semiconductor chip 72 are covered with a protective film 91. In other words, the protective film 91 integrally includes shielding films 92 covering the whole areas of the side surfaces of the semiconductor chip 72 and a rear surface covering film 93 covering the whole area of the rear surface of the semiconductor chip 72. The protective film 91 is made of a metallic material having shielding properties against infrared rays. As metallic materials having shielding properties against infrared rays, Pd, Ni, Ti, Cr and TiW etc. can be illustrated, for example. The thickness of portions of the protective film 91 forming the shielding films 92 is not less than 0.1 μm and not more than 10 μm, for example. The thickness of a portion of the protective film 91 forming the rear surface covering film 93 is not less than 5 μm and not more than 50 μm, for example.

FIGS. 22A to 22I are schematic sectional views showing a method for manufacturing the semiconductor device shown in FIG. 21 in step order. Referring to FIGS. 22A to 22I, portions corresponding to the respective parts of the portions shown in FIGS. 18A to 18J are denoted by the same reference numerals as the reference numerals assigned to the respective parts.

Manufacturing of the semiconductor device 90 is progressed in a state of a wafer before the semiconductor chip 72 is cut into an individual piece. A passivation film 73 is formed on a front surface of the semiconductor chip 72 (the wafer). An organic insulating film 85 is formed on the passivation film 73.

Figure 22A:
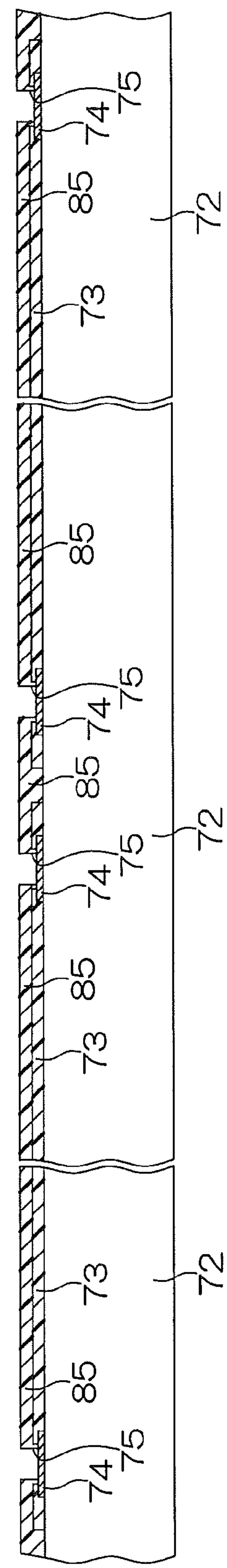
FIG. 22A A schematic sectional view showing a state in the process of manufacturing the semiconductor device shown in FIG. 21.

First, a plurality of pad openings 75 are formed in the organic insulating film 85 by photolithography and etching, as shown in FIG. 22A.

Figure 22B:
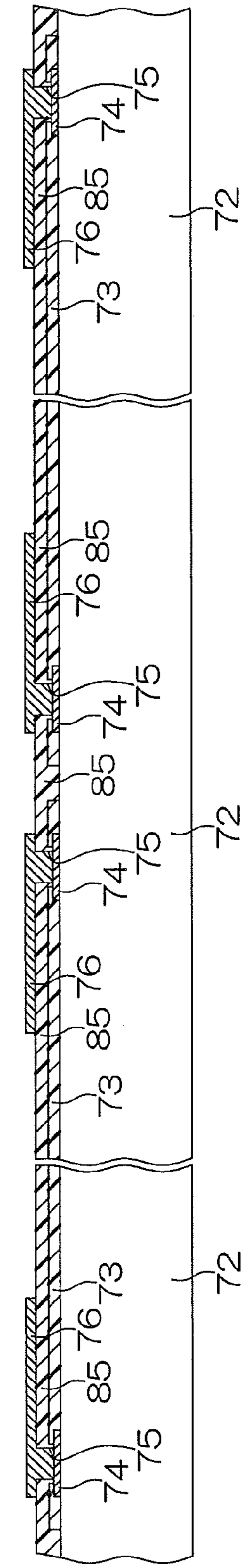
FIG. 22B A schematic sectional view showing a step subsequent to FIG. 22A.

Then, a plating layer made of the material for rewires 76 is formed on the organic insulating film 85 and electrode pads 74 exposed from the respective pad openings 75, and the plating layer is patterned into the plurality of rewires 76 by photolithography and etching, as shown in FIG. 22B.

Figure 22C:
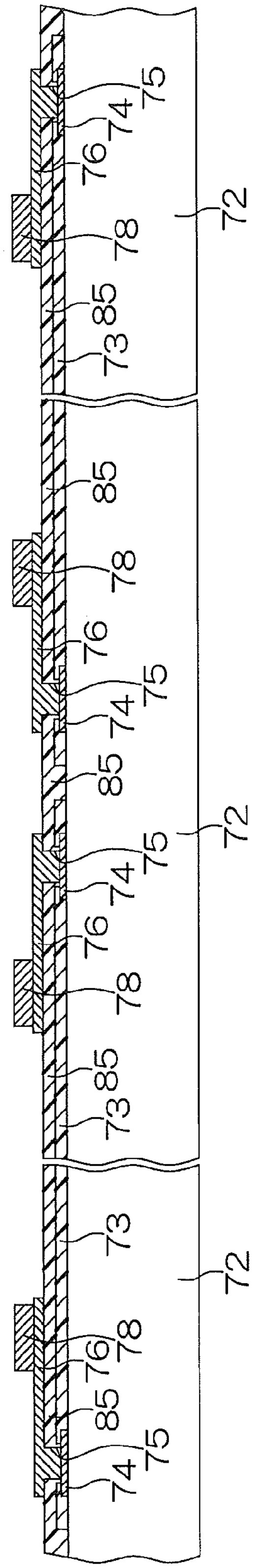
FIG. 22C A schematic sectional view showing a step subsequent to FIG. 22B.

Thereafter columnar posts 78 are formed on the respective rewires 76, as shown in FIG. 22C. The posts 78 can be formed by forming a mask having openings corresponding to portions where the posts 78 are formed on the organic insulating film 85 and the rewires 76, thereafter growing copper which is the material for the posts 78 in the openings of the mask and thereafter removing the mask, for example. The posts 78 can also be formed by forming a copper film (not shown) on the organic insulating film 85 and the rewires 76 by plating and thereafter selectively removing the copper film by photolithography and etching.

Figure 22D:
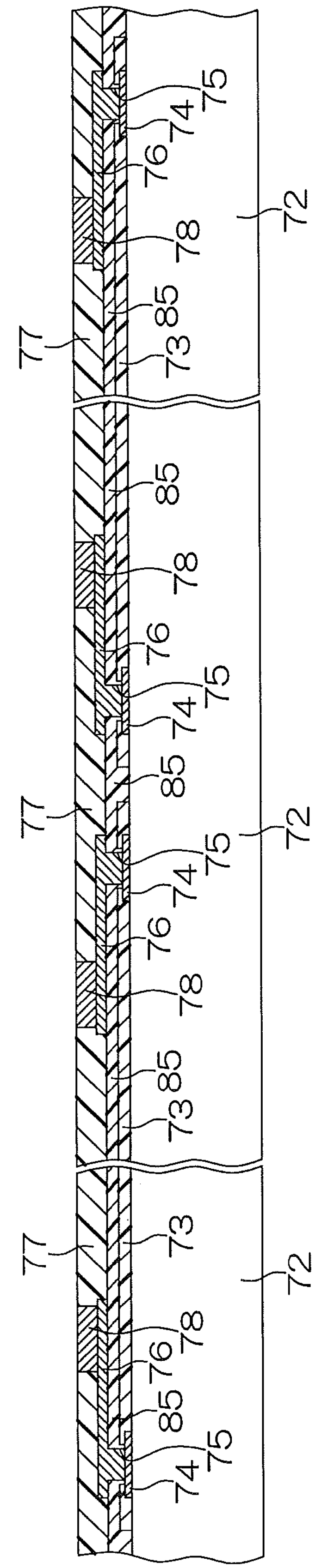
FIG. 22D A schematic sectional view showing a step subsequent to FIG. 22C.

Then, liquid resin (epoxy resin, for example) which is the material for a sealing resin layer 77 is supplied onto the organic insulating film 85. The liquid resin is supplied up to such a height that the same buries the posts 78 therein. Then, after a treatment for hardening the resin is performed, the sealing resin layer 77 is polished from the side of a front surface thereof. This polishing of the sealing resin layer 77 is continued until forward end surfaces of the posts 78 are flush with the front surface of the sealing resin layer 77, as shown in FIG. 22D.

Figure 22E:
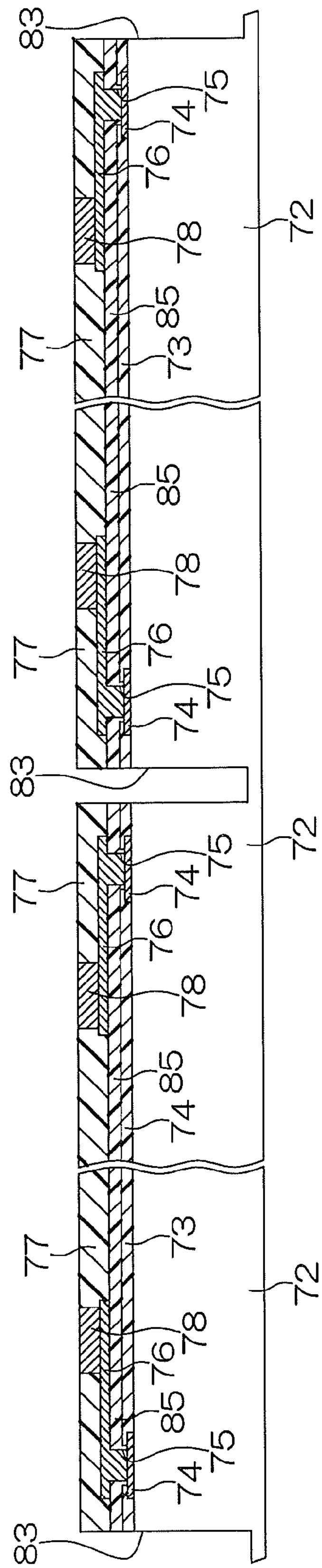
FIG. 22E A schematic sectional view showing a step subsequent to FIG. 22D.

Then, dicing blades (not shown) are advanced from the side of the front surface of the semiconductor chip 72, whereby trenches 83 dug down from the front surface of the sealing resin layer 77 are formed on dicing lines set along peripheral edges of each semiconductor chip 72, as shown in FIG. 22E.

Figure 22F:
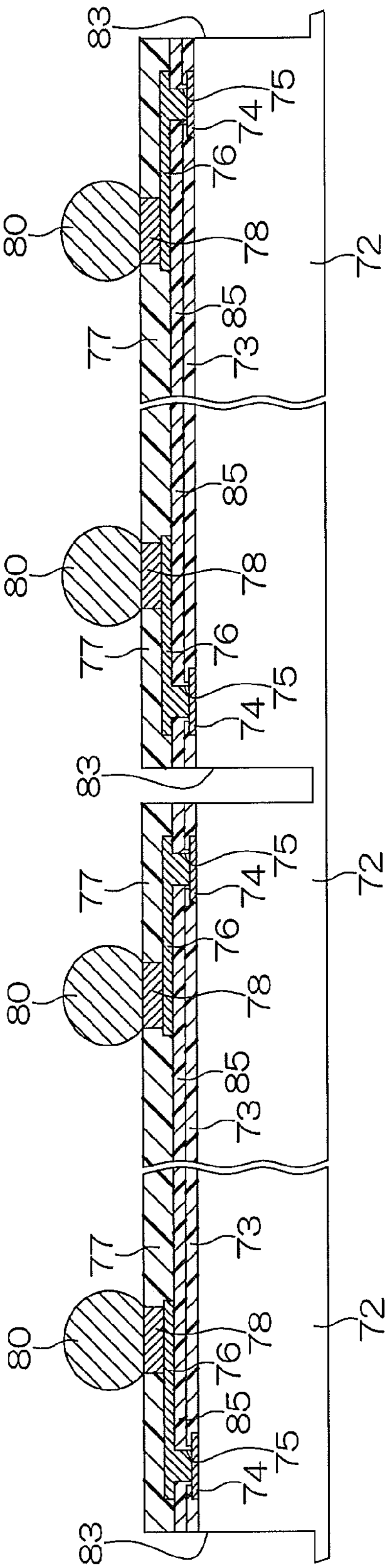
FIG. 22F A schematic sectional view showing a step subsequent to FIG. 22E.

Thereafter solder balls 80 are arranged on the forward end surfaces of the posts 78, as shown in FIG. 22F.

Figure 22G:
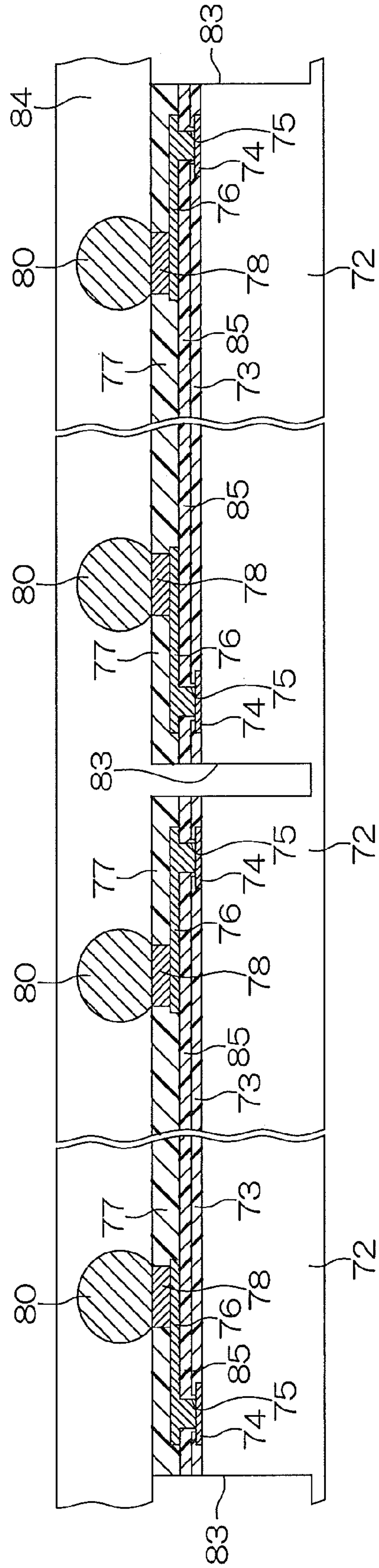
FIG. 22G A schematic sectional view showing a step subsequent to FIG. 22F.

Then, the solder balls 80 are arranged on an adhesive surface of a dicing tape 84, and the wafer is supported on the dicing tape 84, as shown in FIG. 22G.

Figure 22H:
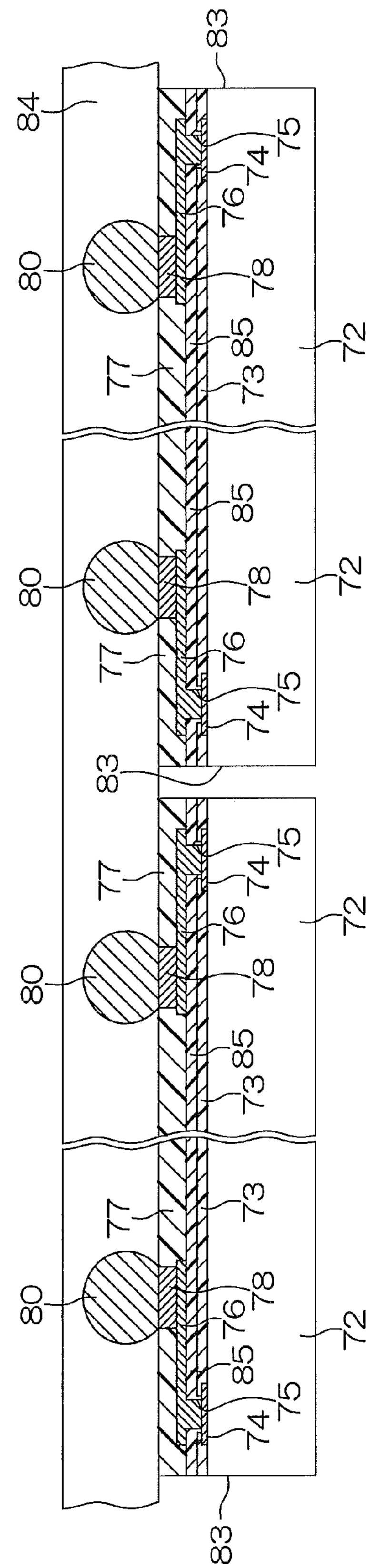
FIG. 22H A schematic sectional view showing a step subsequent to FIG. 22G.
Figure 22:
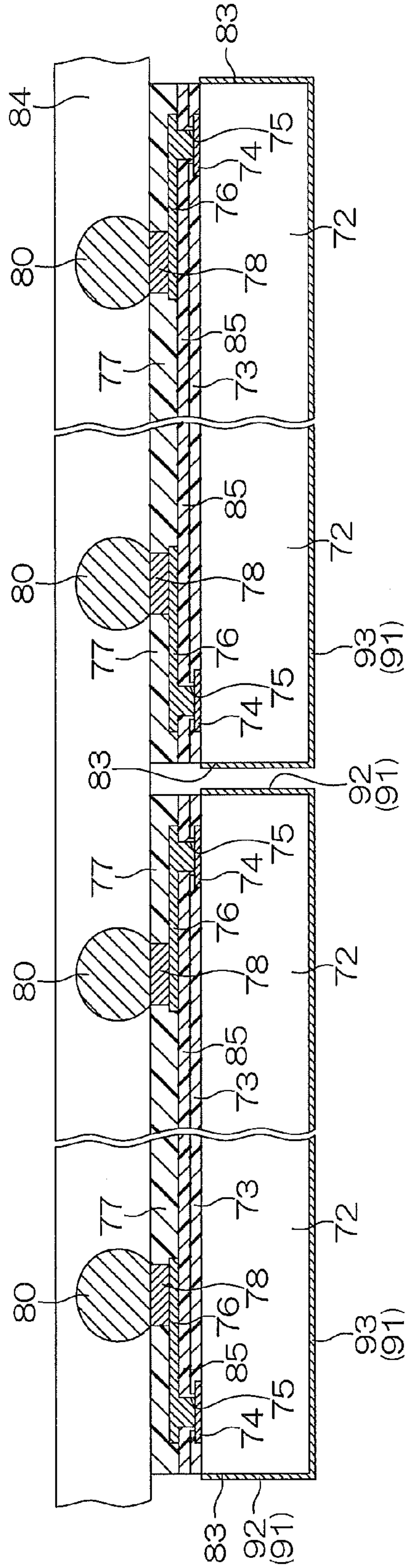
FIG. 22I A schematic sectional view showing a step subsequent to FIG. 22H.

Then, the semiconductor chip 72 (the wafer) is polished from the side of the rear surface thereof. This polishing of the semiconductor chip 72 is performed until portions of the semiconductor chip 72 formed under the trenches 83 are completely removed and inner sides of the trenches 83 and the side of the rear surface of the semiconductor chip 72 communicate with one another, as shown in FIG. 22H.

Thereafter the protective film 91 is applied to the whole area of the rear surface of the semiconductor chip 72 (the wafer) and the whole areas of portions of the semiconductor chip 72 facing side surfaces of the trenches 83, as shown in FIG. 22I. The protective film 91 may be formed by evaporating a metal consisting of the material for the protective film 91 onto the rear surface of the semiconductor chip 72 and the side surfaces of the trenches 83, or may be formed by electroless plating.

When the dicing tape 84 is detached, the semiconductor device 90 shown in FIG. 21 is obtained.

Also in this structure of the semiconductor device 90, effects similar to those of the semiconductor device 71 shown in FIG. 17 can be attained.

Eleventh Embodiment

Figure 23:
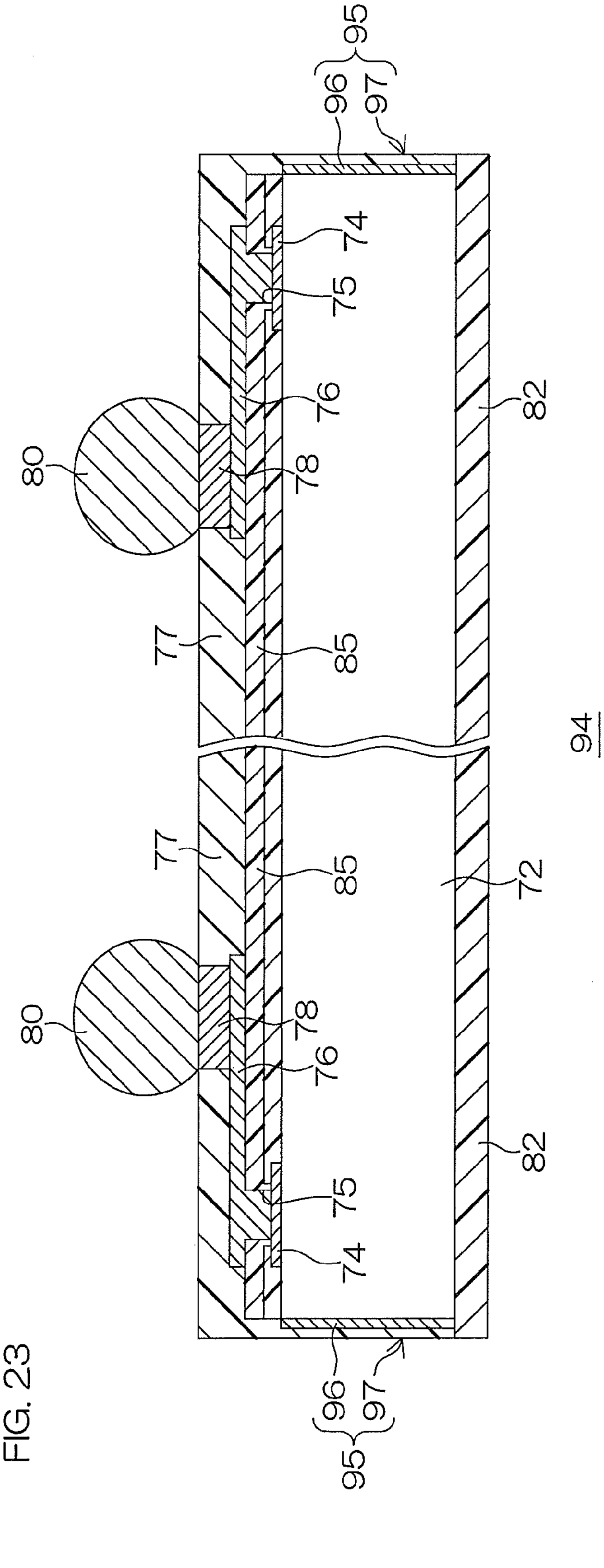
FIG. 23 A schematic sectional view of a semiconductor device according to an eleventh embodiment of the present invention, showing a section taken along the same cutting plane line as the section of the semiconductor device of FIG. 17.

FIG. 23 is a schematic sectional view of a semiconductor device according to an eleventh embodiment of the present invention, showing a section taken along the same cutting plane line as the section of the semiconductor device of FIG. 17. Referring to FIG. 23, portions corresponding to the respective portions shown in FIG. 17 are denoted by the same reference numerals as the reference numerals assigned to the respective portions. In the following, description as to the portions denoted by the same reference numerals is omitted.

In a semiconductor device 94, shielding films 95 covering side surfaces of a semiconductor chip 72 have multilayer structures of metal layers 96 made of a metallic material and resin layers 97 made of a resin material. The metal layers 96 are made of Pd, Ni, Ti, Cr or TiW, for example. The resin layers 97 are made of a resin material such as epoxy resin, polyamide imide, polyamide, polyimide or phenol, for example.

The semiconductor device 94 having such shielding films 95 is obtained by carrying out the steps described below subsequently to the steps shown in FIGS. 18A to 18C.

First, dicing blades (not shown) are advanced from the side of a front surface of the semiconductor chip 72, whereby trenches 83 are formed on dicing lines set along peripheral edges of each semiconductor chip 72. The trenches 83 are dug down to such a depth that bottom surfaces thereof reach positions in the vicinity of a rear surface of the semiconductor chip 72. Further, the trenches 83 are so formed that the width between side surfaces thereof is constant in the depth direction thereof.

Then, the metal layers 96 are applied to the whole areas of inner surfaces of the trenches 83. The metal layers 96 may be formed by evaporating a metal consisting of the material for the metal layers 96 onto the inner surfaces of the trenches 83, or may be formed by electroless plating, for example.

Thereafter liquid resin which is the material for a sealing resin layer 77 is supplied onto the metal layers 96 and onto the semiconductor chip 72 including an organic insulating film 85. The liquid resin is supplied up to such a height that the same fills up the trenches 83 and buries the posts 78 therein. Then, after a treatment for hardening the resin is performed, the sealing resin layer 77 is polished from the side of a front surface thereof.

Then, solder balls 80 are arranged on forward end surfaces of the posts 78.

Then, the solder balls 80 are arranged on an adhesive surface of a dicing tape 84, and the wafer is supported on the dicing tape 84.

Then, the semiconductor chip 72 (the wafer) is polished from the side of the rear surface thereof. This polishing of the semiconductor chip 72 is performed until portions of the semiconductor chip 72 formed under the trenches 83 are completely removed and portions of the sealing resin layer 77 formed in the trenches 83 are exposed on the side of the rear surface of the semiconductor chip 72. At this time, portions of the metal layers 96 applied to the bottom surfaces of the trenches 83 are removed.

Thereafter a rear surface covering film 82 is formed on the whole area of the rear surface of the semiconductor chip 72 (the wafer). The rear surface covering film 82 can be formed by coating (spin-coating) the whole area of the rear surface of the wafer with a resin material and hardening the resin material, for example. The rear surface covering film 82 can also be formed by sticking a resin film formed in a filmlike manner to the whole area of the rear surface of the wafer.

Then, the rear surface covering film 82 and the sealing resin layer 77 are cut on the dicing lines with dicing blades (not shown). As the dicing blades, those having a smaller thickness than the dicing blades employed for forming the trenches 83 are employed. Thus, the sealing resin layer 77 is left on front surfaces of the metal layers 96, and the left portions become the resin layers 97. When the dicing tape 84 is thereafter removed, the semiconductor device 94 shown in FIG. 23 is obtained.

Also in the structure of the semiconductor device 94 obtained in this manner, effects similar to those of the structure of the semiconductor device 71 shown in FIG. 17 can be attained.

Twelfth Embodiment

Figure 24:
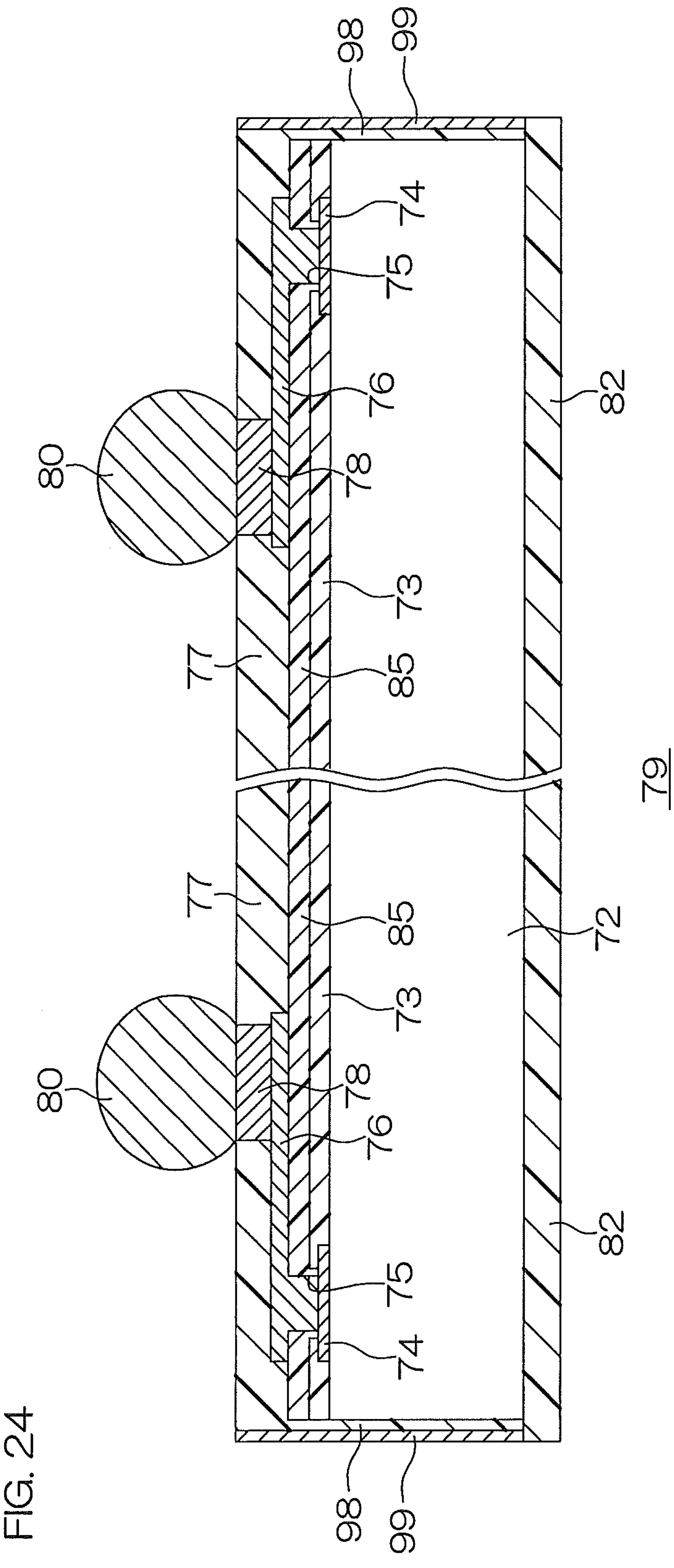
FIG. 24 A schematic sectional view of a semiconductor device according to a twelfth embodiment of the present invention, showing a section taken along the same cutting plane line as the section of the semiconductor device of FIG. 17.

FIG. 24 is a schematic sectional view of a semiconductor device according to a twelfth embodiment of the present invention, showing a section taken along the same cutting plane line as the section of the semiconductor device of FIG. 17.

Referring to FIG. 24, portions corresponding to the respective portions shown in FIG. 17 are denoted by the same reference numerals as the reference numerals assigned to the respective portions. In the following, description as to the portions denoted by the same reference numerals is omitted.

In a semiconductor device 79, a sealing resin layer 77 extends up to side surfaces of a semiconductor chip 72, and forms side surface covering films 98 covering the side surfaces. Further, metal films 99 are formed on outer sides of the sealing resin layer 77 (peripheral edge sides of the semiconductor chip 72). Thus, the side surfaces of the semiconductor chip 72 are covered with the side surface covering films 98 and the metal films 99, and shielding films are formed by the side surface covering films 98 and the metal films 99. The metal films 99 are made of Pd, Ni, Ti, Cr or TiW, for example.

Also in the structure of such a semiconductor device 79, effects similar to those of the structure of the semiconductor device 71 shown in FIG. 17 can be attained.

While the eighth to twelfth embodiments of the present invention have been described, the present invention may be embodied in other ways.

Figure 25:
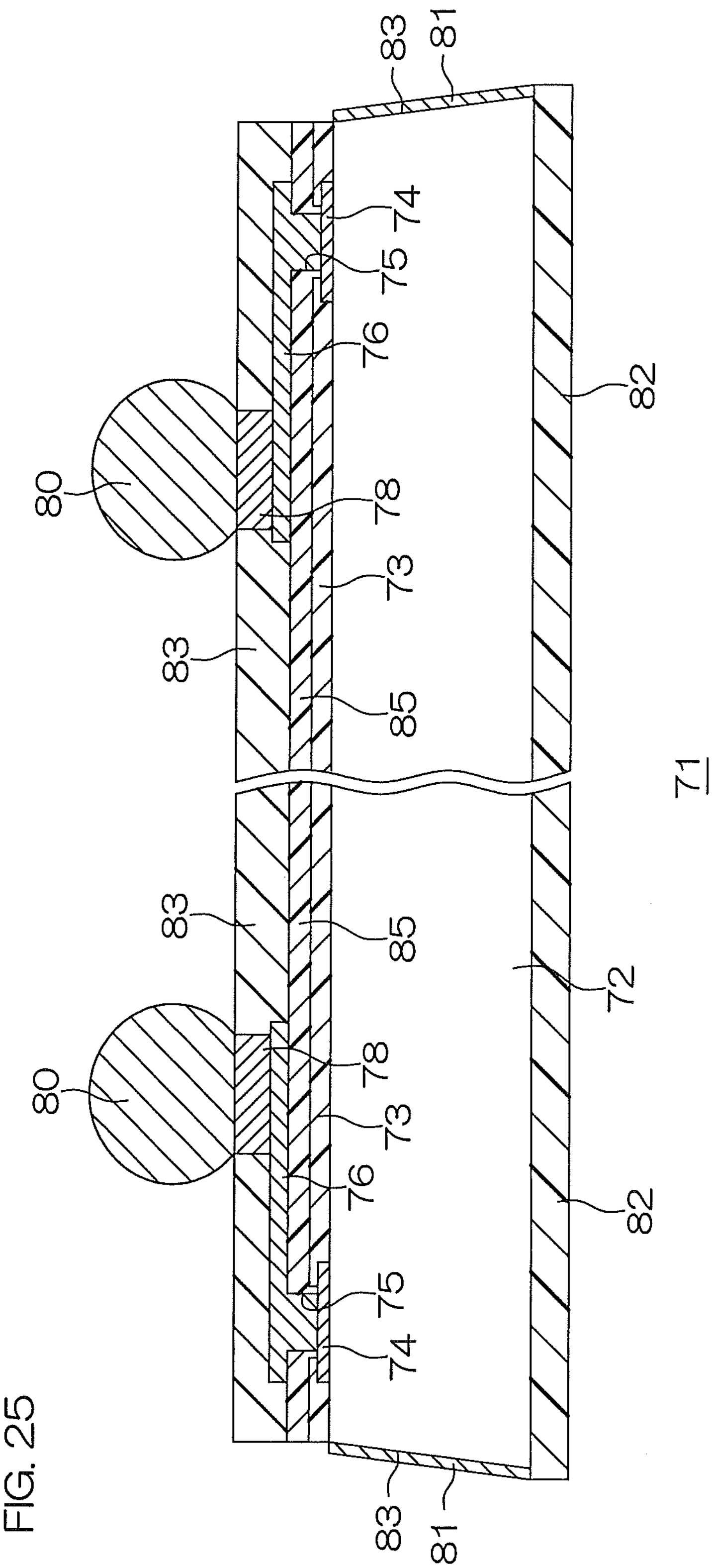
FIG. 25 A schematic sectional view showing a modification of the semiconductor device shown in FIG. 17.

For example, side surfaces of trenches 83 may be provided in such tapered shapes that the interval therebetween widens as reaching the side of a front surface of a semiconductor chip 72, as shown in FIG. 25.

Such tapered trenches 83 can be formed by employing those having cutting blades, generally U-shaped in section, whose thicknesses decrease as approaching cutting edges as the dicing blades advanced from the side of the front surface of the semiconductor chip 72 in the step shown in FIG. 18E, for example.

While such a structure that the metallic material having shielding properties against infrared rays is employed as the material for the shielding films 81 and the resin material is employed as the material for the rear surface covering film 82 has been adopted in the semiconductor device 71 shown in FIG. 17, a resin material my be employed as the material for the shielding films 81, and a metallic material (Pd, Ni, Ti, Cr or TiW, for example) having shielding properties against infrared rays may be employed as the material for the rear surface covering film 82. In this case, a resin material having shielding properties against infrared rays such as epoxy resin, polyamide imide, polyamide, polyimide or phenol, for example, is preferably employed as the resin material which is the material for the shielding films 81.

While the present invention has been described in detail by way of the embodiments thereof, it should be understood that these embodiments are merely illustrative of the technical principles of the present invention but not limitative of the invention. The spirit and scope of the present invention are to be limited only by the appended claims.

The elements shown in the embodiments of the present invention can be combined in the range of the present invention.

This application corresponds to Japanese Patent Application No. 2009-256876 filed with the Japan Patent Office on Nov. 10, 2009 and Japanese Patent Application No. 2009-268533 filed with the Japan Patent Office on Nov. 26, 2009, the disclosures of which are incorporated herein by reference.

DESCRIPTION OF THE REFERENCE NUMERALS

1 . . . semiconductor device, 2 . . . semiconductor chip, 3 . . . front surface (of semiconductor chip), 4 . . . side surface (of semiconductor chip), 5 . . . rear surface (of semiconductor chip), 7 . . . electrode pad, 8 . . . pad opening, 9 . . . sealing resin layer, 10 . . . front surface (of sealing resin layer), 11 . . . side surface (of sealing resin layer), 12 . . . post, 13 . . . forward end surface (of post), 14 . . . side surface (of post), 15 . . . arcuate surface (of post), 16 . . . planar surface (side surface) (of post), 17 . . . solder ball, 18 . . . shielding film, 19 . . . rear surface covering film, 20 . . . wafer, 22 . . . trench, 23 . . . first portion (of shielding film), 24 . . . second portion (of shielding film), 25 . . . protective layer, 31 . . . semiconductor device, 32 . . . shielding film, 34 . . . trench, 35 . . . resin material layer, 41 . . . semiconductor device, 42 . . . protective film, 43 . . . shielding film, 44 . . . rear surface covering film, 45 . . . semiconductor device, 46 . . . shielding film, 47 . . . metal layer, 48 . . . resin layer, 49 . . . resin material layer, 50 . . . first portion (of metal layer), 51 . . . second portion (of metal layer), 53 . . . semiconductor device, 54 . . . shielding film, 55 . . . resin layer, 56 . . . metal layer, 57 . . . semiconductor device, 58 . . . trench, 60 . . . semiconductor device, 61 . . . solder ball, 62 . . . ball side surface, 63 . . . covering portion, 71 . . . semiconductor device, 72 . . . semiconductor chip,

74 . . . electrode pad, 75 . . . pad opening, 77 . . . sealing resin layer, 78 . . . post, 79 . . . semiconductor device, 80 . . . solder ball, 81 . . . shielding film, 82 . . . rear surface covering film, 83 . . . trench, 86 . . . semiconductor device, 87 . . . sealing resin layer, 88 . . . shielding film, 89 . . . trench, 90 . . . semiconductor device, 91 . . . protective film, 92 . . . shielding film, 93 . . . rear surface covering film, 94 . . . semiconductor device, 95 . . . shielding film, 96 . . . metal layer, 97 . . . resin layer, 98 . . . side surface covering film, 99 . . . metal film

The invention claimed is:

1. A method for manufacturing a semiconductor device, comprising:

a post forming step of, in a state where a plurality of semiconductor chips having front surfaces and rear surfaces form a semiconductor wafer which is an aggregate of the semiconductor chips, forming a pillar like post on the front surfaces of the semiconductor chips;

a sealing step of forming a sealing resin layer having a front surface flush with a forward end surface of the post on the front surface of the semiconductor wafer;

after the sealing step, a trench forming step of forming a trench dug down from the front surface of the sealing resin layer to a middle of the semiconductor wafer on a dicing line set along a peripheral edge of the semiconductor chips and exposing a side surface of the post and a side surface of the semiconductor chips as part of an inner surface of the trench;

after the trench forming step, a covering film forming step of forming a covering film so as to cover the side surface of the semiconductor chips;

after the covering film forming step, a terminal forming step of forming a terminal bulging with respect to the front surface of the sealing resin layer so that the terminal straddles over the forward end surface and the side surface of the post so as to overlap the covering film in a plan view; and after the terminal forming step, a step of dividing the semiconductor wafer into each of the semiconductor chips along the dicing line by removing a bottom portion of the trench.

2. The method for manufacturing a semiconductor device according to claim 1, wherein the sealing step includes:

a resin covering step of forming the sealing resin layer on the front surfaces of the semiconductor wafers to completely cover the post; and a polishing step of polishing the sealing resin layer until the forward end surface of the post is exposed from the sealing resin layer.

3. The method for manufacturing a semiconductor device according to claim 1, wherein the step of dividing the semiconductor wafer into the semiconductor chips includes a dicing step of making an inner side of the trench and a side of the rear surface of the semiconductor wafer communicate with each other by digging down the semiconductor wafer from the rear surface of the semiconductor wafer.

4. The method for manufacturing a semiconductor device according to claim 1, wherein the step of dividing the semiconductor wafer into each of the semiconductor chips includes a dicing step of making an inner side of the trench and a side of the rear surface of the semiconductor wafer communicate with each other by digging down the semiconductor wafer from the inner side of the trench.

5. The method for manufacturing a semiconductor device according to claim 1, wherein, the covering film forming step includes a step of forming a shielding film, as the covering film, on the side surface of the semiconductor chips exposed as part of the inner surface of the trench by applying a shielding material having shielding properties against infrared rays to the inner surface of the trench in advance of the terminal forming step; and a rear surface polishing step of making the trench provided with the shielding film penetrate toward a side of the rear surface of the semiconductor wafer by polishing the semiconductor wafer from the side of the rear surface after the terminal forming step.

6. The method for manufacturing a semiconductor device according to claim 5, wherein the step of forming the shielding film includes:

a step of forming a first shielding film on the whole areas of the side surface of the post and the side surface of the semiconductor chips exposed as parts of the inner surface of the trench respectively;

a step of covering a first portion of the first shielding film on the side surface of the semiconductor chips with a second shielding film made of a material having an etching selection ratio with respect to the first shielding film and shielding properties against infrared rays;

a step of selectively removing a second portion of the first shielding film on the side surface of the post in a state of protecting the first portion of the first shielding film with the second shielding film; and a step of forming the shielding film to have a multilayer structure of the first shielding film and the second shielding film by selectively removing a portion of the second shielding film after removing the second portion of the first shielding film.

7. The method for manufacturing a semiconductor device according to claim 6, wherein one of the first shielding film and the second shielding film is made of a metallic material, and the other one is made of a resin material.

8. The method for manufacturing a semiconductor device according to claim 5, further comprising a step of forming a rear surface covering film covering the rear surface of the semiconductor wafer on the rear surface exposed by the rear surface polishing step.

9. The method for manufacturing a semiconductor device according to claim 8, wherein the step of forming the shielding film includes:

a step of forming the shielding film on the whole areas of the side surface of the post and the side surface of the semiconductor chips exposed as parts of the inner surface of the trench respectively;

a step of covering a first portion of the shielding film on the side surface of the semiconductor chips with a protective layer made of a material having an etching selection ratio with respect to the shielding film;

a step of selectively removing a second portion of the shielding film on the side surface of the post in a state of protecting the first portion of the shielding film with the protective layer; and a step of completely removing the protective layer after removing the second portion of the shielding film.

10. The method for manufacturing a semiconductor device according to claim 9, wherein the step of forming the rear surface covering film includes a step of forming the rear surface covering film to collectively cover the rear surfaces of the semiconductor chips, and the step of dividing the semiconductor wafer into each of the semiconductor chips includes a step of cutting the rear surface covering film collectively covering the rear surfaces of the semiconductor chips on the dicing line.

11. The method for manufacturing a semiconductor device according to claim 9, wherein the step of forming the rear surface covering film includes a step of forming films individually covering the rear surfaces of the plurality of semiconductor chips, and the rear surface polishing step serves also as the step of dividing the semiconductor wafer into each of the semiconductor chips.

12. The method for manufacturing a semiconductor device according to claim 8, wherein the step of forming the shielding film includes:

a step of forming a first shielding film on the whole areas of the side surface of the post and the side surface of the semiconductor chips exposed as parts of the inner surface of the trench respectively;

a step of covering a first portion of the first shielding film on the side surface of the semiconductor chips with a second shielding film made of a material having an etching selection ratio with respect to the first shielding film and shielding properties against infrared rays;

a step of selectively removing a second portion of the first shielding film on the side surface of the post in a state of protecting the first portion of the first shielding film with the second shielding film; and a step of forming the shielding film, having a multilayer structure of the first shielding film and the second shielding film, by selectively removing a portion of the second shielding film after removing the second portion of the first shielding film.

13. The method for manufacturing a semiconductor device according to claim 12, wherein one of the first shielding film and the second shielding film is made of a metallic material, and the other one is made of a resin material.

14. The method for manufacturing a semiconductor device according to claim 5, wherein the step of forming the shielding film includes:

a step of forming the shielding film on the whole areas of the side surface of the post and the side surface of the semiconductor chips exposed as parts of the inner surface of the trench respectively;

a step of covering a first portion of the shielding film on the side surface of the semiconductor chips with a protective layer made of a material having an etching selection ratio with respect to the shielding film;

a step of selectively removing a second portion of the shielding film on the side surface of the post in a state of protecting the first portion of the shielding film with the protective layer; and a step of completely removing the protective layer after removing the second portion of the shielding film.

15. The method for manufacturing a semiconductor device according to claim 1, further comprising a step of forming a temporary trench having the same shape as the trench to be along a line for forming the trench in advance of the sealing step, wherein the sealing step includes a step of charging a resin material into the temporary trench simultaneously with the formation of the sealing resin layer, and the trench forming step further includes a step of exposing the side surface of the post by selectively removing the charged resin material with a first blade having the same width as the width of the temporary trench, and the covering film forming step includes forming a shielding film, that is the covering film, made of the resin material on the side surface of the semiconductor chips by selectively removing the resin material with a second blade having a width smaller than the width of the first blade, so that the resin material remains on the side surface of the semiconductor chips in a filmlike manner.

16. A method for manufacturing a semiconductor device, comprising:

forming a semiconductor wafer that includes a plurality of semiconductor chips each having a front and a rear surface;

forming pillar like posts on each of the front surfaces;

forming a sealing resin layer having a front surface flush with forward end surfaces of the posts;

forming trenches dug down from the front surface of the sealing resin layer to a middle of the semiconductor wafer on dicing lines set along peripheral edges of the semiconductor chips to expose side surfaces of the posts and side surfaces of the semiconductor chips;

after forming the trenches, forming a covering film so as to cover the side surfaces of the semiconductor chips;

after forming the covering film, forming terminals that protrude from the front surface of the sealing resin so that the terminals extend over the forward end surfaces and the side surfaces of the posts so as to overlap the covering film in a plan view; and after forming the terminals, dividing the semiconductor wafer into each of the semiconductor chips along the dicing lines by removing a bottom portion of the trenches.

* * * * *